(12) United States Patent
Hsu et al.

(10) Patent No.: US 10,592,589 B1
(45) Date of Patent: Mar. 17, 2020

(54) MULTI-VIEW MASTERS FOR GRAPHICAL DESIGNS

(71) Applicant: Axure Software Solutions, Inc., San Diego, CA (US)

(72) Inventors: Victor Hsu, San Diego, CA (US); Martin Smith, San Diego, CA (US); Ian Gardner, San Diego, CA (US); Robert Gourley, San Diego, CA (US)

(73) Assignee: Axure Software Solutions, Inc., San Diego, CA (US)

( * ) Notice: Subject to any disclaimer, the term of this patent is extended or adjusted under 35 U.S.C. 154(b) by 0 days.

(21) Appl. No.: 16/106,547

(22) Filed: Aug. 21, 2018

(51) Int. Cl.
| | | |
|---|---|---|
| *G06F 3/0484* | (2013.01) | |
| *G06F 17/22* | (2006.01) | |
| *G06F 17/30* | (2006.01) | |
| *G06F 17/21* | (2006.01) | |
| *G06F 8/38* | (2018.01) | |
| *G06F 17/24* | (2006.01) | |
| *G06F 17/50* | (2006.01) | |

(52) U.S. Cl.
CPC .............. *G06F 17/212* (2013.01); *G06F 8/38* (2013.01); *G06F 17/24* (2013.01); *G06F 17/50* (2013.01)

(58) Field of Classification Search
CPC .. G06F 16/9577; G06F 16/958; G06F 3/0481; G06F 8/38
See application file for complete search history.

(56) References Cited

U.S. PATENT DOCUMENTS

| | | |
|---|---|---|
| 5,485,569 A | 1/1996 | Goldman et al. |
| 5,513,342 A | 4/1996 | Leong et al. |
| 5,564,002 A | 10/1996 | Brown |
| 5,649,216 A | 7/1997 | Sieber |
| 5,708,764 A | 1/1998 | Borrel et al. |

(Continued)

FOREIGN PATENT DOCUMENTS

| | | |
|---|---|---|
| CN | 102221993 A | 10/2011 |
| CN | 102622215 A | 8/2012 |

(Continued)

OTHER PUBLICATIONS

Office Action dated Sep. 29, 2018 for U.S. Patent application No. 201480034063.7.

(Continued)

*Primary Examiner* — Jordany Nunez
(74) *Attorney, Agent, or Firm* — MLO, a professional corp

(57) ABSTRACT

A method for generating and using multi-view masters involves selecting a master in a design environment. A widget is added to the master. A first view is selected for the master. A first widget characterization of the widget is received. The first widget characterization is associated with the first view of the master. A second view of the master is selected. A second widget characterization of the widget is received. The second widget characterization is associated with the second view of the master. An instance of the master is placed in a containing context. A first instance view selection is received, the first instance view selecting the first view of the master for the first instance of the master. The first instance of the master is displayed within the containing context, the widget being displayed in accordance with the first widget characterization associated with the first view of the master.

23 Claims, 27 Drawing Sheets

(56) References Cited

U.S. PATENT DOCUMENTS

| | | | |
|---|---|---|---|
| 5,900,870 A * | 5/1999 | Malone | G06F 9/451 |
| | | | 715/866 |
| 6,025,836 A | 2/2000 | McBride | |
| 6,038,567 A | 3/2000 | Young | |
| 6,300,947 B1 | 10/2001 | Kanevsky | |
| 6,829,646 B1 | 12/2004 | Philyaw et al. | |
| 6,832,353 B2 | 12/2004 | Itavaara et al. | |
| 7,174,286 B2 | 2/2007 | Martin et al. | |
| 7,219,309 B2 | 5/2007 | Kaasila et al. | |
| 7,222,306 B2 | 5/2007 | Kaasila et al. | |
| 7,290,006 B2 | 10/2007 | Xie et al. | |
| 7,345,688 B2 | 3/2008 | Baudisch et al. | |
| 7,349,837 B2 | 3/2008 | Martin et al. | |
| 7,362,311 B2 | 4/2008 | Filner et al. | |
| 7,398,473 B2 | 7/2008 | Stoner et al. | |
| 7,441,207 B2 | 10/2008 | Filner et al. | |
| 7,495,796 B2 | 2/2009 | Keane et al. | |
| 7,502,867 B2 | 3/2009 | Mitchell et al. | |
| 7,590,947 B1 | 9/2009 | Gay et al. | |
| 7,716,634 B2 | 5/2010 | Ross et al. | |
| 7,721,197 B2 | 5/2010 | Baudisch et al. | |
| 7,788,647 B2 | 8/2010 | Martin et al. | |
| 7,814,436 B2 | 10/2010 | Schrag et al. | |
| 7,861,158 B2 | 12/2010 | Martin et al. | |
| 7,895,522 B2 | 2/2011 | Wong et al. | |
| 7,900,137 B2 | 3/2011 | Ivarsoey et al. | |
| 7,916,157 B1 | 3/2011 | Kelley et al. | |
| 7,966,560 B2 | 6/2011 | Kanzaki | |
| 8,037,406 B1 | 10/2011 | Barnes et al. | |
| 8,132,123 B2 | 3/2012 | Schrag et al. | |
| 8,160,398 B1 | 4/2012 | Avidan et al. | |
| 8,201,101 B2 | 6/2012 | Wiley | |
| 8,266,521 B2 | 9/2012 | Sung et al. | |
| 8,356,247 B2 | 1/2013 | Krassner et al. | |
| 8,416,206 B2 | 4/2013 | Carpendale et al. | |
| 8,533,613 B2 | 9/2013 | Yu | |
| 8,621,422 B1 | 12/2013 | Hsu et al. | |
| 8,671,352 B1 | 3/2014 | Hsu et al. | |
| 8,751,945 B1 | 6/2014 | Hsu et al. | |
| 8,843,585 B1 | 9/2014 | Normann et al. | |
| 9,182,252 B2 | 11/2015 | Dubin et al. | |
| 9,389,759 B2 | 7/2016 | Hsu et al. | |
| 9,811,186 B2 | 11/2017 | Zotov et al. | |
| 9,946,806 B2 | 4/2018 | Hsu et al. | |
| 2003/0016246 A1 | 1/2003 | Singh | |
| 2003/0042190 A1 | 3/2003 | Robertson et al. | |
| 2003/0067489 A1 | 4/2003 | Candy Wong et al. | |
| 2004/0012627 A1 | 1/2004 | Zakharia et al. | |
| 2004/0183817 A1 | 9/2004 | Kaasila | |
| 2005/0041859 A1 | 2/2005 | Nguyen et al. | |
| 2005/0071758 A1 | 3/2005 | Ehrich et al. | |
| 2005/0091608 A1 | 4/2005 | Gusmorino et al. | |
| 2005/0097444 A1 | 5/2005 | Ivarsey et al. | |
| 2005/0246627 A1 * | 11/2005 | Sayed | G06F 17/248 |
| | | | 715/234 |
| 2006/0005207 A1 * | 1/2006 | Louch | G06F 8/38 |
| | | | 719/328 |
| 2006/0036955 A1 * | 2/2006 | Baudisch | G06F 3/0481 |
| | | | 715/747 |
| 2006/0218489 A1 | 9/2006 | Ovetchkine et al. | |
| 2006/0224978 A1 | 10/2006 | Albrecht et al. | |
| 2006/0242121 A1 * | 10/2006 | DeVorchik | G06F 16/168 |
| 2006/0277231 A1 | 12/2006 | Kral et al. | |
| 2006/0284878 A1 | 12/2006 | Zimmer | |
| 2007/0130525 A1 | 6/2007 | Murphy et al. | |
| 2007/0168931 A1 | 7/2007 | Martin et al. | |
| 2007/0171233 A1 | 7/2007 | Zimmer | |
| 2007/0220419 A1 | 9/2007 | Stibel et al. | |
| 2008/0052637 A1 | 2/2008 | Ben-Yoseph et al. | |
| 2008/0120538 A1 | 5/2008 | Kurz et al. | |
| 2008/0178117 A1 | 7/2008 | Gelman et al. | |
| 2008/0215998 A1 | 9/2008 | Moore et al. | |
| 2009/0089668 A1 | 4/2009 | Magnani et al. | |
| 2009/0109337 A1 | 4/2009 | Imai et al. | |
| 2009/0158180 A1 | 6/2009 | Magnani et al. | |
| 2009/0195652 A1 | 8/2009 | Gal | |
| 2009/0265644 A1 | 10/2009 | Tweed et al. | |
| 2009/0271742 A1 | 10/2009 | Zhang et al. | |
| 2010/0153544 A1 | 6/2010 | Krassner et al. | |
| 2010/0153836 A1 | 6/2010 | Krassner et al. | |
| 2010/0223593 A1 * | 9/2010 | Eldridge | G05B 15/02 |
| | | | 717/105 |
| 2011/0107227 A1 | 5/2011 | Rempell et al. | |
| 2011/0179377 A1 | 7/2011 | Fleming | |
| 2011/0252302 A1 | 10/2011 | Yalovsky | |
| 2012/0072847 A1 | 3/2012 | Lee et al. | |
| 2012/0110480 A1 | 5/2012 | Kravets | |
| 2012/0131441 A1 | 5/2012 | Jitkoff et al. | |
| 2012/0174002 A1 | 7/2012 | Martin et al. | |
| 2012/0324428 A1 | 12/2012 | Ryan et al. | |
| 2013/0111327 A1 | 5/2013 | Tsutsui et al. | |
| 2013/0167080 A1 | 6/2013 | Ari et al. | |
| 2013/0198608 A1 | 8/2013 | Krassner et al. | |
| 2013/0205246 A1 | 8/2013 | Schmidt | |
| 2013/0219024 A1 | 8/2013 | Flack | |
| 2014/0258841 A1 | 9/2014 | Strong | |
| 2014/0297516 A1 | 10/2014 | Brown et al. | |
| 2014/0337706 A1 | 11/2014 | Hsu et al. | |
| 2015/0339277 A1 | 11/2015 | Pou | |
| 2017/0293596 A1 | 10/2017 | Hsu et al. | |

FOREIGN PATENT DOCUMENTS

| | | |
|---|---|---|
| CN | 102880664 A | 1/2013 |
| EP | 1221650 A2 | 7/2002 |
| EP | 1647906 B1 | 8/2010 |
| KR | 20080087570 A | 10/2008 |
| KR | 20130040057 A | 4/2013 |
| WO | 0146802 A2 | 6/2001 |
| WO | 03032151 A2 | 4/2003 |
| WO | 2003065191 A2 | 8/2003 |
| WO | 2009059062 A2 | 5/2009 |

OTHER PUBLICATIONS

Adobe Indesign CS6 Manual, Adobe, Inc., Accessed on Apr. 3, 2013, helpx.adobe.com/indesign/topics.html.

Akiba, "AniViz: A Template-Based Animation Tool for Volume Visualization," IEEE Computer Graphics and Applications, vol. 30, Sep.-Oct. 2010, pp. 61-71.

Arnold, "An Interactive Maze Router with Hints," 25th ACME/IEEE Design Automation Conference, Jun. 1988, pp. 672-676.

Backes, Umi: An Interacive Supervisory and Shared Control System for Telerobotics, 1990 IEEE International Conference, May 1990, pp. 1096-1101.

Bouillon, "Flexible Re-engineering of Web Sites," Proceedings of the 9th international conference on Intelligent user interfaces, Jan. 2004, pp. 132-139.

Bryant et al., "Pro HTML5 Performance", Oct. 2012, Apress, p. 1-280.

Chipman, "SlideBar: Analysis of a linear input device," Behaviour & Information Technology archive, vol. 23 Issue 1, Jan.-Feb. 2004, pp. 1-9.

Components, Figma Help Center, Accessed on Aug. 21, 2018 via the Internet: https://help.figma.com/drawing/components.

Coversy, "Improving modularity of interactive software with MDPC architecture," Engineering Interactive Systems, 2008, pp. 321-338.

CSS Generator, Design, Adobe Edge Reflow CC (Preview), Adobe, Accessed on May 8, 2013, http://html.adobe.com/edge/reflow/.

Dayringer, "Interactive program for visualization and modelling of proteins, nucleic acids and small molecules," Journal of Molecular Graphics, Jun. 1986, pp. 82-87.

Editing Symbols, Sketch, Accessed on Aug. 21, 2018 via the Internet: https://sketchapp.com/docs/symbols/editing-symbols/.

Fails, "Light Widgets: Interacting in Every-day Spaces," IUI '02 Proceedings of the 7th international conference on intelligent user interfaces, Jan. 2002, pp. 63-69.

FAQ, Adobe Edge Reflow CC (Preview), Adobe, Accessed on May 8, 2013, http://html.adobe.com/edge/reflow/faq.html.

(56) References Cited

OTHER PUBLICATIONS

Features—Adobe Edge Reflow CC (Preview), Adobe, Accessed on Aug. 15, 2013, http://html.adobe.com/edge/reflow/features.html.
Features, Adobe Edge Reflow CC (Preview), Adobe, Accessed on May 8, 2013, http://html.adobe.com/edge/reflow/features.html.
Features, UX Design Tools Built by UX Designers, UXPin, Accessed May 8, 2013, http://www.uxpin.com/application-features.html.
Fetterley et al, A large-scale study of the evolution of web pages, Softw. Pract. Exper. 2003; 1:1, Jul. 2003, on World Wide Web, dl.acm.org.
Feuerstack, "Model-based Layout Generation," AVI '08 Proceedings of the working conference on Advanced visual interfaces, May 28-30, 2008, pp. 217-224.
Ford, Peter, "iBloc Responsive Layout", iRise Break Points, edited by Pete Indelicato on Apr. 22, 2013, Accessed on Jan. 13, 2014, http://idn.irise.com/pages/viewpage.action?pageId=18219024.
Ford, Peter, "iBloc Responsive Layout", iRise Break Points, edited by Pete Indelicato on Apr. 23, 2013, Accessed on Jan. 13, 2014, http://idn.irise.com/pages/viewpage.action?pageId=18219026.
Ford, Peter, "iBloc Responsive Layout", iRise Break Points, edited by Pete Indelicato on Apr. 30, 2013, Accessed on Feb. 7, 2014, http://idn.irise.com/pages/viewpage.action?pageId=18219027.
Ford, Peter, "iBloc Responsive Layout", iRise Break Points, edited by Pete Indelicato on Mar. 7, 2013, Accessed on Jan. 13, 2014, http://idn.irise.com/pages/viewpage.action?pageId=17564675.
Harb et al., "Responsive Web Design", Dec. 6, 2011, p. 1-30.
Hofmann, "Profilegraph: an interactive graphical tool for protein sequence analysis," Comput Appl Biosci, vol. 8, No. 4, Aug. 1992, pp. 331-337.
Holzmann, "Building Interactive Prototypes of Mobile User Interrfaces with a Digital Pen," APCHI '12 Proceedings of the 10th asia pacific conference on Computer human interaction, Aug. 2012, pp. 159-168.
Home page, DivShot, Accessed May 8, 2013, http://www.divshot.com/.
International Search Report and Written Opinion dated Aug. 27, 2014 for PCT Patent Application No. PCT/US2014/035611.
International Search Report and Written Opinion dated Sep. 23, 2014 for PCT Patent Application No. PCT/US2014/035740.
Jones, "What you Sculpt is What you Get: Modeling Physical Interactive Devices with Clay and 3D Printed Widgets," Proceedings of the 2016 CHI Conference on Human Factors in Computing Systems, May 2016, pp. 876-886.
Knight, "Responsive Web Design: What It Is and How to Use It", Smashing Magazine, Jan. 12, 2011, p. 1-23, http://coding.smashingmagazine.com/2011/01/12/guidelines-for-responsive-web-design/.
Lam, "ART: Augmented Reality Table for Interactive Trading Card Game," VRCIA Conference Proceedings, Jun. 2006, pp. 357-360.
Marcotte, "Responsive Wed Design", A List Apart, May 25, 2010, p. 1-16, http://alistapart.com/article/responsive-web-design.
McCormack and Asente, An Overview of the X Toolkit, User Interface Software, ACM, Jan. 3, 1988, pp. 46-55.
Myers, "Creating Graphical Interactive Application Objects by Demonstration," UIST '89 Proceedings of the 2nd annual ACM SIGGRAPH symposium on User interface software and technology, Nov. 1989, pp. 95-104.
Mzoughi, "WebTOP: A 3D interactive system for teaching and learning optics," J. Computers and Education, vol. 49, No. 1, Aug. 2007, pp. 110-129.
Non-Final Office Action dated Dec. 23, 2014 for U.S. Appl. No. 13/889,329.
Notice of Allowance and Fees dated Apr. 25, 2014 for U.S. Appl. No. 14/175,921.
Notice of Allowance and Fees dated Jan. 10, 2014 for U.S. Appl. No. 14/025,745.
Notice of Allowance and Fees Due dated Nov. 22, 2013 for U.S. Appl. No. 13/968,401.
Notice of Allowance dated Mar. 16, 2016 for U.S. Appl. No. 13/889,329.
Notice of Allowance dated Dec. 20, 2017 for U.S. Appl. No. 13/889,331.
Notice of Allowance dated Mar. 15, 2017 for U.S. Appl. No. 14/176,348.
Office Action dated Apr. 1, 2015 for U.S. Appl. No. 13/889,331.
Office Action dated Feb. 10, 2016 for U.S. Appl. No. 14/176,348.
Office Action dated Jul. 18, 2016 for U.S. Appl. No. 14/176,348.
Office Action dated Mar. 24, 2014 for U.S. Appl. No. 14/175,921.
Office Action dated Mar. 8, 2018 for Republic of China Patent Application No. 201480034063.7.
Office Action dated May 28, 2015 for U.S. Appl. No. 13/889,329.
Office Action dated Mar. 15, 2019 for U.S. Appl. No. 15/634,787.
Office Action dated Jan. 4, 2019 for Australian Patent App. No. 2014263021.
Overview—Adobe Edge Reflow CC (Preview), Adobe, Accessed on Aug. 15, 2013 from http://html.adobe.com/edge/reflow/.
Partial Supplementary European Search Report dated Jan. 3, 2017 for European Patent Application No. 14794970.5.
Pettit, "Beginner's Guide to Responsive Web Design", Treehouse blog, Aug. 8, 2012, Accessed on Oct. 31, 2013, p. 1-35, http:/blog.teamtreehouse.com/beginners-guide-to-responsive-web-design.
Puerta et al., "The UI Pilot: A Model-Based Tool to Guide Early Interface Design", Jan. 2005, ACM, p. 215-222.
Responsive Web Design Prototyping Tool, UXPin newest solution, UXPin, Accessed May 8, 2013, http://blog.uxpin.com/1575/responsive-web-design-prototyping-tool-uxpin-newest-solution/.
Ropinski, "Interactive Volume Visualization Techniques for Subsurface Data", Lecture Notes in Computer Science, vol. 3736. Springer, Berlin, Heidelberg, pp. 121-131.
Surber, The next-step in next-gen web design, Adobe Edge Reflow Team Blog, Jun. 28, 2013. Accessed on Aug. 15, 2013, http://blogs.adobe.com/edgereflow/2013/06/18/the-next-step-in-next-gen-web-design/.
Surger, Single page comps?, Adobe Edge Reflow Team Blog, Aug. 7, 2013, Accessed on Aug. 15, 2013, http://blogs.adobe.com/edgereflow/2013/08/07/single-page-comps/.
Svensson, "Investigation and development of user design utilities for widget based web services", Chalmers University of Technology, Goteborg, Sweden, May 2009, pp. 1-48.
Symbols, Sketch, Accessed on Aug. 21, 2018 via the internet: https://sketchapp.com/docs/symbols/.
Tech Specs, Adobe Edge Reflow CC (Preview), Adobe, Accessed on May 8, 2013, http://html.adobe.com/edge/reflow/tech-specs.html.
Weiss, "Madgets: Actuating Widgets on Interactive Tabletops", UIST '10 Proceedings of the 23nd annual ACM symposium on User interface software and technology, Oct. 2010, pp. 293-302.
Youtube Video: The Latest Edge Reflow CC Preview Overview http://www.youtube.com/watch?v=RDAAM0uit30&feature=youtu.be viewed on Aug. 15, 2013.
Office Action dated Sep. 10, 2015 for U.S. Appl. No. 13/889,331.
International Search Report dated Nov. 8, 2019 for PCT Patent Application No. PCT/US19/43848.
Advisory Action dated Oct. 10, 2019 for U.S. Appl. No. 15/634,787.

\* cited by examiner

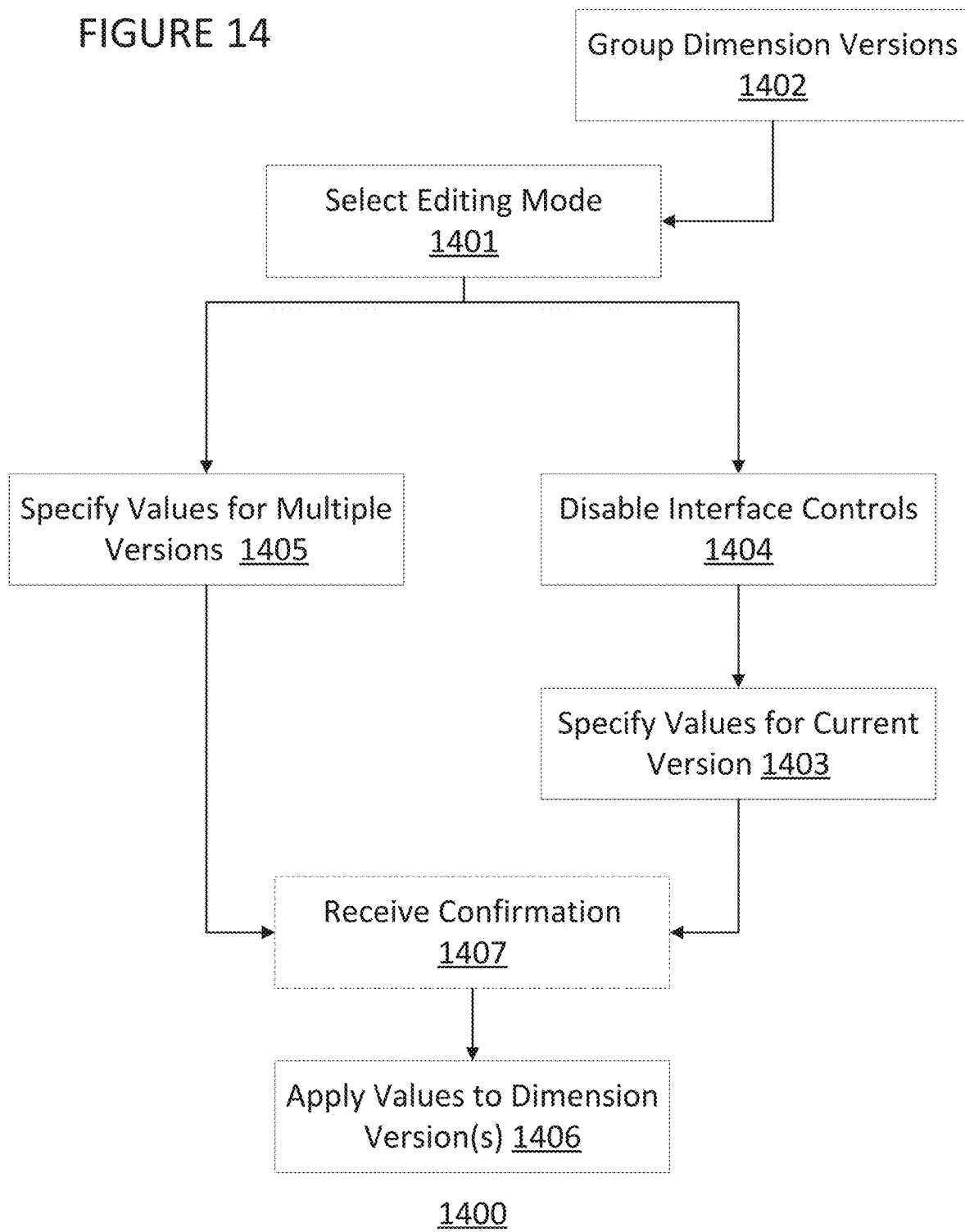

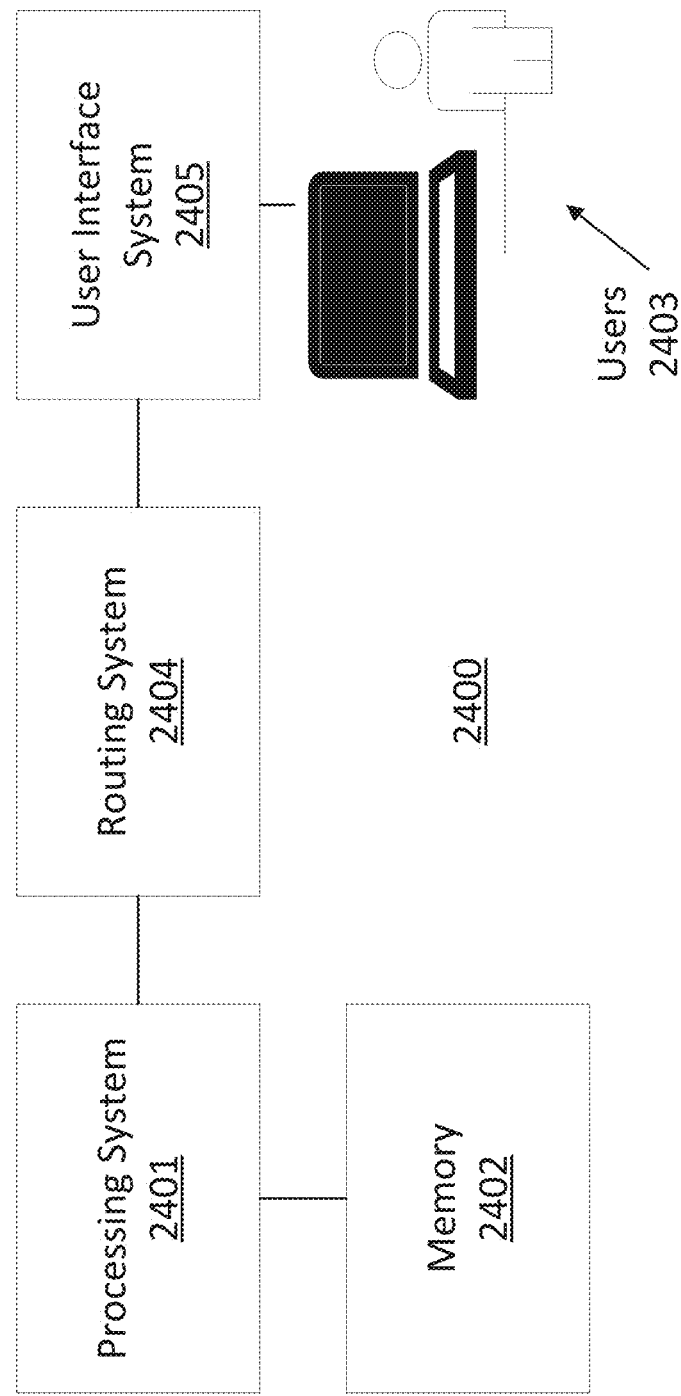

MULTI-VIEW MASTERS FOR GRAPHICAL DESIGNS

RELATED APPLICATIONS

This application relates to U.S. Pat. No. 8,671,352, filed Sep. 12, 2013, U.S. Pat. No. 9,389,759, filed May 7, 2013, U.S. Pat. No. 9,946,806, filed May 7, 2013, and U.S. patent application Ser. No. 15/634,787, filed Jun. 27, 2017, all of which are incorporated by reference herein in their entirety.

BACKGROUND OF THE INVENTION

Responsive graphical design tools have risen in importance alongside the proliferation of different screen sizes used by the general public to render and consume graphical media. A responsive design is a design that is responsive to changes in dimension of the design. The response could include a change in a layout of the design, a change in style properties of the design, a change in interactions or behavior of the design, such as event handlers, and/or a change that adjusts a layout, a size, an anchoring rule, a relative position, an absolute position, or any other relevant parameter such that an instance of the design renders well on a variety of devices, orientations, and screen sizes. Responsive design tools and techniques are of particular importance for the design of web pages and web sites. As nearly every electronic device is now capable of accessing the Internet, and people are becoming less tolerant of small screen sizes serving as a hindrance to their web browsing experience, a web design process flow must take varying screen size into account from start to finish. Furthermore, media consumers expect to be able to manipulate the size of individual windows on a screen to allocate a desired amount of screen real estate to different windows based on their relative importance. As a result, the responsiveness of a graphical design must be taken into account even if the design is intended for consumption on a single device. Finally, certain devices are capable of rendering a design in different orientations such as portrait and landscape orientations. It is therefore desirable to have different versions of a design specified for each of these orientations.

Responsive web design generally involves two main steps. First a set of dimension specifications are provided by a designer. These dimensions specifications will serve either to define a target dimension at which a particular version of the design will be rendered, or as trigger points at which the design will switch from one version to another. For example, a designer may specify a version of a design for a smart phone screen with a 3.5 inch diagonal and another version of a design for a tablet screen with a 10 inch diagonal; or a designer may specify a design to switch from one version to another when a rendering space in a browser window is decreased in size below a width of 10 inches. FIG. 1 illustrates a responsive design as specified for a smart phone screen in portrait orientation 100 and in landscape orientation 101. The portrait orientation 100 and landscape orientation 101 each display different dimension versions of a single responsive design. Note that the hero image 102, title text 103, and link list 104 in portrait orientation 100 are laid out in an entirely different configuration as hero image 105, title text 106, and link list 107 in landscape orientation 101.

Regardless of how the different dimensions are selected or delineated, the increase in required design effort for the responsive design rises in proportion to the number of different sizes for which a design must be specified. For example, the work required to specify the responsive design shown in portrait orientation 100 and landscape orientation 101 may be nearly double the work required to specify a single nonresponsive design. Graphic designers and developers have found themselves faced with the difficult task of producing various versions of the same designs that are optimized for different rendering spaces. Responsive graphical design tools seek to ease the burden of specifying all of these different versions.

Related approaches to responsive graphical design have included automated procedures for modifying a design such as reducing white space between design elements, reducing font sizes, and reducing image sizes automatically as the rendering space afforded for the design is reduced. Other approaches have focused on alleviating the manual specification processes by copying the design automatically from one dimension version into an area used to specify a different dimension version of the design. For example, the design elements in portrait orientation 100 in FIG. 1 would be copied automatically by the tool into a landscape orientation design window automatically as soon as the designer requested the ability to define a landscape version of the design. The result would be something like what is shown in landscape orientation 108. The graphical designer would then be able to rearrange and resize the copied elements in the new design window to create the version shown in landscape orientation 101.

SUMMARY OF INVENTION

In some embodiments, a method for generating and using multi-view masters involves receiving, in a design environment, a first master selection, the first master selection selecting a first master. A first instance of a widget is added to the first master in the design environment. A first view selection for the first master is received in the design environment, the first view selection selecting a first view from multiple views of the first master. A first widget characterization of the first instance of the widget is received in the design environment, the first widget characterization being associated with the first view of the first master. A second view selection for the first master is received in the design environment, the second view selection selecting a second view from the multiple views. A second widget characterization of the first instance of the widget is received in the design environment, the second widget characterization being associated with the second view of the first master. A first instance of the first master in a containing context is placed in the design environment, the first instance of the first master comprising a second instance of the widget, the second instance of the widget being an instance of the first instance of the widget. A first instance view selection is received in the design environment, the first instance view selection selecting the first view of the first master for the first instance of the first master. The first instance of the first master within the containing context is displayed in the design environment, the second instance of the widget being displayed in accordance with the first widget characterization associated with the first view of the first master.

In some embodiments, a method for generating and using multi-view masters involves providing, in a design environment, a first user interface for selecting a view for a first master, the first user interface displaying a first set of selectable views. A first view selection is accepted, using the first user interface for the first master. The first view selection selects a first view from the first set of selectable views. An instance of the first master is added, in the design environment, to a second master. A second user interface is provided, in the design environment, for i) selecting a view for the second master, and ii) for selecting an instance view for the instance of the first master, the second user interface displaying a second set of selectable views for the second master and displaying the first set of selectable views for the instance of the first master.

BRIEF DESCRIPTION OF THE DRAWINGS

FIG. 14 illustrates a flow chart of a method for specifying a design using different editing modes, in accordance with some embodiments.

FIG. 24 illustrates a block diagram of a computer system, in accordance with some embodiments.

DETAILED DESCRIPTION OF THE EMBODIMENTS

Reference now will be made in detail to example embodiments which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers all such modifications and variations within the scope of the appended claims and their equivalents.

Figure 1:
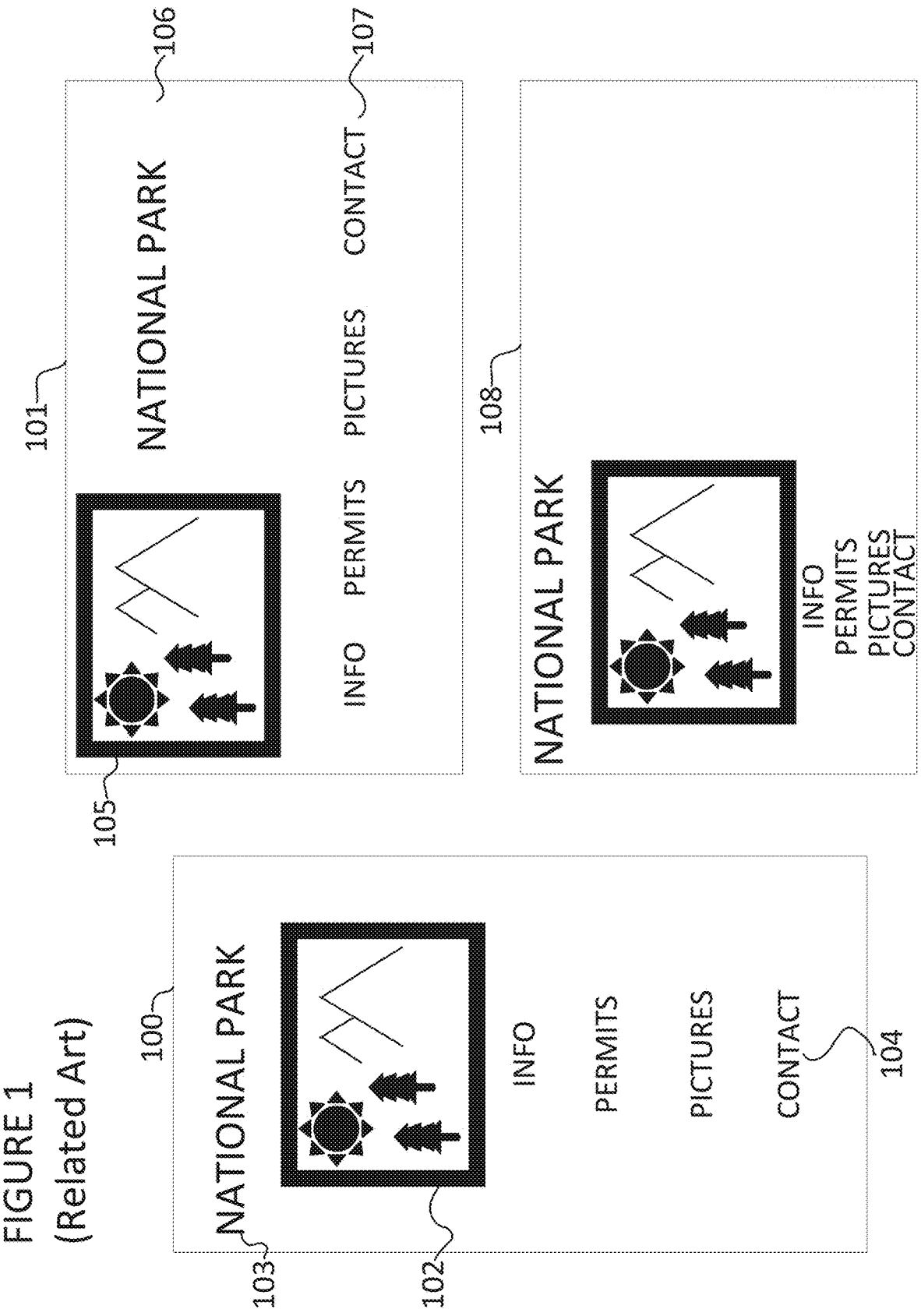
FIG. 1 illustrates different versions of a responsive graphical design as found in the related art.

Embodiments disclosed herein generally relate to responsive graphical design, and more specifically to the design of responsive web page prototypes. As described above, responsive graphical design creates additional work for the graphic designers in proportion to the responsiveness of the design. In the solutions described above with reference to FIG. 1, the landscape design was copied into the area used to specify the portrait design. This approach might save time in the initial set up process for each design size. However, after the copying step is completed, all the benefits to efficiency attributable to those solutions will have been expended. If, at a later time, a project manager decides that a design element needs to be modified, the modification will need to be manually conducted on each of the separate designs. For example, if a manager decides that the title text on each page should be green instead of black, a graphic designer will have to load the landscape design 101, modify title text 106, load portrait design 100, and modify title text 103.

Example embodiments described herein alleviate the problem described above by making each design element a single editable entity across the entire design. As such, a designer would only need to change title text 106 from green to black, and title text 103 would also change because they are the same object viewed at different sizes. This benefit is compounded by the use of responsive masters that propagate changes to multiple pages of a design with a single edit. In keeping with the example of FIG. 1, it is likely that hero image 105 and title text 106 remain on every page of the web site. Example embodiments described herein allow for the usage of a master that would include these design elements on each page of the website and would allow any modification of the master to propagate to every instance of the master on all the other pages of the design.

The benefits described in the preceding paragraph are provided, at least in part, through the use of responsive widgets, masters containing responsive widgets, and masters that are themselves responsive. A responsive widget is a widget having a widget characteristic such as a size, an absolute position, a relative position, a margin, a layout, or other relevant characteristic such that the widget renders well on a variety of devices, orientations, and screen sizes. Similarly, a responsive master or container is a master or container having a respective characteristic such as a size, an absolute position, a relative position, a margin, a layout, or other relevant characteristic such that the master or container renders well on a variety of devices, orientations, and screen sizes. A container widget is a widget to which other widgets can be added. Responsive widgets can be added into a design and are specified such that their characteristics can have various states for various dimension versions. A dimension version is a presentation or rendering of a design that is associated with a particular dimension (e.g., X-Y or height-width dimensions on a display screen), a best fit, or a closest match, of the context in which the design is being rendered. For example, a first design of a webpage that is associated with a portrait orientation (e.g., Y dimension >X dimension) of the webpage is considered to be a first dimension version. A second design of the webpage that is associated with a landscape orientation (e.g., Y dimension <X dimension) of the webpage is considered to be a second dimension version. Since the same widget is rendered in each of the dimension versions, an edit made to the widget at one design size can be propagated automatically to all of the other dimensions. Some embodiments disclosed herein also allow a user to limit a particular modification from affecting the widget at other dimension versions by providing methods of switching between all-dimension, one-dimension, and multi-dimension editing modes. Some embodiments disclosed herein also allow a user to set an inheritance structure for a design that determines what dimension versions of a design will be affected by a change made to a particular dimension version. Associated embodiments also allow a user to set an inheritance characteristic for a design that can determine which properties of widgets will change across dimension versions when a change is made to a particular dimension version. The properties can include an existence property which sets whether or not a widget is placed or unplaced in a given dimension version. The existence property should not be confused with properties that allow a widget to be hidden or visible depending upon the rendered state of a dimension version in a player. If a widget is unplaced, it cannot be made visible in the dimension version at all. If a widget is hidden, it is located in the dimension version but it is not visible until an event occurs to make the widget visible. In addition, masters can be included in the design to propagate changes through different pages of a design. The masters may also include responsive container widgets that are configured to store different widgets on different pages of the same design. Masters serve to limit design efforts associated with responsive web design because a modification made to one object in a graphic design can be automatically propagated to a multitude of instances of the object. Responsive masters can be added into a design and are specified such that their characteristics can have various states for various dimension versions. Some embodiments disclosed herein also allow a user to specify multiple views for each master, and to select from among the multiple specified views for an instance of the master on a per-master instance basis.

In related approaches, a design is made responsive through the use of media queries. Media queries are embedded in the code of a web page and are known to standard web browsers. A browser will recognize the media queries when rendering a page, and load a specific style sheet for the design when the media query is affirmatively evaluated by the browser. The media query can specify a particular width for a rendering space, a particular height for a rendering space, a color rendering capability of a device, etc. If the rendering space provided by a browser rendering the design meets any of the specified characteristics, a particular style sheet can be loaded in response to alter the design. For example, a media query could be set to lower the font size associated with a particular widget if the width of the screen being used to render the design decreased below a certain predefined width. Media queries offer a way to provide responsiveness to a design that is already built in to hypertext markup language (HTML) and cascading style sheets (CSS). However, media queries are somewhat limiting because they can only be used to adjust a style sheet. As a result, they do not provide for more involved responsive web design such as the ability to alter the interactivity of a design element.

Example embodiments described herein provide web site designs with responsive characteristics through the use of object model event handlers that allow users to produce web site prototypes with a more involved degree of responsiveness. The object model event can treat the web page as its object and can listen to the resizing of the page. If the page is resized, the object model event can trigger an event handler in the form of a script that modifies any desired characteristic of a design element. For example, the script could be a javascript used to change the URL of a web page that a widget links to. In other words, a widget could link to one page when it is rendered in a first dimension version and link to a different page when it is rendered in a second dimension version.

In related approaches, elements in a design are made responsive by stacking elements in the rows and columns of a grid, specifying margins for the grid, and then making the margins and row/column locations responsive. For example, the specification for the title text 106 in landscape design 101 in FIG. 1 would be defined as: column 2, row 1, margin 33%; whereas the specification for the title text 103 in portrait design 100 would be: column 1, row 1, margin 50%. For more complex examples, the effort associated with keeping track of the relative positioning inputs becomes prohibitively difficult—particularly for graphic designers that are less technically inclined.

Example embodiments described herein provide web site designs with responsive widgets that respond based on a predefined absolute position of where the widget should be located on a web page. The resulting scheme for specifying widget locations is much more intuitive than one based on relative positioning and makes the design of interactive responsive web design much easier on the designers and developers involved. The absolute positions can be specified in terms of x- and y-coordinates using various possible units including metric distance units such as centimeters, US distance units such as inches, and design-specific units such as pixels.

Design Environment: Responsive Interactive Widgets

Example embodiments described herein provide tools and methods for specifying a responsive graphical design. In some embodiments, the responsive graphical design can be a responsive web page prototype. The graphical design tool can allow a user to specify design elements such as widgets for inclusion in the graphical design. The widgets can be interactive. The graphical design tool can also allow a user to specify dimension specifications for the design.

Dimension specifications refer to rendering space dimensions and are used by the responsive design to determine which dimension version should be rendered given a particular available rendering space. A dimension specification can serve as a trigger point that defines a dimension at which the design switches from being rendered according to one dimension version to being rendered according to another dimension version. For example, a dimension specification could specify a browser window width of 5 inches, and could be used by the responsive design to render a first dimension version when the browser window width was less than 5 inches and a second dimension version when the browser width was greater than 5 inches. A dimension specification can also serve as a target dimension that defines a specific set dimension at which different dimension versions of the design should be rendered. Using multi-view masters, as described herein, a master can be associated with a dimension version on a per-master basis, and the dimension version to be used when rendering an instance of a master within a design or container widget can be selected by the user, or according to a characteristic of the container widget, irrespective of the dimension specification of the design and/or that of the container widget.

Once a user has specified at least one dimension specification and at least one widget, the graphical design tool can allow a user to specify different states for the widget for different dimension versions of the design. In other words, the widget may have a first state in one dimension version of the design and a second state in another version of the design. The transformation of the widgets and design elements from one state to another is what provides the design with its responsiveness. Examples of these tools and methods are described below with reference to FIGS. 2-5.

Figure 2:
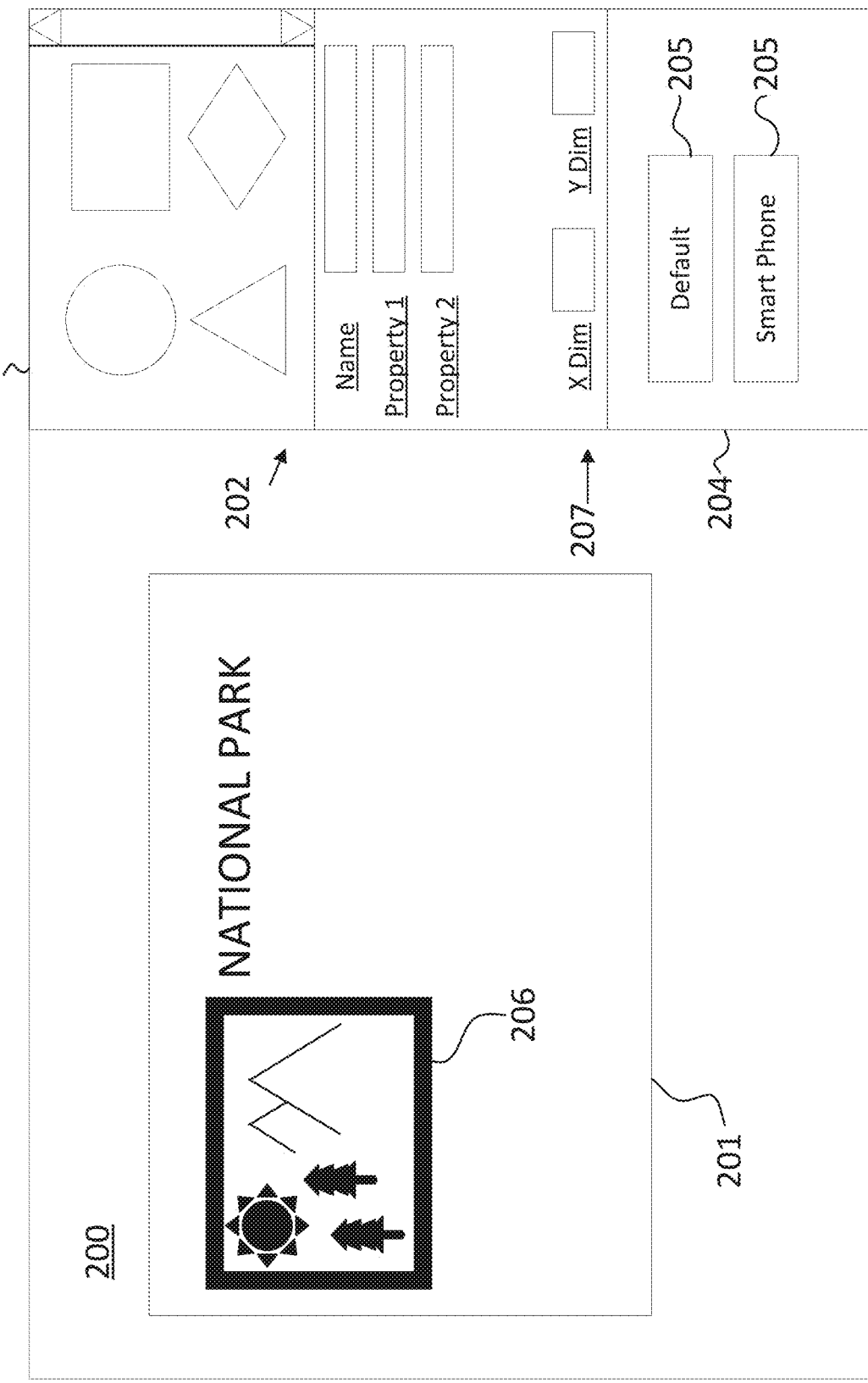
FIG. 2 illustrates a graphical user interface for a graphic design tool, in accordance with some embodiments.

A tool for designing a responsive graphical design can be described with reference to FIG. 2. FIG. 2 illustrates a graphical design environment 200, i.e., a "tool", or "graphical design tool", that allows a user to specify a responsive graphical design. Graphical design environment 200 includes a window 201 for displaying a rendering of the responsive graphical design. In some embodiments, window 201 will be configured to display the various specified dimension versions of the design. For example, the window could be used to display a Smart Phone dimension version of the design and then be used to display a Tablet dimension version of the design. However, the design environment could also include a gallery of windows that simultaneously displayed a version of each dimension version of the design. The design environment could provide an interface to receive an input from a user to add and remove different dimension versions from the gallery at will. The tool could also add a dimension version to the gallery automatically each time an additional dimension specification was added to the design.

Graphical design environment 200 also includes a widget interface 202. The widget interface allows a user to add a widget to the window 201. A widget can be any design element associated with the design including a button, a pull-down menu, a hyperlink, a text box, or a page. In some embodiments, the widget can be added by dragging and dropping a widget from widget menu 203 into window 201. The widget interface also allows a user to specify states for a widget by providing values for specific properties. A widget state is defined by a set of values for each of that widget's properties. In some embodiments, the values can be entered via text inputs to widget interface 202. However, widgets could also be added using a drop down menu or through the use of keyboard commands. The values for specific states could be provided in a separate interface as in FIG. 2 or they could be specified directly in a window such as window 201 by a user clicking on a specific element to bring up an interface in window 201 itself. Such a selection could utilize a special selection action such as a right-click with a mouse or the depression of a special key during selection of a widget to distinguish the selection from a standard selection in which the widget is positioned in window 201.

Graphical design environment 200 also includes a dimension specification interface 204 that allows a user to specify a dimension or set of dimensions to be used to delineate various dimension versions. In some embodiments, the dimension specification interface will include buttons 205 to select different dimension versions. As shown in FIG. 2, a user is able to choose between a Smart Phone dimensions version and a Default dimension version by selecting different buttons 205. In some embodiments, when these buttons are selected, window 201 will display the selected dimension version. When the design appears in window 201 it will be rendered according to that dimension version. In specific embodiments, the dimension version that is displayed in window 201 will generally be the dimension version to which edits to the design are applied as they are received from the user. As shown in FIG. 2, dimension specification interface 204 includes two dimension versions: Default and Smart Phone. These dimension versions and others may be available in the design environment before a user begins specifying a design. However, dimension specification interface 204 may also allow users to specify and add additional dimension specifications and create additional dimension versions. Furthermore, a user may begin specifying a design before any dimension specifications are received such that a design may be completely specified in a non-responsive state before dimension specifications are added to a dimension specification interface and the responsive design processes ensues.

Additional dimension specifications and dimension versions can be added in various ways. The user could enter the dimension values textually into a dimension specification interface and then click an entry button to store the dimension specification. The entry of a dimension specification could automatically create a corresponding dimension version. The dimension specification interface could also allow users to label each dimension version. The dimension specification interface could also provide users with a predefined set of dimension versions such as a Smart Phone target size, a Tablet target size, and a Desktop target size. The dimension specification could also allow users to specify a dimension specification based on a current size of a window such as window 201. In embodiments in which window 201 is an adjustable window, the user could adjust the size of window 201 to a given size and then enter a command in a dimension specification interface to store a new dimension specification based on the current size of the adjustable window. Using FIG. 2 as an example, a ruler could be displayed along the edge or edges of window 201 to display the current size of the window as it is being adjusted to facilitate this process. The rulers could alternatively be placed on the edge or edges of the graphical design environment 200 to serve the same purpose. The saved dimension specification could be a scaled version of the actual size of the adjustable window. The scaling factor could be configurable by the user.

Widget interface 202 may allow a user to specify states for each widget in a design and associate each of those states with a particular dimension version. A state can be associated with a different dimension version in various ways. For example, the design environment could provide an interface to receive an input from a user to specify that hero image 206 will appear at a specific set of x- and y-coordinates on the web page in a first state, and a second set of x- and y-coordinates on the web page in a second state. This particular specification could be accomplished using an absolute position specification interface 207. The absolute position specification interface could have an x-input and y-input used to specify the location of the widget in the design for a given dimension version. However, the inputs do not need to be in separate entries as shown in the FIG. 2 as both could be input at a single prompt separated by a comma or another indicator. Furthermore, the absolute position interface could have numbers that are automatically filled out as a widget is visually positioned in a design window. The specified absolute position of the widget can be associated with a particular dimension version by providing duplicate fields for individual widget properties in widget interface 202 and labeling the duplicate fields with the dimension version they are associated with. The specified absolute position of the widget could also be associated with a particular dimension version by switching window 201 and widget interface 202 so that they instantaneously only reflect the dimension version that is currently being viewed and edited. Any edits made to a widget would then be applied to that particular dimension version until another version was selected. Finally, a state could be associated with a particular widget through the use of the gallery display approach in which edits made to the sub-window displaying a particular dimension version would be associated with only that dimension version. In these situations, the graphical design environment could include multiple widget interfaces 202 associated with the various sub-windows for particular dimension versions.

Although the example of an absolute position property was used in the previous paragraph, the various methods of associating a property with a specific dimension version described above apply to other properties. Widgets added to a design using widget interface 202 can have various responsive user definable properties. These properties can all be configured to be responsive by defining different values for the properties in different dimension versions. For example, a text property of a widget could be set such that the widget's text content was "Click Here to Login with Password" in a tablet dimension version, and "Login" in a Smart Phone dimension version. As described in the previous paragraph, the widget interface 202 could allow a user to specify an absolute position for the widget at a given dimension version. Furthermore, the widget interface 202 could also allow a user to specify different colors, font styles, image resolutions, line weights, rich text formatting, relative positioning, and any property that can be defined in a CSS style sheet for a widget. The widget interface 202 could also allow a user to specify a different text content for a widget at different dimension versions. For example, a text box containing a large amount of informative text in a large dimension version could be condensed to a summary format in a smaller dimension version. Finally, the widgets could have an existence property used to keep track of whether or not the widget appeared at all in a given dimension version. The value for the existence property could be a binary value indicative of a "placed" state or an "unplaced" state. As stated above, the existence property is distinguishable from a hidden property or a visible property even though such properties can also have binary values that affect whether or not a widget appears in a given dimension version.

The user definable properties specified using widget interface 202 can also be event handlers and associated interactive properties. Interactive properties include the ability to provide additional information in response to a user input and generally responding to stimulus from a person utilizing the design. These properties could be made responsive. For example, a widget could link to one page in one dimension version, and link to a different page in another dimension version. As another example, the widget could either contain a link or be completely non-interactive at different dimension versions. Event handlers could be added to the widgets to facilitate their interactive properties, and the event handlers could be made responsive to facilitate the responsiveness of those interactive properties. For example, the widget could be a button with a "show panel A" event handler and a "show panel B" event handler for its OnClick event, and panel A could be displayed when the button is clicked while the player was a certain size and panel B could be displayed when the button is clicked while the player was at a different size. Further, the event portion of the event handlers could be made responsive such that the widget would execute a certain action upon an OnClick event in one dimension version, and execute the same action upon an OnMouseEnter event in another dimension version. In either case, the event handlers could also be conditional on the dimension version being rendered regardless of the size of the player.

All of the widget properties described above can be specified in various ways. For example, the widget specification interface 202 can change its appearance such that it can be used to specify any property that is modifiable on a particular widget. For example, if the widget were a text box, the widget specification interface could change to include an input field for typing in the text to appear in the text box. Many of the properties for the widgets could also be specified in window 201 directly. Keeping with the example of a text box, the design environment could provide an interface to receive an input from a user to select a text box that was already in the window 201 and be provided with a cursor in the text box to begin specifying the text directly in the text box itself. The design environment could provide an interface to receive an input from a user, the input possibly being a right click on a widget in window 201 or use some other unique selection mechanism to bring up a list of properties for the widget that can be specified directly on the widget. With specific reference to the existence property, the value could generally also be defined using widget interface 202. However, in embodiments where widget interface 202 only displayed the properties of the widget for a single dimension version, and/or only reflected the state of a currently selected widget, the value for the existence property of a widget would preferably be specified using an alternative interface. In these embodiments, an unplaced widget would not be accessible for selection so it would not be possible to access the existence property via widget interface 202, and a separate interface would be required.

The dimension specifications can take on various forms. Dimension specifications could be equivalent to a width of an area afforded to render a design, a height of an area afforded to render a design, both a height and a width, a diagonal dimension, and any other dimension or set of dimensions that could be associated with a space afforded to render a design—including a scalar value for the area of the space itself. The wide assortment of dimension specifications is important because of the large number of players that designers must consider when specifying a design. For example, if the only value allowed was a scalar value for the area of the rendering space, a user would not be able to create a design that was responsive to a screen with variant orientations (e.g., a smart phone that can display a design in portrait or landscape mode that has the same total area in either situation).

The relationship between dimension specifications and dimension versions can take on various forms. As described above, a dimension version can be added to the design every time a dimension specification is specified. The dimension specification could then serve as a target dimension for that dimension version. For example, the Smart Phone dimension specification could serve as a target dimension for the Smart Phone dimension version such that when the design was rendered at the precise Smart Phone dimension specification, the Smart Phone dimension version would be rendered. As another example, the Smart Phone dimension specification could serve as a trigger point or threshold dimension such that any time the design was rendered on a device having a relevant rendering space dimension that was less than the Smart Phone dimension specification, the Smart Phone dimension version would be rendered instead of the Default dimension version. If multiple dimension specifications were added, and each was associated with a different dimension version, the dimension specifications could serve as multiple threshold dimensions or trigger points such that the design would be rendered in the largest version for which the device's relevant rendering space dimension was less than the dimension specification for that version.

In approaches that followed the rule articulated at the close of the last paragraph, the dimension specifications could be treated such that if a dimension were not specified, it would be assumed to be infinite. The Default dimension version would therefore not need to be associated with a particular dimension specification as infinity would be the assumed value. In addition, dimension specifications having multiple inputs, such as one that required both a width and a height, could still operate given this approach even if only a single dimension was specified. For example, if the dimension specification included a width of 3 inches, but the user did not include a height value, then the design would operate as if the height value were infinite and would only be responsive based on the width value.

The manner in which the dimension specification and dimension versions are related by the graphical design could be configurable by the user. For example, the user could specify that a given dimension specification is a target dimension and the associated dimension version should only be rendered when an available rendering space is equal to the size specified by the dimension specification. The design environment could provide an interface to receive an input from a user to also specify that a given dimension specification is a trigger dimension such that any time an available rendering space exceeded the size specified in the dimension specification the associated dimension version should be rendered. Contrarily, the design environment could provide an interface to receive an input from a user to specify that an associated dimension version should be rendered only when an available rendering space was less than the size specified in the dimension specification. In the case of masters that have multiple views, the dimension version of an instance of those masters can be configured by the user irrespective of other dimension specifications.

A method 300 for allowing a user to specify a responsive design can be described with reference to FIG. 3. In step 301, a graphical user interface is provided to a user that displays a page of a design. The graphical user interface could be the same as the graphical design environment 200 described above. In step 302, a widget characterization interface is provided to the user to allow them to add an interactive widget to the page. The widget can be added to a default dimension version. In step 303, a characterization is accepted from the user to be associated with the interactive widget in a default dimension version. In step 304, a dimension specification interface is provided to a user to allow the user to specify a second dimension version. The specification interface in step 304 could accept a specification via a manual input dimension specification and the automatic creation of an associated dimension version, the selection of a default or previously user-defined dimension version, or through the adjustment of an adjustable window and the selection of the instant window size as a dimension specification and the automatic creation of an associated dimension version. In step 305, a second characterization for the widget is accepted from the user to be associated with the interactive widget in the second dimension version. Steps 304 and 305 could be executed multiple times to allow a user to specify multiple dimensions versions and to provide different characterizations for a widget in each specified dimension version. However, the widget does not need to have different states for each dimension version and as a result step 305 could be skipped for particular iterations. Accepting steps 303 and 305 could be accomplished through the use of a computing system that receives inputs from a user and routes them to a processor where the characterizations are associated with the interactive widget. The computing system could route the input from the user in an intra-computer routing network, a local area network, the Internet, or any computing system network. The computing system could be the computing system discussed below in FIG. 18.

Figure 3:
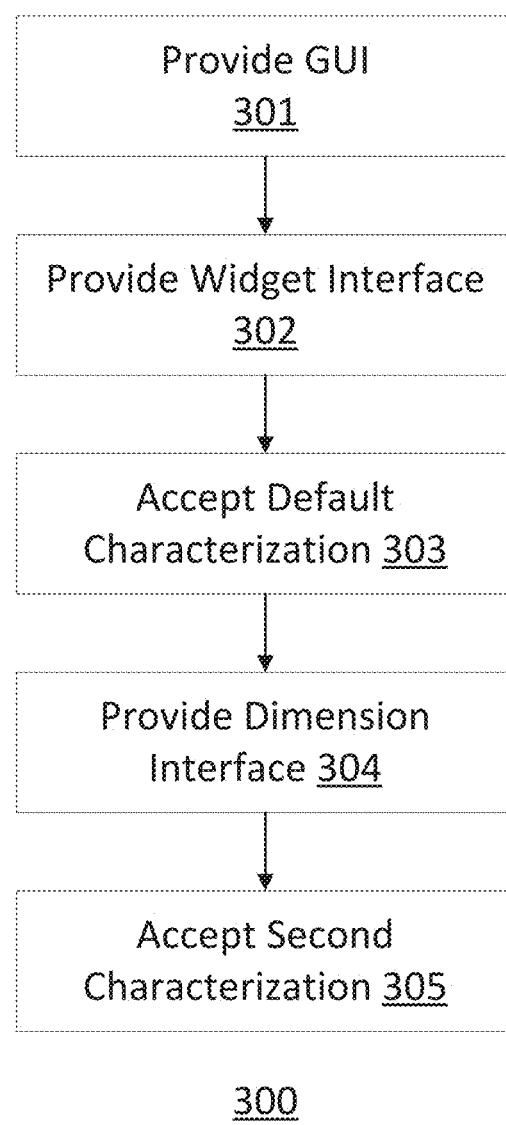
FIG. 3 illustrates a flow chart of a method for allowing a user to specify a responsive design, in accordance with some embodiments.

The target dimensions in the method of FIG. 3 could be used by a final design specified in the design tool to select which states are to be applied to the widgets in the design when the design is rendered. For example, if a browser rendering a design had a screen size with a relevant dimension associated with the second dimension version, the interactive widget would be rendered in accordance with the second characterization. Then, if the browser's screen size was adjusted so that it had a relevant dimension associated with the default dimension version, the interactive widget would then be rendered according to the other characterization.

Figure 4A:
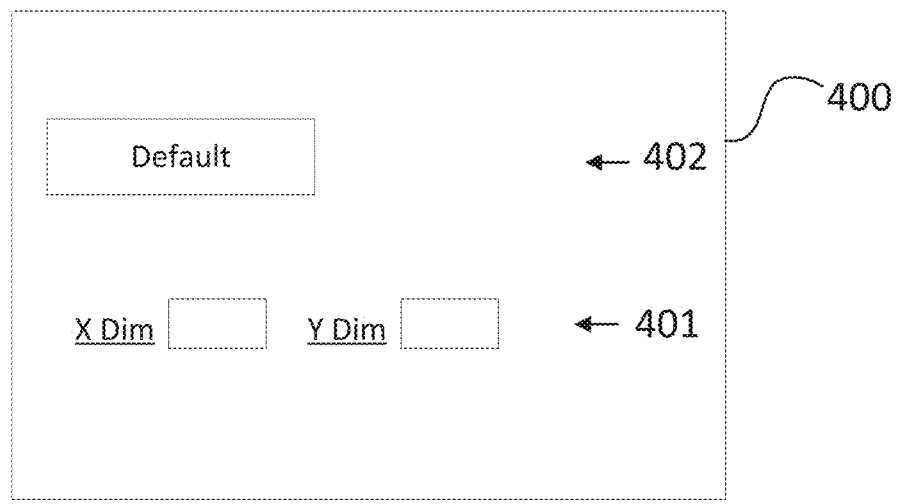
FIGS. 4A-B illustrate graphical user interfaces for a graphic design tool, in accordance with some embodiments.
Figure 4B:
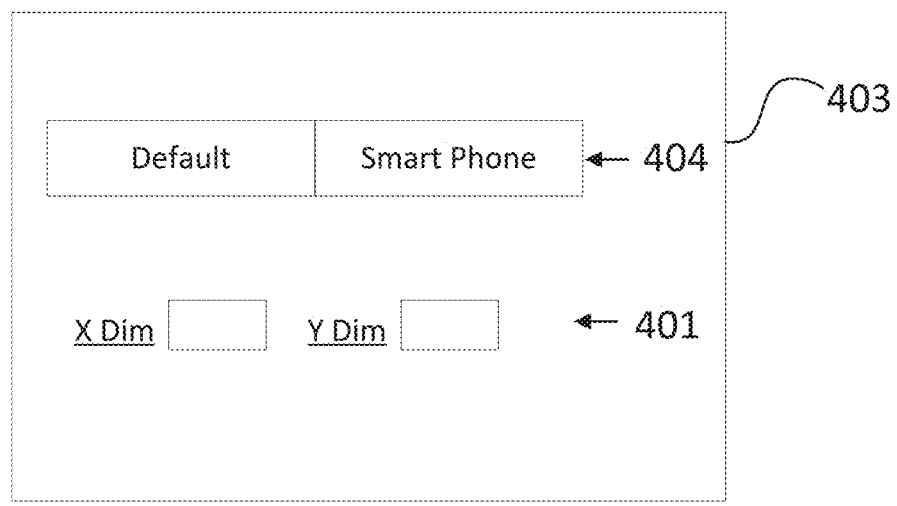
Figure 5:
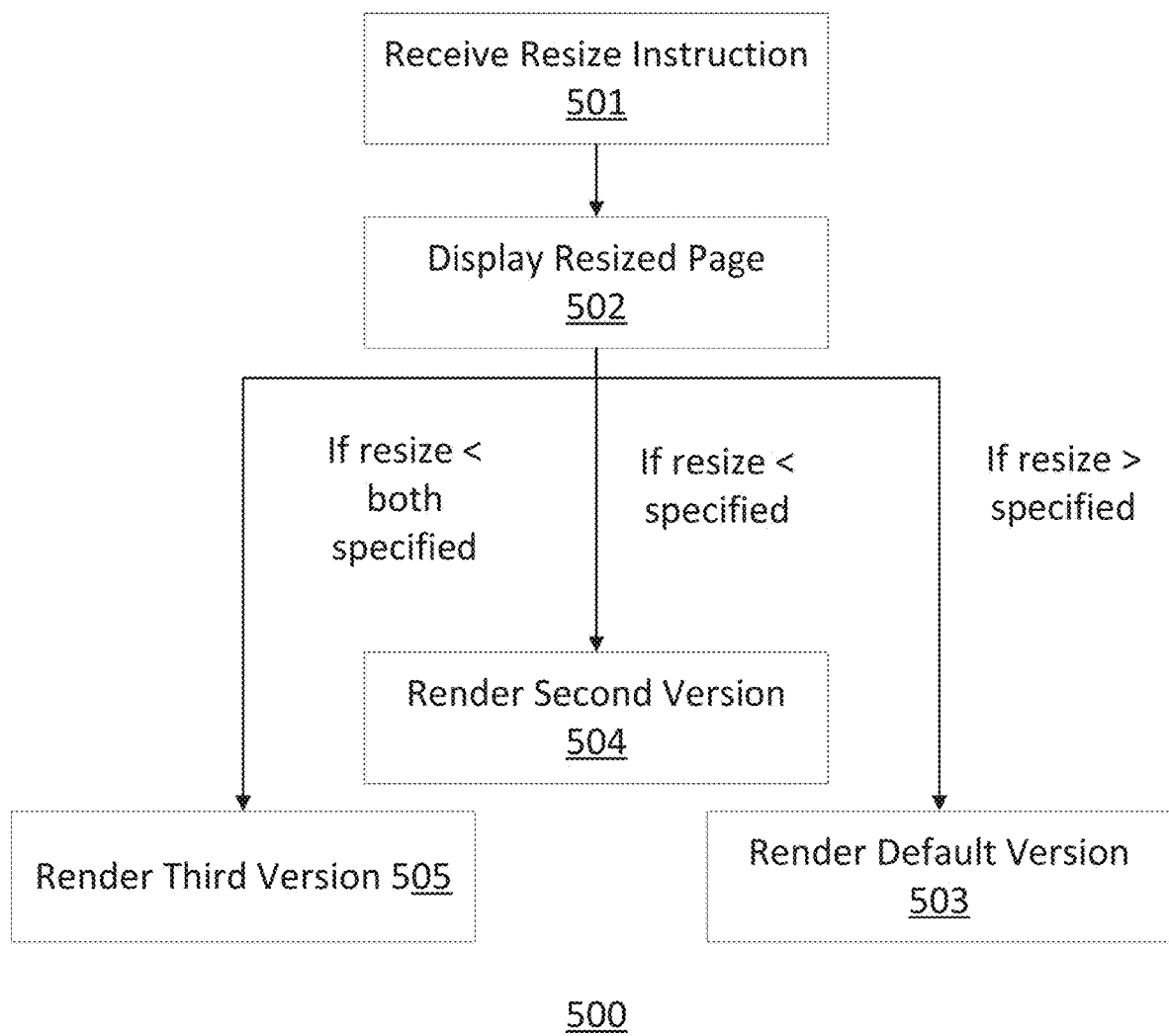
FIG. 5 illustrates a flow chart of a method for displaying the responsiveness of a design, in accordance with some embodiments.

A specific example of how the method described with reference to FIG. 3 could operate with a specific graphical user interface can be described with reference to FIGS. 4A and 4B. FIG. 4A displays a graphical user interface 400 comprising a widget characterization interface 401 and a dimension specification interface 402. In this example, the widget characterization interface is an absolute position specification interface configured to accept x- and y-coordinates for the widget. Interface 401 would be provided to the user in step 302 above. The absolute position could be specified using an x- and y-coordinate entered by the user into widget characterization interface 401 and accepted in step 303. In step 304, the dimension specification interface could be provided to the user in the form of dimension specification interface 402 or 404. If the specification interface 402 was provided to the user, another portion of the specification interface would be necessary for the user to add the "Smart Phone" button 404 (FIG. 4B) to allow the user to select a different dimension specification via graphical user interface 403. This button could be added by any of the methods described above including selecting from default sizes already known to the tool or specifying the new dimension specification manually. Once selected, the button "Smart Phone" could switch the editing and viewing mode to that dimension version. Then, in step 305, a second characterization in the form of a second absolute position of the same widget could be defined using the same interface 401 as was used in step 302 to specify a new set of x and y coordinates for the widget at the "Smart Phone" size.

The characterizations of the widget that are specified according to the method in FIG. 3 above can be stored at the same location in a computer memory. The default and second characterizations of the widget can be stored in a computer memory after being accepted from a user in a step of storing the default and second characterizations in a memory. Furthermore, for properties that are not specified as having different values in the different dimension versions, the value for the property can be stored in the same location in memory. For example, a button that has a text property with text content that changes from one dimension version to another and an absolute position that changes as well, could have a color property that stays the same regardless of what dimension version the button is rendered in. In that situation, the value for the color property for that widget could be stored in the same location in memory and the property would be common for the different states of the widget.

Once a widget has been specified to have multiple states for multiple dimension versions in a design, how the widget responds to various dimension specifications can be verified while in the tool. A method 500 for displaying the responsiveness of a design in the tool according to the various dimension specification can be described with reference to FIG. 5. The methods of FIG. 5 can begin immediately after the specifications have been received as described in FIG. 3, or it can begin after the two widget states have been received according to any other method. In step 501, a resize instruction is received from the user. For example, the resize instruction can be received from the selection of a button, the selection of an entry in a pull down menu, or by clicking and dragging a window adjustor input to resize a window. The resize instruction will resize the page such that it has a resized dimension. In step 502, a resized version of the page is provided to display to the user in response to the received resizing instruction. In the simplest case, the resized dimension will not alter the relationship of the tool display to the dimension specifications. As a result, the widgets in the design are rendered without modification.

In embodiments where a dimension specification is used as a threshold—where one dimension version of the design is rendered below the threshold and another is rendered above the threshold—an interactive widget will be rendered with one characterization if the resized dimension is larger than the dimension specification, and another characterization if the resize instruction selects a dimension that is smaller than the dimension specification. For example, in the method displayed in FIG. 5 the method will move to step 503 if the resized dimension is larger than the dimension specification and will move to step 504 if the resized dimension is smaller than the dimension specification. The design will be rendered in accordance with a default dimension version in step 503 and a second dimension version in step 504. Note that if a second dimension specification had been specified previously, the characterization displayed could depend on the relative sizes of the two dimension specifications. For example, in the method displayed in FIG. 5 if the second dimension specification were less than the first dimension specification, the method would move to step 505 if the resized dimension is less than both of the dimension specifications. In step 505 the design would be rendered according to a third dimension version associated with the second dimension specification.

In some example embodiments where different states are specified for widgets in various dimension versions, certain benefits accrue as compared to the related art. In particular, the fact that the same widget exists as part of the design in each of the dimension versions facilitates the modification and creation of the design. Used in combination with the different size editing modes described below, editing the entire design can be done easily by editing the widget in a single dimension version and having the edit selectively propagate throughout the design. In some embodiments, this is facilitated by storing characterizations for the widget at common locations in a memory. The memory will store the widget along with a set of values for properties of the widget in the first state and second state. Particular values for a property of the widget that is the same in the first state and second state will be stored at a single location in memory. By applying this method and other approaches, the widget will be treated as a single unitary element by the computer system used to provide the design environment, thereby providing efficiency to both the design process and the computer resources needed to store the widgets used in the design.

Design Environment: Responsive Masters

In some embodiments, the design environment provides an interface to add masters to a design. A master is a widget, or a collection of widgets, that is maintained in a single source location and then reused throughout a design. Edits made to a master can be automatically applied everywhere that master is used within the design. Masters can be added to pages, to containers, and to other masters. An instance of a master, and not the master itself, is placed in a design. Unless overridden, changes made to the master propagate to instances of the master. However, changes made to an instance of the master do not propagate to the master. The masters may contain widgets that are specified within the master. The widgets may be responsive. Masters can serve as templates for any design element that needs to be repeated multiple times in a design. For example, a design's header, footer, and navigation content are often presented on multiple pages of the design to provide the design with a unified look and feel and to allow for easier access to the various portions of the design. However, masters can also be used to facilitate the editing of something as simple as a single image that is placed in various locations in a single design. Masters are well suited to the task of managing a responsive design because they allow for edits to be easily propagated through the design. As mentioned previously, responsive graphical design compounds the amount of design work that needs to be done for the entire design, so the ability of masters to allow for centralized management of these design efforts is therefore beneficial. Tools and methods for specifying a design using masters with responsive widgets can be described with reference to FIGS. 6-9F.

Interfaces similar to the one described with reference to FIG. 2 can be used to specify a design using masters with responsive widgets. The masters can be selected from an interface and dragged into a design, or they can be specified through other means such as a combination of short-cut keys. However, masters can also individually be specified in their own separate design windows, and then be pulled in to the main design window after they have been fully defined. A user-defined master template definition can likewise be saved so that it can be easily retrieved and brought back out into the design space. Finally, although the discussion below is generally directed to masters that can be pulled into pages of a design, the teachings herein apply equally to masters that serve as pages of a design themselves.

Figure 6:
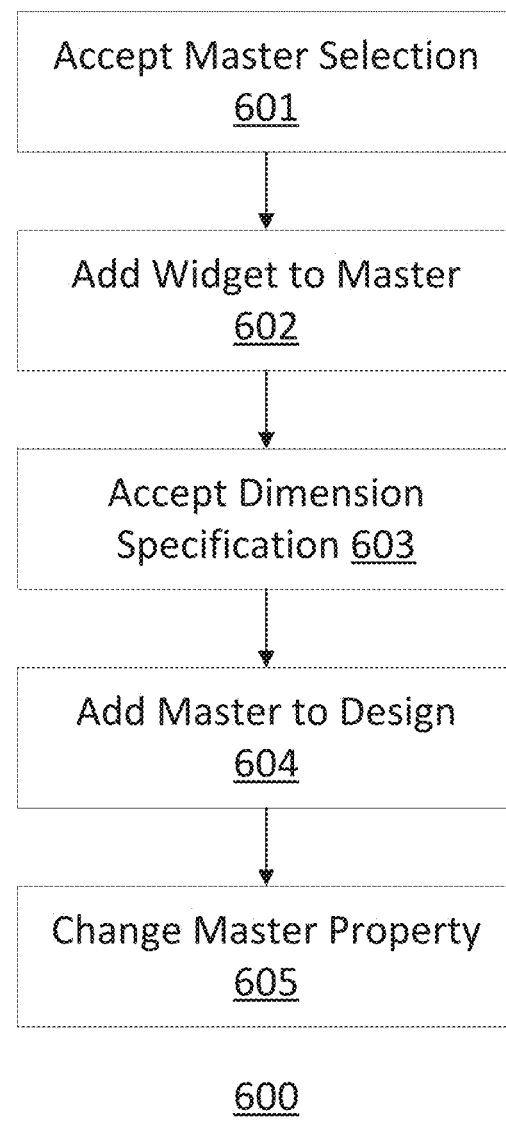
FIG. 6 illustrates a flow chart of a method for specifying a design using masters with responsive widgets, in accordance with some embodiments.

A method 600 for specifying a design using masters with responsive widgets can be described with reference FIG. 6. In step 601, a master selection is accepted via a communication system from a user. The master selection can be of a predefined master or it can involve the separate specification of a new master and the selection of that master from a customized library. In step 602, a widget is added to the master with a specific characterization. In step 603, a dimension specification is accepted from the user via a routing system. The master can then be viewed by the user in a different dimension version and the user can choose to specify a second characterization to the same widget. In step 604, an instance of the master can be added to various pages in the design. In step 605, a property of a widget in the master can be changed which will be automatically applied to all of the various pages in the design. For example, the color of a widget's border could be changed, and the change would be propagated through to every page on which the master appeared.

Figure 7B:
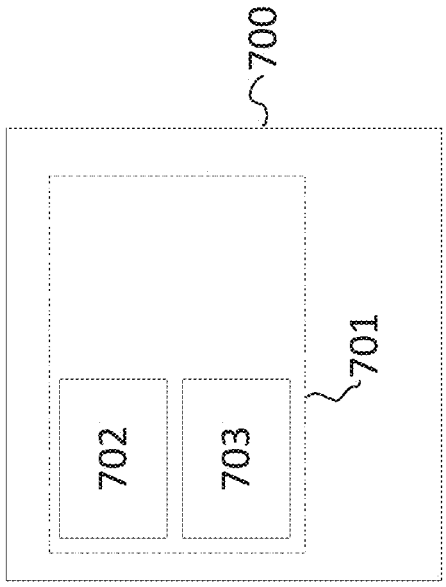
FIGS. 7A-D illustrate different versions of a responsive graphical design, in accordance with some embodiments.
Figure 7D:
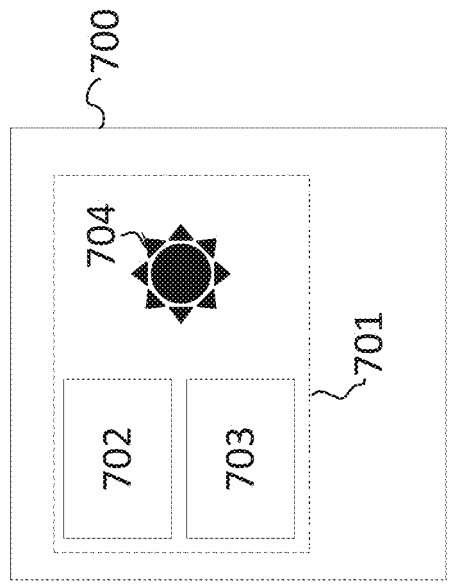
Figure 7A:
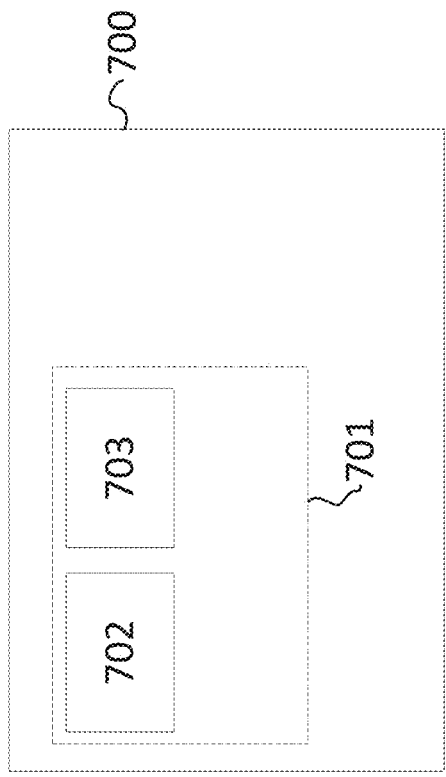
Figure 7C:
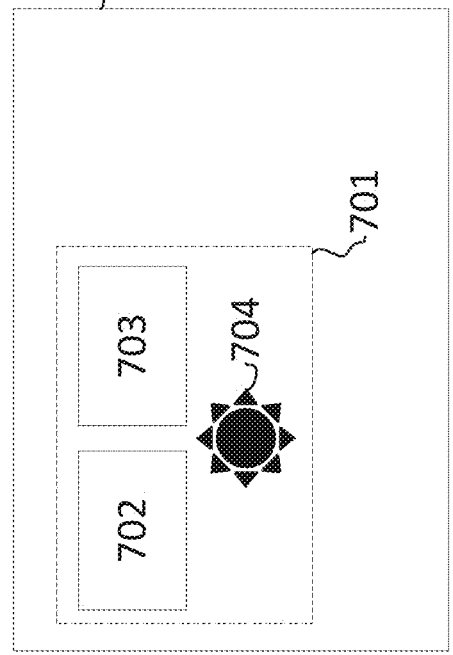

An example of how this method can improve the design process for responsive designs can be described with reference to FIGS. 7A-D. FIG. 7A displays a web page 700, a master 701, and two widgets 702 and 703. As described above, the widgets 702 and 703 were placed within master 701 and may have been specified in a separate design window from web page 700. In this situation, widgets 702 and 703 are text elements that need to appear consistently in the location on web page 700 taken up by master 701 across multiple pages in a design. In other words, numerous pages in the design involve text located in the upper left corner of the web page in the orientation shown. FIG. 7B displays the same web page after it has been resized to a narrower size. Note that master 701 has not changed its location, but that widgets 702 and 703 are now located in different positions relative to each other. This is because the widgets responded to the adjustment in the web page size as previously specified by the designer. FIGS. 7C and 7D illustrate the same web page and widgets, but also include image 704. This edit was made to the master (i.e., an image was added to the master) after the designs in FIGS. 7A and 7B were specified. The benefit of this approach arises from the fact that image 704 will be included throughout the design everywhere that the master is located which significantly decreases the editing required to implement the modification.

Widgets and dimension specifications can be specified for a master in the same manner that they are specified in a design generally. Notably, the position of the widget can be specified relative to the master in a proportional offset from a center or corner of the master, or through the specification of an x- and y-coordinate of the widget where the coordinate system is defined with respect to the master. Furthermore, the editing methods used to specify the characteristics of a master can overlap the editing methods used to specify the characteristics of a widget to a certain degree.

In some embodiments, the masters themselves can be responsive. For example, a master used as a header may be modified to change the shape, appearance, and content of the master as the width of a page decreases. Since the header needs to appear on every web page, and headers generally span the entire width of a web page, they are particularly well suited to being treated as masters in a design. However, the benefits associated with responsive masters are generally applicable to any design element that is used repeatedly even if it is only used multiple times on a single page of the design.

Figure 8:
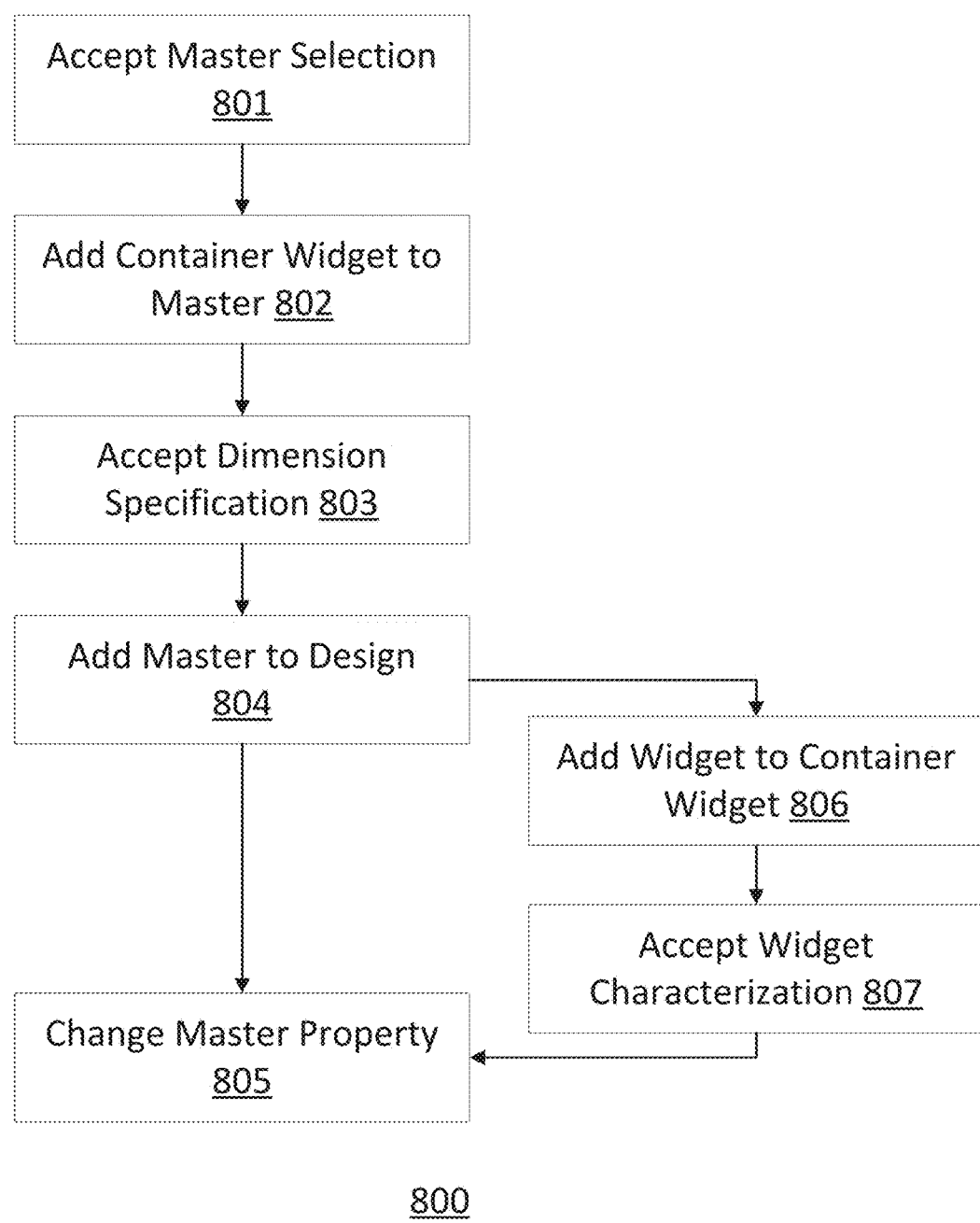
FIG. 8 illustrates a flow chart of a method for specifying a design using container widgets in masters, in accordance with some embodiments.

The use of responsive container widgets and masters in a design environment provide additional benefits that can be described with reference to FIGS. 8 and 9. FIG. 8 illustrates a method 800 for specifying a design using container widgets in masters. In step 801 a master selection is accepted via a routing system from a user. The master selection can be of a predefined master or it can involve the separate specification of a new master. In step 802, a container widget is added to the master with a specific characterization. The characterization will include a position of the container widget in the master and a size of the container widget. In step 803, a dimension specification is accepted from the user. The master can then be viewed by the user and the user can chose to specify a second characterization to the same container widget. In step 804, an instance of the master can be added to various pages in the design. In step 805, a property of the master can be changed which will be automatically be applied to all of the various pages in the design.

Method 800 can also include steps 806 and 807. As shown in FIG. 8, these steps can be conducted after the instance of the master is added to various pages in the design. In step 806, a widget is added to a container widget. Then in step 807, different characterizations are accepted for the widget that was added in step 806. The different characterizations can be applied to create different states for the widget that are associated with different dimension versions. Unlike the change made to a property of the master in step 805, the widget addition and characterization in steps 806 and 807 will only modify a single instance of the master. This is because the container widgets are associated with the master but the contents of the container are not. The net effect of this procedure will be that a degree of responsiveness associated with the master can be edited separately from a degree of responsiveness associated with widgets that are placed in the container widgets in the masters.

Figure 9A:
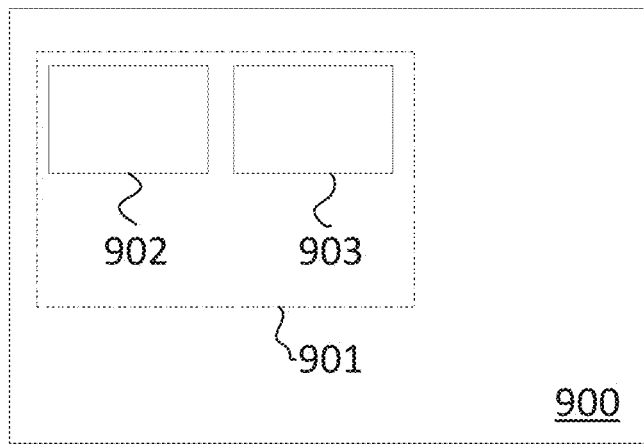
FIGS. 9A-F illustrate different versions of a responsive graphical design, in accordance with some embodiments.
Figure 9B:
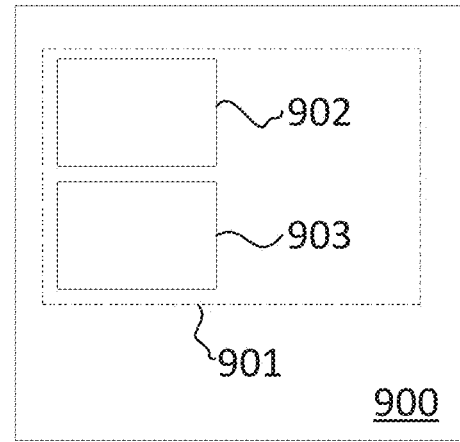
Figure 9C:
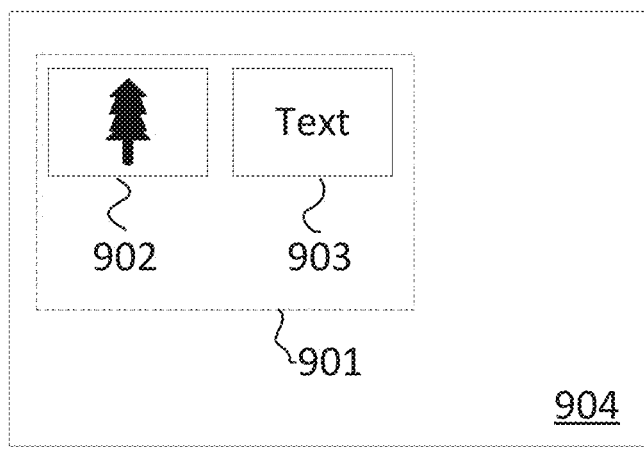
Figure 9D:
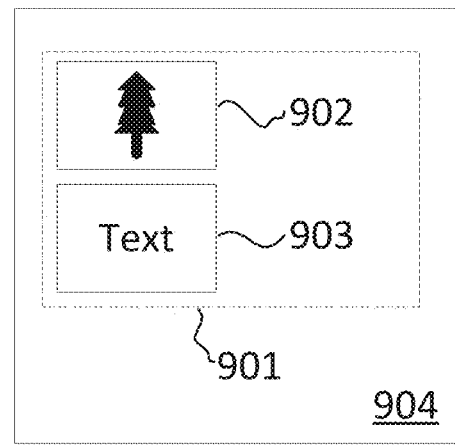
Figure 9E:
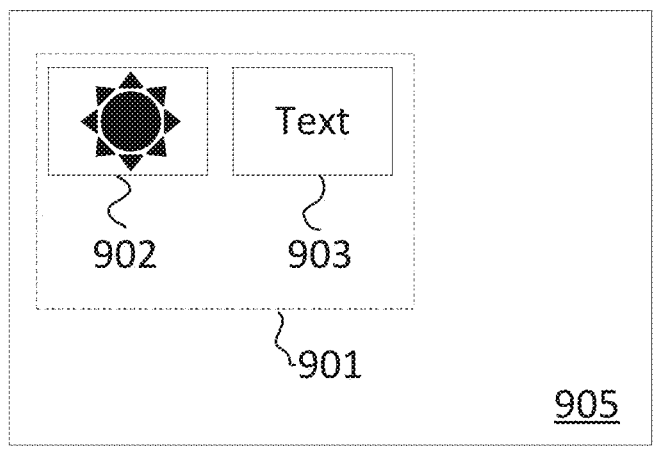
Figure 9F:
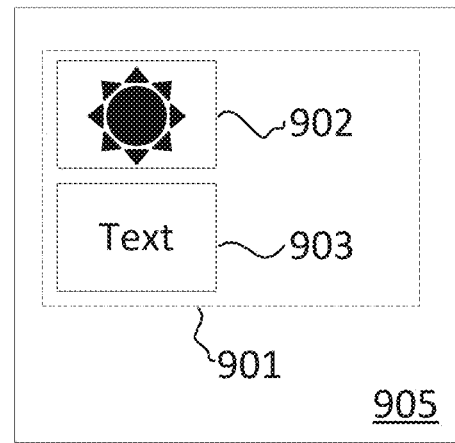

An example of the results of this method can be described with reference to FIGS. 9A-9F. FIG. 9A displays a page 900 of a design including a master 901 and two container widgets 902 and 903. The container widgets 902 and 903 are defined so that when the page is resized as shown by comparing FIG. 9A and FIG. 9B, the container widgets 902 and 903 are located in new positions in master 901. FIG. 9C displays page 904 with another instance of master 901 including additional widgets that have been added to container widgets 902 and 903. As illustrated in FIG. 9C, one of the additional widgets is a text block and one of the additional widgets is an image of a tree. FIG. 9E displays page 905, which is a different page of the same design having a still further instance of master 901. The instance of master 901 on page 905 includes additional widgets that have been added to container widgets 902 and 903. As illustrated in FIG. 9E, one of the additional widgets is a text block and one of the additional widgets is an image of a sun. Note that the responsiveness of the containers is maintained while the content of the pages is different as illustrated by comparing FIGS. 9D and 9F to FIGS. 9C and 9E, respectively. Therefore, the responsiveness of the layout can be centrally managed by editing the container widgets in master 901 while the content of the individual pages can be specified independently by editing the content of the container widgets 902 and 903 on pages 904 and 905.

Using container widgets, it is therefore possible to segment aspects of a master that will be editable from a single instance of the master from aspects that will only change locally. This provides another degree of freedom to the designer to aide in maintaining design flexibility while maintaining enough interrelationships in the design to facilitate easy manipulation of the design as the design process continues.

In some embodiments shown and described herein, the design environment provides an interface to associate masters with "views" and to select which view should be used when presenting each instance of each master independently of the view selected for other master instances. The view displayed for each master, and for each instance of each master, can be selected independently of other views of the design and without severing an inheritance relationship between an instance of the master and the master itself.

In some embodiments, a view is a design pattern of a master, such as a widget layout, a widget style scheme, a widget template, a form, or other pattern for arranging widgets within a master. In other embodiments, a view is a dimension version of a responsive master as previously described herein. In such embodiments, the presented dimension specification of a master instance is advantageously not determined by the dimension specification of the page, master, or container that contains it. Instead, within the design environment, a selection of a specific dimension version, i.e. view, to be displayed is received, for example from an interface for selecting a view.

In some example embodiments, the particular view displayed for a master is not explicitly selected using a selection interface of the design environment. Instead, a rule is defined to automatically specify the displayed view. A rule could specify, for example, that if a webpage or mobile application containing an instance of a master is wider than 500 pixels, then a widget within the instance of the master should be displayed in accordance with a first widget characterization (e.g., a first color, a first size, a first absolute position, a first anchoring rule, a first style etc.) associated with a first view of the master. Another rule could specify, for example, that if a background style of a webpage containing the instance of the master is of a certain style, then the widget within the instance of the master should be displayed in accordance with a second widget characterization associated with a second view of the master (e.g., a second color, a second size, a second absolute position, a second anchoring rule, a second style, etc.). Yet another rule could specify, for example, that if the instance of the master, when rendered in a prototype (e.g., in a web browser or mobile application), is resized to a dimension greater than 300 pixels, then the widget within the instance of the master should be displayed in accordance with a third widget characterization associated with a third view of the master (e.g., a third color, a third size, a third absolute position, a third anchoring rule, a third style, etc.). In addition to rules which determine an instance view of a master based on a containing context of that master, rules can also determine an instance view of the master based on properties (e.g., a style, a dimension, a position, etc.) of the instance of the master itself. For example, a rule could specify that if an instance of a master is resized (either in the design environment or the prototype environment) to be wider than 500 pixels, then a widget within the instance of the master should be displayed in accordance with a first widget characterization (e.g., a first color, a first size, a first absolute position, a first anchoring rule, a first style etc.) associated with a first view of the master. Another rule could specify, for example, that if a background style of an instance of a master is of a certain style, then the widget within the instance of the master should be displayed in accordance with a second widget characterization associated with a second view of the master (e.g., a second color, a second size, a second absolute position, a second anchoring rule, a second style, etc.).

In addition to being able to select a view for each instance of a master from within the design environment, in some embodiments, a displayed view for an instance of a master can be selected in a generated prototype (e.g., a webpage or a mobile application) independently of whatever view is used to present the prototype.

In some embodiments, views are characterized by a parent-descendent inheritance relationship (e.g., parent-child). A descendent view (e.g., a child view) inherits properties from its parent view unless those properties are overridden in the descendent view. A parent view can have multiple descendent views. For example, a parent view can have a first child view, the first child view can have a second child view, a third child view and a fourth child view, the second child view can have a fifth child view, and so on. A master can have more than one parent view, and each of those parent views can have zero or more descendent views.

Two or more instances of the same master can be added to a containing context (e.g., a page, or another master) and each instance of that master can be displayed according to a different view of the master without breaking an inheritance relationship with the master. That is, widget characterizations applied to widgets of a master in a parent view of the master will propagate to those widgets in the children view of the master unless they have been overridden in the children view. Placing a master in a containing context creates an instance of that master. For example, in embodiments where a master specifies a design, placing that master in a containing context creates an instance of the design. Similarly, placing a widget in a containing context creates an instance of that widget. Thus, placing a widget in a master creates a first instance of the widget. Placing that master into a containing context creates a first instance of the master and an instance of widget that is based on the first instance of the widget.

Figure 10:
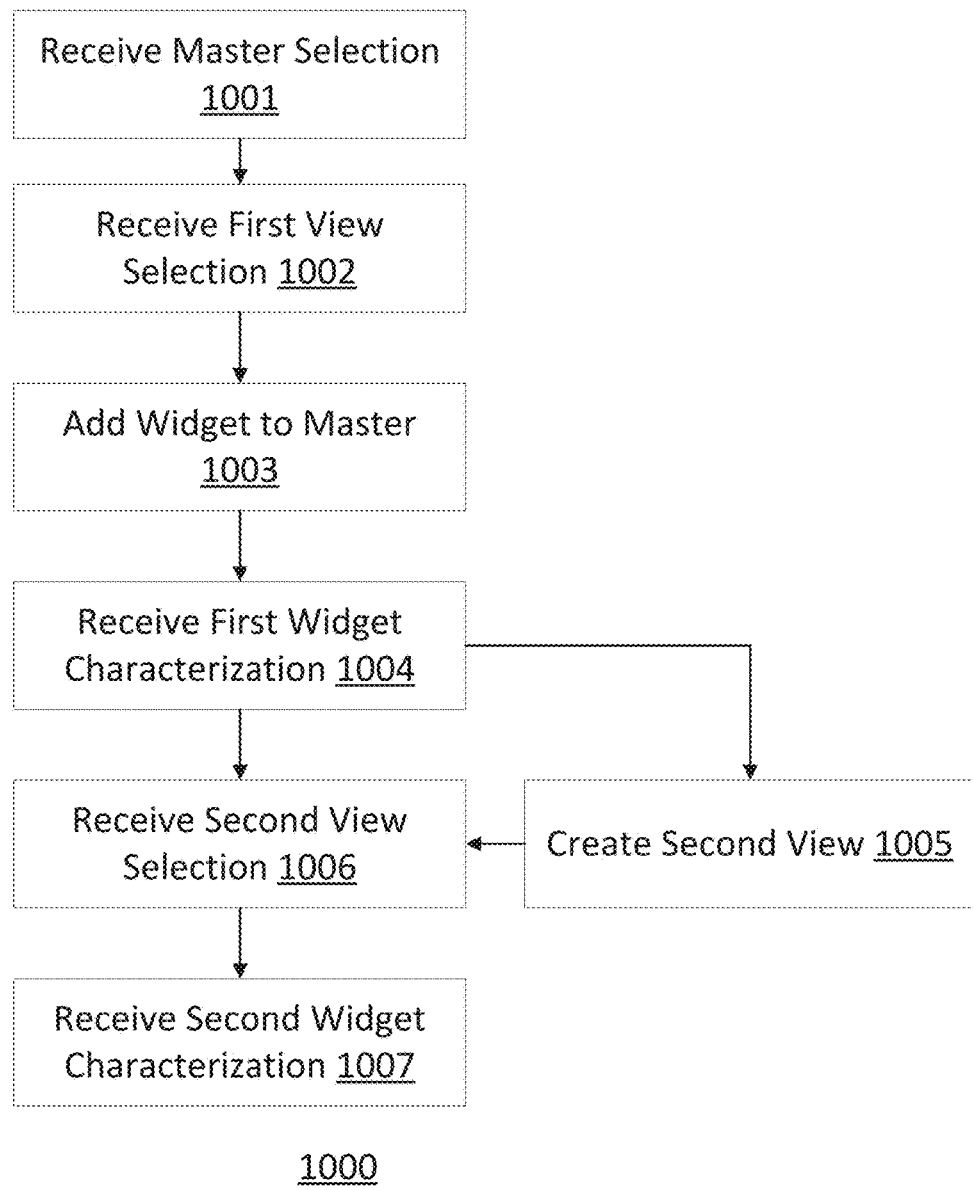
FIG. 10 illustrates a flow chart of a method for specifying a design using multi-view masters, in accordance with some embodiments.

A method 1000 for independently specifying views for multi-view masters (i.e., masters having multiple associated views) can be described with reference FIG. 10. The particular steps, order of steps, and combination of steps are shown for illustrative and explanatory purposes only. Other embodiments can implement different particular steps, orders of steps, and combinations of steps to achieve similar functions or results. In step 1001, an input for a master selection is accepted or received, e.g., from a designer via an input interface of the design environment. The master selection can select a predefined master, or the master selection can involve the separate specification of a new master. In step 1002, an input for a first view selection for the master is accepted or received, e.g., from the designer via an input interface of the design environment. For example, the first view selection could include a parent view of the master, or a child view of the master. In some embodiments, upon receiving the first view selection, widgets of the master are presented in accordance with the first view (e.g., a first widget layout, a first widget pattern, a first widget style, etc.). In step 1003, a widget (i.e., an instance of a widget) is added to the master, e.g., by a designer via an interface provided within the design environment. In some example embodiments, the widget is added to the master without first being added to a container widget of the master. In other example embodiments, the widget is added to a container widget that was previously added to the master. In some example embodiments, the widget is itself a master. If the widget is added to the master in association with a parent view of the master, the widget will appear by default in each descendent view of the master. However, if the widget is added to the master in association with a child view of the master, the widget will appear by default only in association with that child view of the master and any views of the master that are descendants of that child view. In step 1004, an input for a first widget characterization for the widget is accepted or received, e.g., from the designer via an input interface of the design environment. In some example embodiments, the first widget characterization includes one or more of a first absolute position of the widget, a first style of the widget, a first dimension of the widget, a first state of the widget, a first relative position of the widget, a first anchoring rule of the widget, or another configurable characterization of the widget.

In optional step 1005, a second view may be created, e.g., by the designer via an input interface of the design environment, if the second view was not previously created. In some embodiments, creating the second view includes creating and storing a data structure in association with the master. In some embodiments, the data structure could be part of a data structure of the master, in other embodiments, the data structure could include a reference to the master. The data structure could include a name of the second view, and an indication of an inheritance relationship between the second view and other views of the master. For example, if the first view of the master is a parent view, the data structure for the second view might specify that the second view is a child view of the parent view of the master. Or, if the first view of the master is a parent view, the data structure for the second view might specify that the second view is another parent view of the master.

In step 1006, an input selecting the second view of the master is accepted or received, e.g., from the designer via an input interface of the design environment. In some embodiments, upon receiving the second view selection, the widgets of the master are presented in accordance with the second view (e.g., a second widget layout, second widget pattern, a second widget style, etc.). In step 1007, an input for a second widget characterization for the widget is accepted or received, e.g., from the designer via an input interface of the design environment. In some example embodiments, the second widget characterization includes one or more of a second absolute position of the widget, a second style of the widget, a second dimension of the widget, a second state of the widget, a second relative position of the widget, a second anchoring rule of the widget, or another configurable characterization of the widget. Thus, the first widget characterization is associated with a first view of the master, and the second widget characterization is associated with a second view of the master. If the first view and the second view are each descendants of a parent view of the master, a third widget characterization received for the widget in the parent view of the master will propagate to the widget in the first view and the second view of the master, unless the third widget characterization was overridden in the first view or the second view.

Figure 11A:
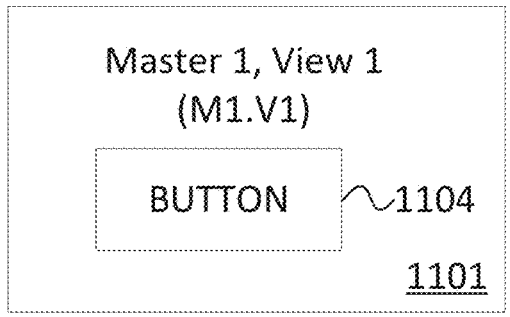
FIGS. 11A-J illustrate different versions of designs using multi-view masters, in accordance with some embodiments.
Figure 11B:
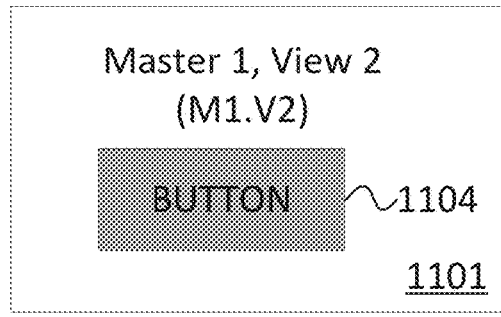

An example of how method 1000 can improve the design process for responsive designs can be described with reference to FIGS. 11A-J. FIG. 11A shows a first master 1104 (Master 1) displayed in a design window 1101 of the design environment. The first master 1104 includes an instance of a widget implementing a button. The button widget of the first master 1104 is displayed in accordance with a first widget characterization corresponding to a first view (View 1) of the first master 1104. This master/view combination is designated as M1.V1. In the example shown, the first widget characterization of the button widget of the first master 1104 specifies a white background color fill (e.g., a first style). FIG. 11B shows the first master 1104 (Master 1) displayed in the design window 1101. The button widget of the first master 1104 is displayed in accordance with a second widget characterization corresponding to a second view (View 2) of the first master 1104. This master/view combination is designated as M1.V2. The second widget characterization of the button widget of the first master 1104 specifies a grey background color fill (e.g., a second style).

Figure 11C:
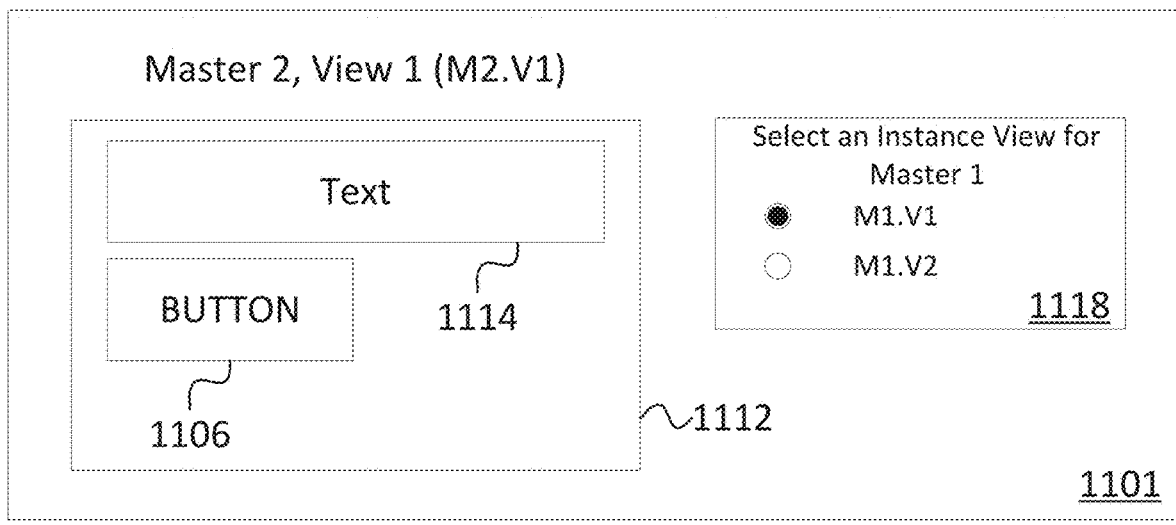

FIG. 11C shows a second master 1112 (Master 2) displayed in the design window 1101 of the design environment. In the example shown, the second master 1112 includes an instance of a textbox widget 1114 and an instance 1106 of the first master 1104. One or both of the textbox widget 1114 and the instance 1106 of the first master 1104 are displayed in accordance with a first widget characterization of the second master 1112 which is associated with a first view (View 1) of the second master 1112. This master/view combination is designated as M2.V1. Because the second master 1112 contains the instance 1106 of the first master 1104, the second master 1112 is considered to be a containing context. Other examples of containing contexts include containers, widgets, forms, headers, footers, navigation bars, and pages. The first widget characterization for the textbox widget 1114 of the second master 1112 specifies, for example, a position of the textbox widget 1114 relative to the instance 1106 of the first master 1104 within the second master 1112.

A simplified example of an interface 1118 enables a designer to select an instance view for the instance 1106 of the first master 1104 from a list of available views for the first master 1104 (M1.V1 or M1.V2). In the example shown in FIG. 11C, the selected instance view M1.V1 for the instance 1106 of the first master 1104 in the interface 1118 indicates that the instance 1106 of the first master 1104 should be displayed in accordance with View 1 of the first master 1104, the button widget of the instance 1106 therefore being displayed in accordance with the first widget characterization (a white background).

Figure 11D:
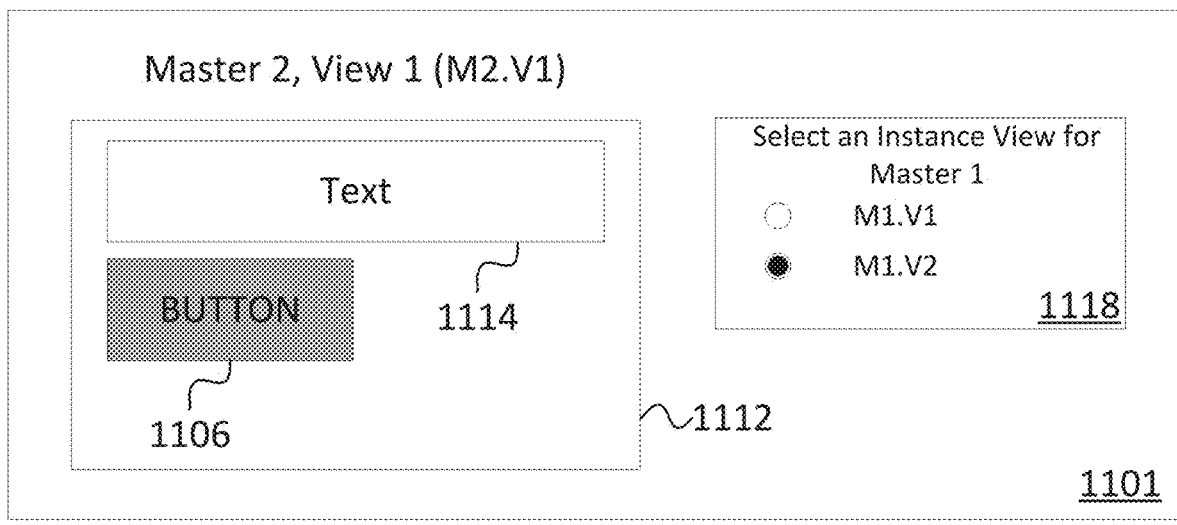

In the example shown in FIG. 11D, the selected instance view M1.V2 for the instance 1106 of the first master 1104 in the interface 1118 indicates that the instance 1106 of the first master 1104 should be displayed in accordance with View 2 of the first master 1104, the button widget of the instance 1106 therefore being presented using the second widget characterization (a grey background). Other widget characterizations made to the button widget of the first master 1104 that are not overridden by View 1 or View 2 of the first master 1104 will still propagate to the button widget of the instance 1106 of the first master 1104 (e.g., a button shape, a button size, etc.).

Figure 11E:
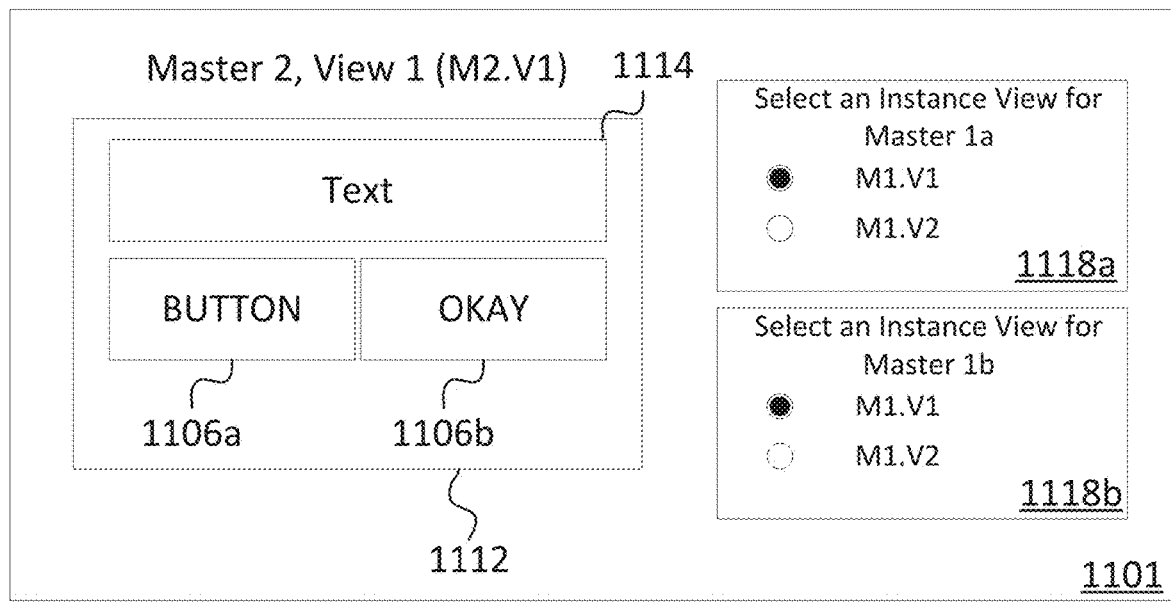

FIG. 11E illustrates a simplified example of the design window 1101 of the design environment, where a first instance 1106*a* (Master 1*a*) of the first master 1104 and a second instance 1106*b* (Master 1*b*) of the first master 1104 have been placed in the second master 1112 (Master 2). As shown, instance view M1.V1 for the first instance 1106*a* of the first master 1104 is selected in an example interface 1118*a*, indicating that the button widget of the first instance 1106*a* of the first master 1104 should be presented in accordance with View 1 of the first master 1104. View 1 of the first master 1104 is associated with the first widget characterization of the button widget (a white background). Similarly, instance view M1.V1 for the second instance 1106*b* of the first master 1104 is selected in example interface 1118*b*, indicating that the button widget of the second instance 1106*b* of the first master 1104 should also be presented in accordance with View 1 of the first master 1104 (i.e., the first widget characterization of the button widget). Additionally, the text of the second instance 1106*b* of the first master 1104 has been changed to "OKAY".

Figure 11F:
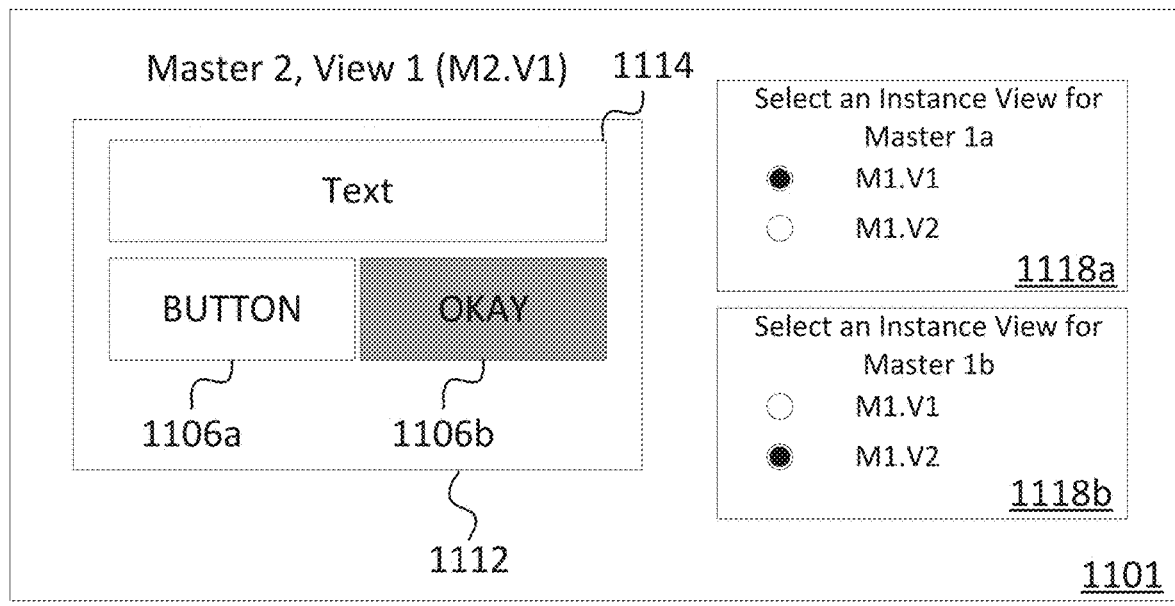

FIG. 11F shows the simplified example first presented in FIG. 11E, however, instance view M1.V2 for the second instance 1106*b* of the first master 1104 is selected in the example interface 1118*b*, indicating that the button widget of the second instance 1106*b* of the first master 1104 should be presented in accordance with View 2 of the first master 1104. View 2 of the first master 1104 is associated with the second widget characterization of the button widget (a grey background).

As previously described, unless overridden, changes made to a widget of the master in a parent view will propagate to the widget of the master in descendent views unless those changes are or have been overridden. The different views of the master do not override such changes. That is, if a background color of the widget is changed in a parent view of the master, the changed background color propagates to the widget in each descendent view of the master. On the other hand, if the background color of the widget is changed in a second view of the master, thereby overriding that widget characterization in the second view, further changes made to the background color of the widget in the parent view would still propagate to the widget in the first view, but not in the second view.

Widget characterizations can be applied to an instance of a widget within an instance of the master, and those applied widget characterizations will be applied to that widget instance across each view of the master unless it was overridden in a particular view. For example, with reference to FIGS. 11E-F, the text of the button widget of the second instance 1106*b* of the first master 1104 was changed from "BUTTON" to "OKAY". As shown, the text of the second instance 1106*b* of the first master 1104 is displayed as "OKAY" in instance views M1.V1 and M1.V2 of the second instance 1106*b*. However, the text of the button widget of the first instance 1106*a* of the first master 1104 remains as "BUTTON" unless it too is changed. The text (widget characteristic) of the first master 1104 has, thus, been overridden in the second instance 1106*b*, but not in the original of the first master 1104, so this change is not incorporated into the first master 1104 itself or propagated to other instances (e.g., the first instance 1106*a*) of the first master 1104.

The inheritance structure for multi-view masters is not limited to a single parent-child relationship of views. Rather, a master can have multiple parent views, each parent view of the master can have multiple children views of the master, and each of the children views of the master can be a parent view of multiple children views of the master. Thus, multiple design patterns can be implemented for a master while still allowing for non-overridden changes to propagate from the master to instances of the master.

Figure 11G:
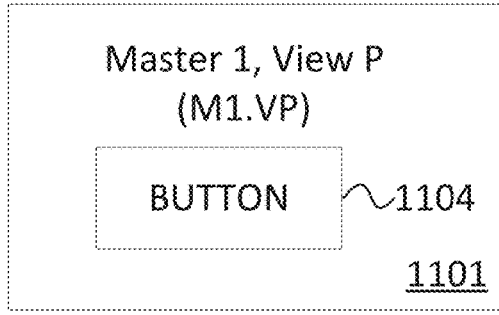
Figure 11H:
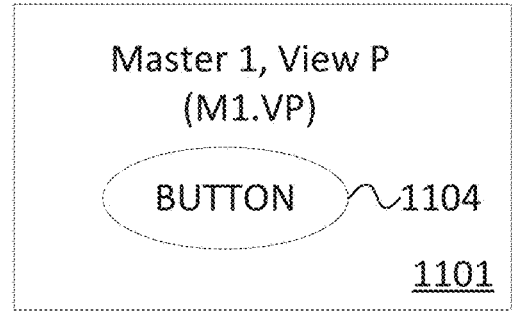
Figure 11I:
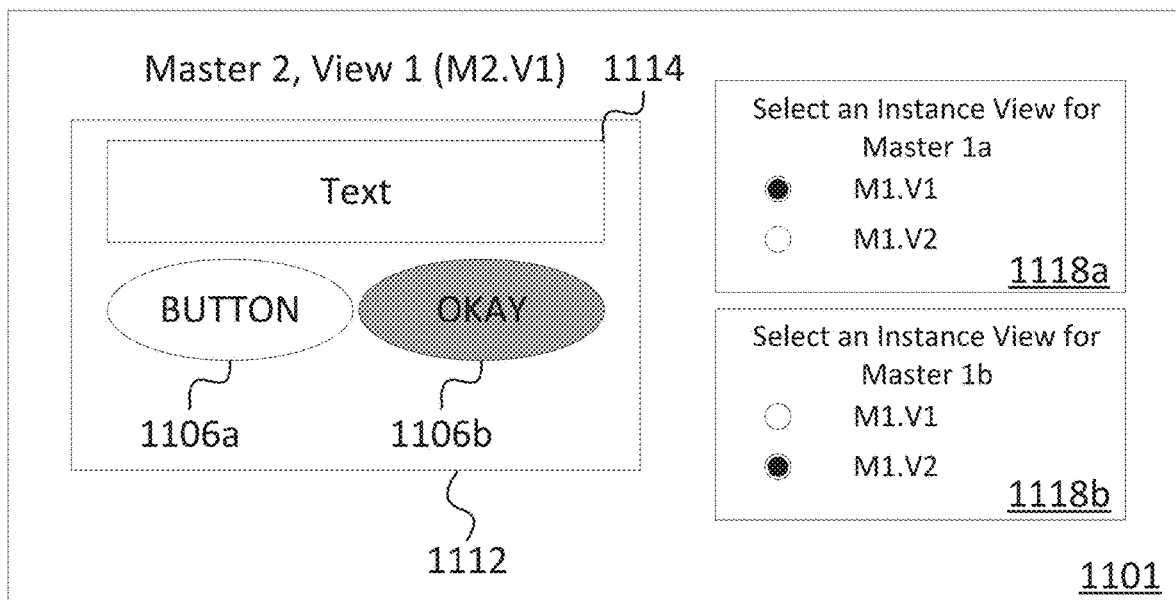

FIG. 11G shows a simplified example of a parent view (View P) of the first master 1104 (Master 1) in the design window 1101. View P, in this example, is the parent view of descendent views, View 1 and View 2, of the first master 1104 described with reference to FIGS. 11A-B. In FIG. 11H, a third widget characterization for the button widget of the first master 1104 (Master 1) is accepted in the parent view, View P, of the first master 1104. In the example shown, the third widget characterization is an oval button shape. The third widget characterization is a widget characterization that was not previously overridden in the first widget characterization in View 1 of the first master 1104 or View 2 of the first master 1104. Thus, as shown in FIG. 11I, the third widget characterization of the button widget propagates to the widget button of the first instance 1106*a* (introduced in FIG. 11E) of the first master 1104 and to the button widget of the second instance 1106*b* of the first master 1104.

Figure 11J:
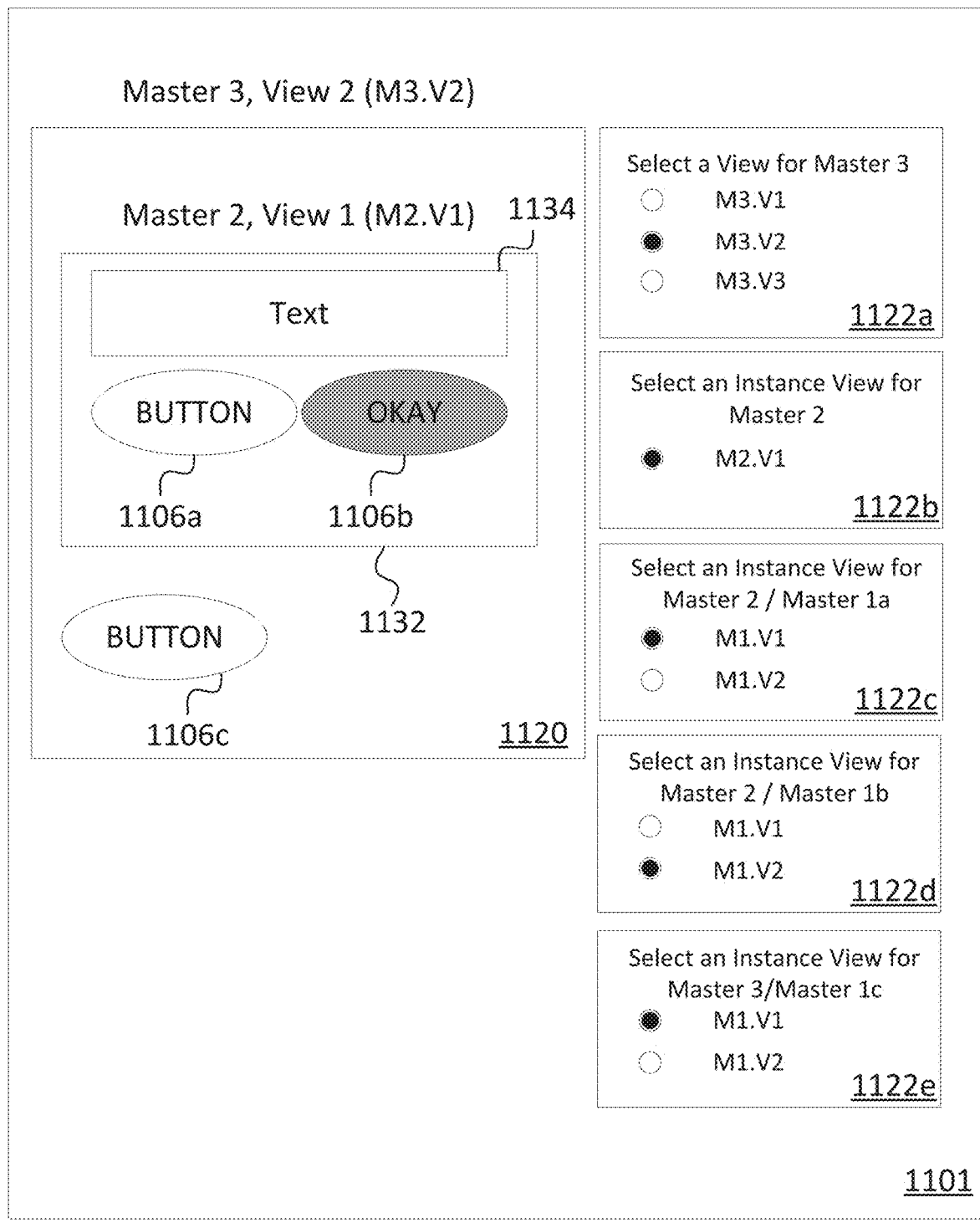

Although only two masters (the first master 1104 and the second master 1112) are shown in FIGS. 11C-F, multiple instances of masters may be placed within a containing master. Similarly, multiple masters may be placed within one another. That is, a first master may contain a second master, the second master may contain a third master, the third master may contain a fourth and fifth master, and so on. A view of each instance of each master may be independently selected for each of those masters, independently of the view of its containing master. A simplified example of such an embodiment is shown in FIG. 11J. The design window 1101 of the design environment includes a third master 1120 (Master 3), an instance 1132 of the second master 1112, and instances 1106*a*-*c* of the first master 1104. The instances 1106*a*-*b* of the first master 1104 are contained within the instance 1132 of the second master 1112, and the third instance 1106*c* of the first master 1104 is contained within the third master 1120. The instance 1132 of the second master also includes an instance 1134 of the textbox widget 1114 of the second master 1112. As shown in example interfaces 1122*a*-*e*, the respective view of the third master 1120, the instance 1132 of the second master 1112, and the instances 1106*a*-*c* of the first master 1104 can be independently selected. The example interface 1122*a* shows that a second view (View 2) for the third master 1120 (Master 3) has been selected. This master/view combination is designated as M3.V2. The example interface 1122*b* shows that the first view (View 1) of the second master 1112 (Master 2) has been selected for the instance 1132 of the second master 1112. This master/view combination is designated as M2.V1. The example interface 1122*c* shows that the first view (View 1) of the first master 1104 (Master 1) has been selected for the first instance 1106*a* of the first master 1104. This master view combination is designated as M1.V1. The example interface 1122*d* shows that the second view (View 2) of the first master 1104 (Master 1) has been selected for the second instance 1106*b* of the first master 1104. This master view combination is designated as M1.V2. The example interface 1122*e* shows that the first view (View 1) of the first master 1104 (Master 1) has been selected for the third instance 1106*c* of the first master 1104. This master view combination is designated as M1.V1.

In some embodiments, the particular set of instance views which have been selected for master instances contained within a master, or an instance of that master, is associated with a view of that master. For example, in FIG. 11J, the set of view selections (including: M2.V1 for the instance 1132 of the second master 1112; M1.V1 for the first instance 1106*a* of the first master 1104; M1.V2 for the second instance 1106*b* of the first master 1104; and M1.V1 for the third instance 1106*c* of the first master 1104) is associated with View 2 of the third master 1120 (M3.V2). A different view of the third master could be associated with a different set of view selections. For example, the set of view selections (including: M2.V1 for the instance 1132 of the second master 1112; M1.V2 for the first instance 1106*a* of the first master 1104; M1.V1 for the second instance 1106*b* of the first master 1104; and M1.V2 for the third instance 1106*c* of the first master 1104) could be associated with View 1 of the third master 1120 (M3.V1).

After one or more views have been specified for a master (which can include a parent view), an instance of the master can be added to a design in the design environment. After an instance of a master has been added to a design, views for each instance of each master can advantageously still be selected within the design via an interface for receiving a instance view selection, and/or via a rule that determines a instance view selection.

Figure 12:
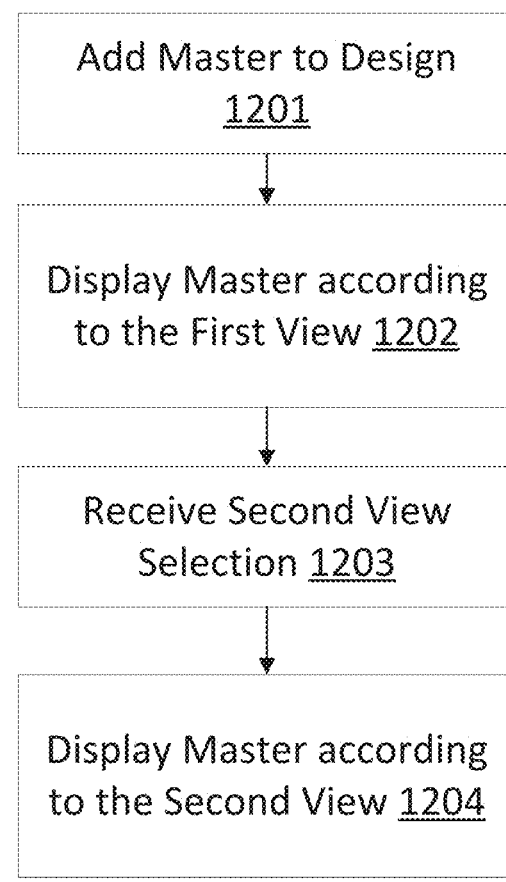
FIG. 12 illustrates a flow chart of a method for specifying a design using multi-view masters, in accordance with some embodiments.

A simplified method 1200 for specifying a design using multi-view masters can be described with reference FIG. 12. The particular steps, order of steps, and combination of steps are shown for illustrative and explanatory purposes only. Other embodiments can implement different particular steps, orders of steps, and combinations of steps to achieve similar functions or results. In some example embodiments, the steps of method 1200 follow after all, or a portion, of the steps of method 1000. In step 1201, an instance of a master (e.g., of method 1000) is added to a design (e.g., a page). In step 1202, the instance of the master is displayed within the design according to a first view (e.g., of method 1000). In step 1203, an input selecting a second view (e.g., of method 1000) is accepted or received, e.g., from a designer or based on a rule. In step 1204, the instance of the master is rendered in the design according to the second view.

Figure 13A:
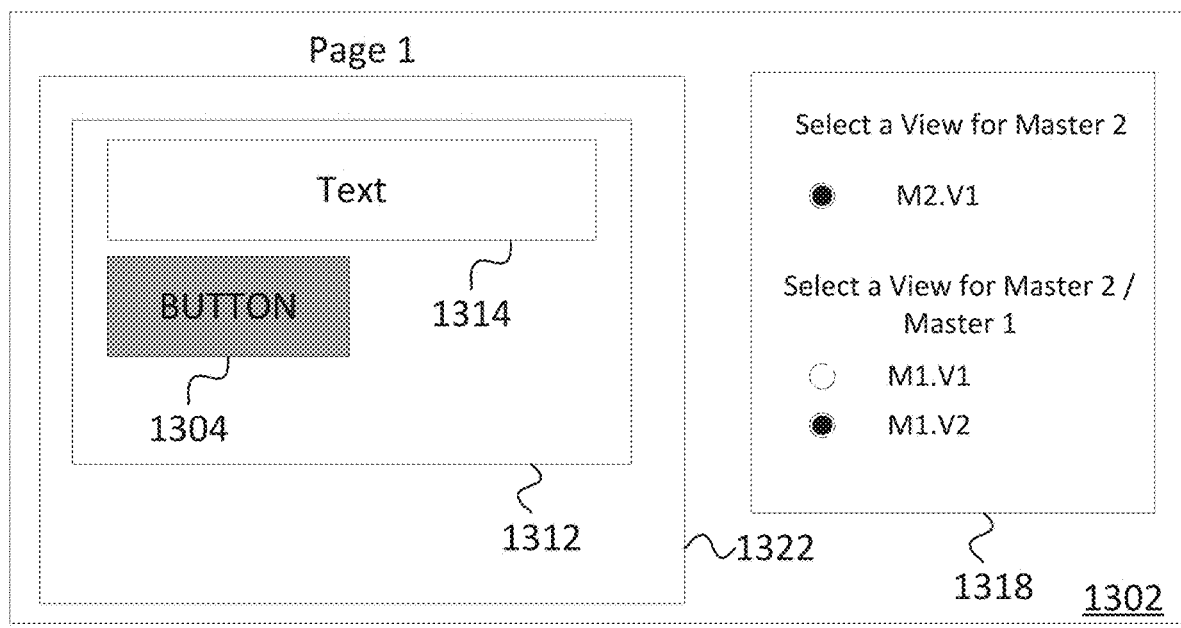
FIGS. 13A-B illustrate different versions of designs using multi-view masters, in accordance with some embodiments.

An example of how method 1200 can improve the design process for responsive designs can be described with reference to FIGS. 13A-B. FIG. 13A shows an instance 1312 of the second master 1112 (of FIG. 11C) displayed in a page 1322 (Page 1) as presented in a design window 1302 of the design environment. The instance 1312 of the second master 1112 includes an instance 1304 of the first master 1104 (of FIG. 11C) and an instance 1314 of the textbox widget 1114. A simplified example of an interface 1318 of the design environment enables a designer to i) select an instance view for the instance 1312 of the second master 1112, and ii) to select an instance view for the instance 1304 of the first master 1104, independently of the view selected for the instance 1312 of the second master 1112. In the example shown, the instance view M2.V1 is selected for the instance 1312 of the second master 1112, and the instance view M1.V2 is selected for the instance 1304 of the first master 1104. In accordance with the instance view M1.V2, the button widget of the instance 1304 of the first master 1104 is displayed with a grey background. In some embodiments, the instance view is selected by the designer when placing an instance of a master into a containing context. In other embodiments, the instance view is selected by a parameter of the design environment when an instance of a master is placed into a containing context (e.g., based on a user preference setting, or a system default setting). In still other embodiments, the instance view is selected based on one or more rules associated with the master. For example, a rule could specify that if a background color of a containing context of an instance of the master is black, an instance view of the master could be automatically selected such that widgets within the instance of the master are displayed with white background color fills. Another rule could specify that if a dimension of a containing context of an instance of the master is less than 300 pixels wide, an instance view of the master could be automatically selected such that widgets within the instance of the master are displayed at first absolute positions. Another rule could specify that if a dimension of a containing context of an instance of the master is less than 1200 pixels wide, an instance view of the master could be automatically selected such that widgets within the instance of the master are displayed at second absolute positions.

Figure 13B:
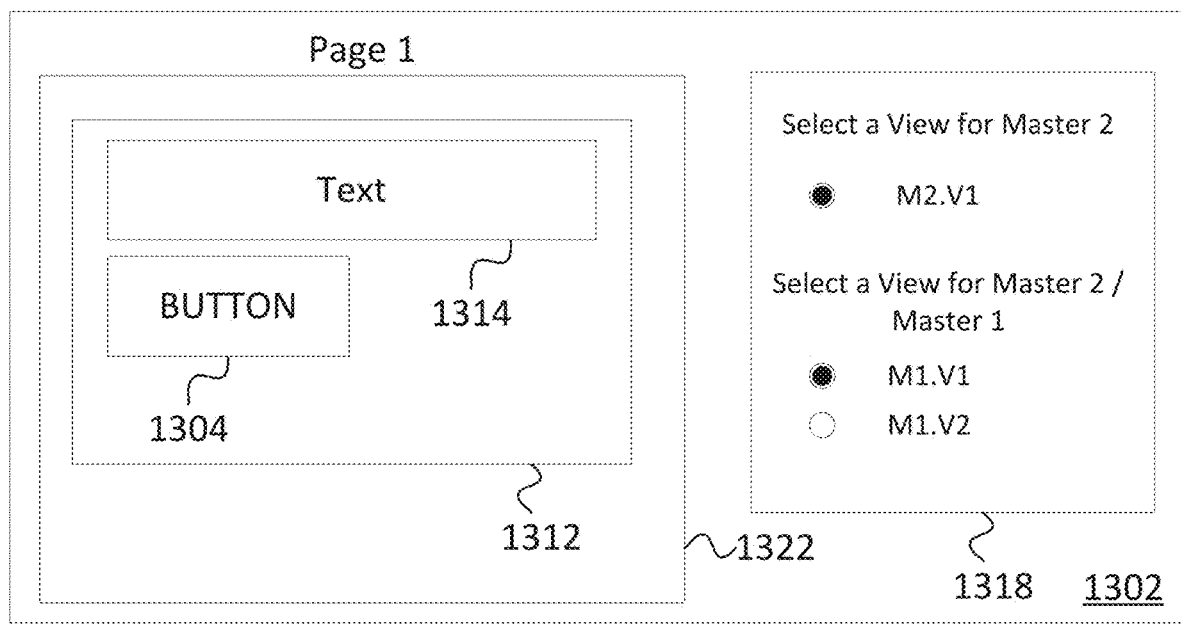

FIG. 13B shows an example where the instance view M1.V1 for the first master 1104 is instead selected for the instance 1304 of the first master 1104. In accordance with View 1 of the first master 1104, the button widget of the instance 1304 of the first master 1104 is displayed with a white background.

In some embodiments, a similar interface to the interface 1318 is used within a prototype environment to receive an instance view selection for the instance 1304 of the first master 1104 and to receive an instance view selection for the instance 1312 of the second master 1112 when the page 1322 is rendered as a prototype in the prototype environment. A prototype of a design is a realization of the design in a format or encoding that can be displayed outside of the design environment. For example, a webpage that is encoded to be displayed and to behave in accordance to the design is a prototype of the design. Or, a mobile or desktop application that is encoded to be displayed and to behave in accordance to the design is another example of a prototype of the design. A prototype of the design is rendered in a prototype environment. Rendering a prototype in a prototype environment displays the prototype in accordance to the design which was used to generate the prototype, and the rendered prototype behaves within the prototype environment in accordance with the behaviors specified in the design. A prototype environment can be an external player, such as a web browser, a mobile application for displaying mobile application prototypes, a desktop application for displaying mobile or desktop application prototypes, an operating system for displaying prototypes that are implemented as stand-alone executable applications, or another environment that is appropriate for displaying prototypes. In some embodiments, the instance view of an instance of a master within a prototype is selected by a user of the prototype, e.g., via an input interface of the prototype, or of the prototype environment. In other embodiments, the instance view of an instance of a master within a prototype is selected based on one or more rules associated with the master, the rules being similar to those previously described. Such rules could also include instance view selections based on a display screen size of the prototype environment, a manufacture setting of the prototype environment, a network connectivity status of the prototype environment, a display screen orientation of the prototype environment, an ambient light measurement by the prototype environment (e.g., to select a view associated with a high-contrast design), a backlight setting of the prototype environment, an accessibility mode of the prototype environment, a detected motion or velocity of the prototype environment (e.g., to select a simplified design for a user that is driving a vehicle), a 3-dimensional position (e.g., terrestrial coordinates) of the prototype environment, a language setting of the prototype environment, a user preference of a user of the prototype environment, an operation mode of the prototype environment (e.g., a first view associated with in-call behavior of a smart phone, a second view associated with an idle behavior of a smart phone), a usage license status associated with a user of the prototype environment, user data or demographics of a user of the prototype environment (e.g., to select a simplified or restricted view for a young user), a permission level granted to a user of the prototype environment (e.g., a first view for managers of a group, a second view for employees of a group), a group affinity of a user of the prototype environment (e.g., a first view for participants of a first focus group, a second view for participants of a second focus group), a determined operating system in which the prototype is executed (e.g., a first view associated with an Android operating system, a second view associated with a Windows operating system), or other rules.

Enabling the user to select a view for a master independently of the view selected for a containing context such as a page, widget, container, or other master, provides another degree of freedom to the designer to aide in maintaining design flexibility while maintaining enough interrelationships in the design to facilitate easy manipulation of the design as the design process continues.

Design Environment: Multiple Dimension Version Editing

Example embodiments described herein facilitate the specification of a responsive design across dimension versions and various pages of a multi-page design. In particular, embodiments in which a single widget is rendered across various dimension versions allow edits made to that specific widget to propagate quickly through all dimension versions of the design because it is the same widget in each version. However, dimension versions of a responsive design are necessarily distinct which means that the states of widgets in each dimension version must be distinguishable. Therefore, some example embodiments described below also enable a user to quickly specify whether a characterization will modify a widget in a limited set of dimension versions or if it will modify the widget globally across all dimension versions.

A method 1400 of specifying a design using different editing modes can be described with reference to FIG. 14. Method 1400 begins with a step 1401 of selecting an editing mode. Method 1400 can be used in combination with any of the methods described previously. In some embodiments, the editing modes that can be selected include a single-dimension editing mode, an all-dimension editing mode, and a multi-dimension editing mode. Step 1401 can also be preceded by step 1402 in which a subset of dimension versions are grouped to define the dimension versions that will be edited in the multi-dimension editing mode. In step 1401, a user selects one of the editing modes described previously. The method then proceeds in different branches depending upon the selection made in this step.

The user can select an editing mode in step 1402 in various ways. In some embodiments, the default mode will be a single-dimension editing mode in which widgets will only receive specifications for the dimension version of the design that is currently being viewed or that is currently selected. In these embodiments, a user may be required to select an all-dimension or multi-dimension editing mode from a pull down menu before that editing mode will be entered. An interface for allowing the selection of an editing mode in step 1401 could be triggered automatically the first time a specification is added to a widget after a new dimension specification has been added to the design. For example, if a new dimension is added, the next time a user tries to specify a characteristic for a widget a pop up window could ask the user to specify whether or not the edit should apply globally, only to the current dimension version, or if the current dimension version should be added to a predefined sub set of dimension versions that are edited in the multi-dimension editing version.

Various measures could be provided to prevent unwanted edits being added to a design. A distinct flag could be included in the graphical design environment to inform a user what the current editing mode is to prevent the user from applying changes to other dimension versions without seeing those changes being made. For example, the text GLOBAL could appear in colored text in the gutter of the window used for the graphical design environment whenever the tool was in all-dimension editing mode. This would prevent users from mistakenly editing dimension versions they did not intend to modify. Likewise, the gallery view described previously could be employed to prevent unwanted changes by opening and closing dimension versions automatically when they are being edited. For example, the all-dimension editing mode would open a window for each of the dimension versions that were then known to the design environment. The gallery view could also be terminated automatically when the user returns to the single-dimension editing mode. Also, warning prompts could be displayed on the screen when a sub-set of characteristics are being modified in an all or multiple-dimension editing mode particularly when the characteristics being edited are those that are not usually specified differently in various dimension versions.

In some embodiments, the single, multiple, and all dimension editing modes are specified in a highly customizable way by a user operating on a list of dimension specifications such as those found in dimension specification interface 204. In some embodiments, a user can select between all available single-dimension editing modes by selecting different dimension specifications in dimension specification interface 204. For example, by selecting the Default button, the user will enter a single dimension editing mode directed towards editing the default dimension version. Likewise, by selecting the Smart Phone button, the user will enter a single dimension editing mode directed towards editing the Smart Phone dimension version. In addition, the user may select additional buttons in the dimension specification interface 204 to select between various multi-dimension editing modes, and may select all of the buttons in the dimension specification interface to select an all-dimension editing mode. Multiple buttons can be selected by holding down a key such as the SHIFT key and clicking on various buttons. Furthermore, the dimension specification interface could include a list of dimension versions and a series of check boxes next to each label by which multiple versions could be selected for editing by selecting the various check boxes.

If a user selects the single-dimension editing mode, the method will continue with step 1403 in which a user is able to specify characteristics of the widget that will only apply to the widget when it is rendered in the dimension specification that the user is currently editing and/or viewing. Method 1400 includes an optional step 1404 that disables certain interface controls in this mode. For example, a name of the widget might not be capable of being changed in this mode because the name is used to recognize the widget regardless of which dimension version the widget is being viewed at or edited in. If a user selects the all-dimension or multi-dimension editing mode, the method will continue with step 1405 in which a user is able to specify characteristics of the selected widget that will apply to the widget when it is rendered in multiple dimension versions. The multiple dimension versions to in which the specification will apply depends on which editing mode the user has selected and which dimension versions are included in the multi-dimension editing mode. Regardless of the editing mode selected, the method concludes with step 1406 in which the specifications are applied to the widget for the applicable dimension versions.

The manner in which the specifications are applied to the widget in step 1406 can be implemented in various ways. As described previously, specific property values that are shared between various dimension versions can be stored once in the model of the design. This shared value could be considered a "base" value for the property. If the specification applied in step 1406 was being applied to a limited set of dimension versions, the value could be stored as an override over the base value and be linked to that limited set of dimension versions. Likewise, an all dimension specification could be applied in step 1406 by changing the base value and clearing all overrides for the property stored in the model. In embodiments in which the property values for the widget in each dimension version are stored separately, the application of the specification in step 1406 would follow a more straightforward approach of changing the property values for the dimension versions that were being edited.

Method 1400 could also include optional step 1407 as an additional measure of preventing unwanted edits from propagating through the design. In step 1407, a user is able to confirm that a specific edit or set of edits should be propagated through to multiple dimension versions. The confirmation could be provided in response to a prompt that is displayed when the user finishes a single edit, when the user closes an editing session, when the user selects a different editing mode, or when the user selects a different dimension version. In particular, the confirmation could be provided on a dimension version by dimension version basis and would require the user to confirm all pending edits that propagated through to the dimension version since the last time the graphical design environment rendered that particular dimension version for the user. The prompt could provide a summary of the edits that are being approved and could allow the user to select specific edits to approve or deny from being implemented in a particular dimension version. The graphical design environment could also display a ghost rendering of the dimension version for which approval of edits is sought so that a user could see a preview of how the dimension version would look if approval were provided.

Editing multiple dimension versions could also be aided through the use of an inheritance structure. An inheritance structure defines a relationship between multiple dimension versions by which edits in certain dimension versions are automatically propagated to other dimension versions. The most basic example of an inheritance structure would be defined using two dimension versions wherein the two versions had a parent-child relationship. Once the relationship was established, changes made to the parent dimension version would automatically propagate to the child dimension version, but changes made to the child dimension version would not propagate to the parent dimension version.

The structure could be implemented by defining an inheritance property for each dimension version in the design. The structure would therefore be comprised of an amalgamation of all the inheritance property values in the design. A two dimension inheritance structure would provide efficiency benefits to the user, and such efficiency benefits would increase as the number of dimension versions that are related by the inheritance structure increased. The inheritance structure could include multiple chains of inheritance and would not be limited to a hierarchical structure having a single hierarch. Instead, the inheritance structure could comprise a child dimension version that is related to two separate parent dimension versions such that changes made to either parent would propagate to that single child. Conversely, a parent dimension version could have multiple child dimension versions.

The changes could propagate through the inheritance structure in various ways. For example, a widget specification that altered a property of a widget in one dimension version could be stored in a memory location that would be accessed by all of that dimension version's children. As another example, the same widget specification could be copied and stored in multiple memory locations that are accessed independently by the child dimension versions. In the example where the change is copied to multiple memory locations, the change could propagate through instantaneously or it could be queued up for propagation in response to a prompt similar to the approach described with reference to step 1407 in FIG. 14. In these situations, the change to the property would be stored in one memory location to be accessed by the dimension version in which the change was made, and it would then be copied to the other memory locations in response to the receipt of a propagation command from the user.

The inheritance structure can be defined in numerous ways. For example, the inheritance structure could be automatically created as additional dimension versions are added to a design. Such an inheritance structure could follow a predetermined pattern such as one that made every smaller dimension version a child of the next largest dimension version and vice versa. Generally, the original dimension version in a design before any other dimension versions have been created or edited would serve as the base or default dimension version for the inheritance structure and it would serve as the parent for all additional dimension versions added to the design. The inheritance structure could also be left undefined until a user affirmatively formed the structure. In situations where multiple dimension versions are provided to the user as soon as a new design is opened, the user could select a dimension version to serve as the base version for the design. The user could also be provided with the ability to create any desired inheritance structure between the various dimension versions in the design and continually configure the inheritance structure while working on the design. Depending upon how the inheritance structure is defined, it could allow a user to utilize a global editing mode by relating all dimension versions back to a single hierarch in the structure. This hierarch would not be limited to the largest or smallest dimension version in the design because, as mentioned previously, the user could define any relationship desired such that the base dimension version could be an average size dimension version and both larger and smaller dimension versions would inherit edits made to the mid-sized dimension version. Likewise, the inheritance structure could allow a user to utilize a subgroup editing mode by editing the parent of one chain of child dimension versions in a hierarchy comprising multiple chains.

A computer-implemented method 1500 for allowing a user to specify a responsive web page design using an inheritance specification that is in accordance with specific embodiments described above is illustrated in FIG. 15. Method 1500 begins with step 1501 in which a rendering of a first dimension of a web page is generated for a user. The rendering could be displayed in a window such as window 201 in FIG. 2. The rendering can include an interactive widget. Method 1500 continues with step 1502 in which an inheritance specification is received from the user. The inheritance specification defines an inheritance structure of the design. For example, the inheritance structure defined by the inheritance specification could define a second dimension version as a child of the first dimension version. The defined inheritance structure could be an initial inheritance structure specified for the design or it could override a default inheritance structure that was in place before any input was received from the user to affirmatively define an inheritance structure. Method 1500 continues with step 1503 in which a widget property specification is received from the user while the user is editing the first dimension version. In step 1503, the widget property specification could be received while the user is editing the first dimension version by entering a value for a first property of the interactive widget in window 201 in FIG. 2 or widget interface 202. Method 1500 continues with step 1504 in which the specification for the first property is stored for both the first and second dimension versions while the user is editing the first dimension version. Step 1504 could be conducted automatically as described above such that the first property would be modified simultaneously in the second dimension version while the user is editing the first dimension version. This simultaneous modification could be carried out using a data structure in which the same location in memory was accessed for the property of the widget in both the first and second dimension versions.

Figure 16:
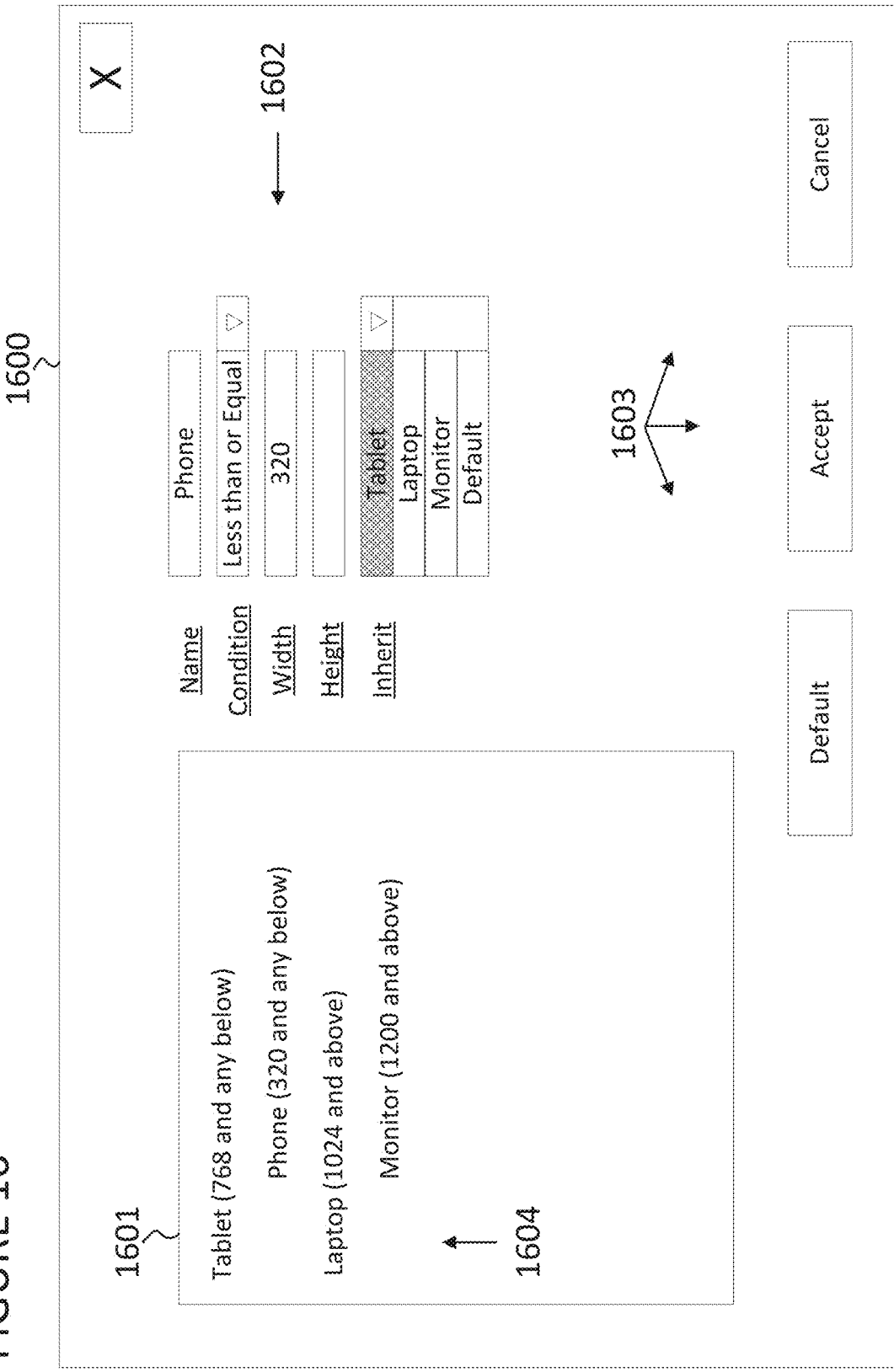
FIG. 16 illustrates a graphical user interface for specifying dimension versions and an inheritance structure for an interactive graphical design, in accordance with some embodiments.

Graphical user interfaces that would allow a user to specify an inheritance structure can be described with reference to inheritance specification interface 1600 in FIG. 16. As discussed above with reference to FIG. 2, the dimension specifications in dimension specification interface 204 can be entered by a user. Aside from providing an interface for inputting an inheritance structure, inheritance specification interface 1600 also provides an example of how those dimension specifications can be entered. Inheritance specification interface 1600 could be accessed through a toolbar or other link from graphical design environment 200. Inheritance specification interface 1600 allows a user to define an inheritance structure while dimension specifications are entered and dimension versions are created. Once the dimension versions are created, the design environment could provide an interface to receive an input from a user to also return to inheritance specification interface 1600 to modify the inheritance structure of the design as desired.

Inheritance specification interface 1600 comprises inheritance specification display window 1601, inheritance specification input interface 1602, and top level specification buttons 1603. The specification buttons allow a user to accept a specified inheritance structure, cancel the specifications made in the current session, or revert the inheritance structure to a default configuration. Display window 1601 graphically displays a description of the current inheritance structure to the user. Input interface 1602 allows a user to input specifications for the inheritance structure.

Display window 1601 could display the current inheritance structure in numerous different ways. For example, the structure could be shown as a hierarchical web of connections or a list grouped by inheritance branches. As illustrated, display window 1601 illustrates the inheritance structure using a list grouped by inheritance branches with indentations to indicate child-parent relationships. Indentations 1604 provide a graphical representation of the parent-child relationships that comprise the current inheritance structure. In the specific illustration of FIG. 16, the Phone dimension version is a child of the Tablet dimension version; and the Monitor dimension version is a child of the Laptop dimension version. Display window 1601 could also display the relationship of the dimension versions to their dimension specifications. In the specific illustration of FIG. 16, for example, the Phone dimension version is rendered in a player when a rendering space for the design is less than a width of 320 pixels.

Input interface 1602 allows a user to specify a new dimension version or edit a current dimension version. In the specific illustration of FIG. 16, a user is editing the Phone dimension version. The particular dimension version to be edited in input interface 1602 could be identified by selecting the name of the dimension version in display window 1601 or by entering the name of the dimension version in input interface 1602. When a new dimension version is added, a user will need to input the associated dimension specification by entering dimensions and a user may also need to enter a condition associating the dimension specification with the dimension version. As illustrated, the Phone dimension version is specified to be rendered whenever the rendering space afforded the design is less than or equal to 320 pixels. The units for the dimension entry could also be in physical distance units. The Condition property is shown as being specified in a pull down menu, but the content of that menu is not shown. In keeping with embodiments described above, the condition could be: less than, greater than, less than or equal to, greater than or equal to, or equal to. The condition chosen will determine whether the dimension specification serves as a trigger point or a target dimension. The illustration also shows the pull down window for the Inherit property of the Phone dimension version. As illustrated, a user can select any of the defined dimension versions to set as the dimension version from which the Phone dimension version will inherit modifications. When other dimension versions are added to the design, the Inherit pull down menu could reflect the presence of the additional versions. The conditions and dimension versions identified in the input interface could also be specified without the use of pull down menus. The design environment could provide an interface to receive an input from a user to textually enter the symbol ">" to specify the condition for inheritance, or the word "Tablet" to specify the dimension version in inheritance specification interface 1600.

Referring back to FIG. 15, step 1502 could be conducted using inheritance structure interface 1600. In accordance with such an approach, step 1502 could comprise generating inheritance specification interface 1600, inheritance specification display window 1601, and inheritance specification input interface 1602; and allowing a user to confirm a specified inheritance structure by selecting the Accept button from among buttons 1603. This step could be repeated numerous times as additional dimension versions were added to a design.

Figure 17:
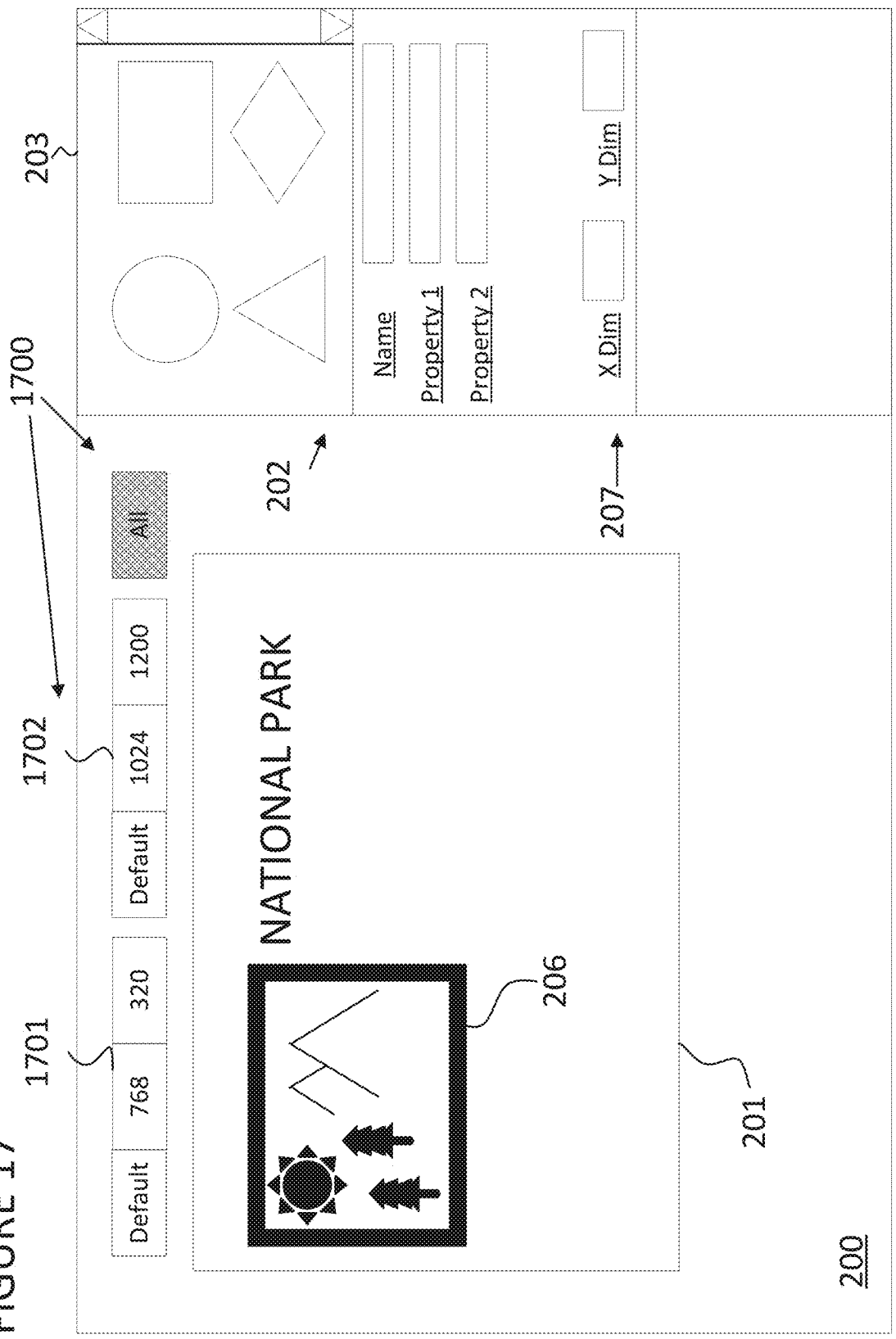
FIG. 17 illustrates a graphical user interface for a graphic design tool with a dimension version and inheritance structure toolbar, in accordance with some embodiments.

The inheritance structure could also be displayed to the user in the form of a tool bar in graphical design environment 200. In this situation, method 1500 would also include the step of generating an inheritance specification tool bar to be displayed with the rendering. Examples of this kind of tool bar can be displayed with reference to FIG. 17 which illustrates toolbar 1700 above window 201. Toolbar 1700 allows users to select between different editing modes by selecting the buttons labeled with different dimension specifications. For example, if a user selected button "1200" the dimension version associated with dimension specification "1200" would be displayed in window 201 and the user could edit that dimension version. The user could also select the "All" button to enter a global editing mode in which an edit made to the current dimension version would propagate to all of the other dimension versions in the design. As mentioned previously, the user could also potentially select a sub-set of the dimension versions by, perhaps, selecting multiple buttons while pressing the "SHIFT" key, at which point they would be editing all of the selected version of the design, but not the other dimension versions. The toolbar can also display the inheritance structure of the design as the different dimension specifications can be arranged to symbolize the inheritance structure. For example, toolbar 1700 as illustrated is arranged into groups 1701 and 1702 that each display separate inheritance structure branches running from left to right. This graphical arrangement describes the inheritance structure of the design as an edit made to Default will be inherited by all of the other dimension versions, an edit made to 768 will be inherited by 320 but not 1600, and an edit made to 1600 or 320 will not be inherited by any dimension versions. Toolbar 1700 therefore gives the user a convenient way to skip between dimension versions as well as a convenient way to keep track of how the dimension structure is currently specified.

Method 1500 can be modified such that a user can specify certain properties of a widget that are not modified through inheritance. The division of properties into categories that propagate in different ways can be referred to as specifying the inheritance characterization of a design. The inheritance characterization of a design may be set by default. For example, the location, size and style of a widget could be affected by inheritance while the interactivity of a widget and the text content are not. As another example, a change made to the text style of a widget might change according to the inheritance structure of the design, but a change made to the text content of a widget in any dimension version might propagate through to the widget as it appears in all other dimension versions regardless of the inheritance structure. As another example, the existence property of a widget might not propagate automatically through inheritance, but the absolute position of the widget in the design could propagate automatically. The manner in which different properties propagate through inheritance might also differ from one widget property to another. For example, a color of a widget might propagate automatically while a size of a widget might be inherited and require a confirmatory response from a user before the change propagated to another widget. The inheritance characteristic of a design might also be configurable by a user on a categorical property by property basis. For example, a user might be able to set a text content property as a property that is automatically propagated through inheritance while a color property is not. A user may also configure the inheritance characteristic on a widget by widget basis such that the manner in which changes made to a particular widget propagated by inheritance could be configured by the user.

The inheritance characterization can be specified in numerous ways. For example, a user may be given a list of properties for a particular widget or a particular design with a set of checkboxes that the user can mark to determine if that property will propagate through inheritance or not. Some of the check boxes may be greyed out because the design environment might prevent certain properties from being inherited. As another example, a user may indirectly specify an inheritance characterization by editing a property in a child dimension version. In these embodiments, edits made to a child dimension version serve to remove that property of that particular widget from being modified later on through inheritance. The set of properties to which this manner of specifying an inheritance characterization applies could be limited. For example, the color of a widget could be characterized as a property that should not be inherited after a change to a child dimension version has been made while the absolute position of a widget can still be modified through inheritance. The edits made to a child dimension version in these embodiments can be referred to as an override widget property specification, because it overrides any later attempts to change the property via inheritance.

Figure 18:
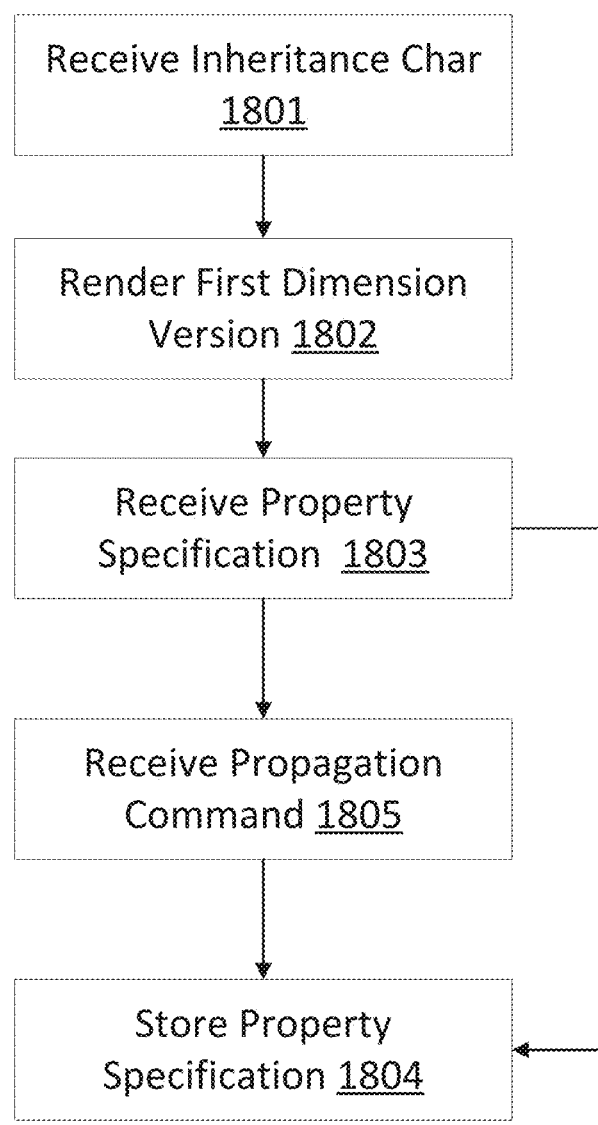
FIG. 18 illustrates a flow chart of a method for specifying and applying an inheritance structure and inheritance characterization to an interactive graphical design, in accordance with some embodiments.

A computer-implemented method 1800 for allowing a user to specify an inheritance characteristic for an interactive graphical design can be described with reference to FIG. 18. In step 1801, an inheritance characterization specification is received from a user. The inheritance characterization characterizes certain properties into properties that are affected by inheritance and those that are not affected by inheritance. As stated previously, the specification can be received via a user interface that is specifically designed to receive the characterization from the user or the specification can be received indirectly through the receipt of an override property specification with a user affirmatively specifying a property or set of properties in a child dimension version. The user interface used in the first approach could be referred to as an inheritance characterization specification interface. The second approach to characterizing the subset of properties is not separately illustrated in FIG. 18 since it should be considered a different approach to step 1801 and not an additional or alternative step. In step 1802, a first dimension version of the interactive graphical design is rendered. The first dimension version has a parent-child relationship with a second dimension version according to an inheritance structure of the design. In step 1803, a widget property specification is received from the user while the user is editing the first dimension version. In step 1804, the widget property specification that was received in step 1803 is stored for the first dimension version and second dimension version in accordance with the inheritance structure and inheritance characterization. If the inheritance characterization characterized all of the widget properties that were altered in step 1803 as properties that were exempt from inheritance, then no changes would propagate to the second dimension version in step 1804. However, if any of the widget properties that were altered in step 1803 were not exempt from propagating, then those changes would be applied to the widget in the second dimension version in step 1804.

Method 1800 can also include alternative step 1805. Step 1804 can be conducted by storing the property specification received in step 1803 at a single address in memory that is accessed by multiple dimension versions. However, the property can also be copied to multiple locations in memory to be accessed by multiple dimension versions. In this situation, method 1800 could include alternative step 1805 in which a propagation command is received from the user to copy the value for the property specification into alternative locations for each of the multiple dimension versions. This command can be received directly via any of the prompts described above or indirectly through an alternative action that is used to indicate changes should be propagated through the inheritance structure such as opening a different dimension version.

Management of the existence property is particularly important for situations where a design is being edited across multiple dimension versions. As mentioned in the first section above, a separate interface besides the design rendering window will sometimes be needed to manage this property because there will not be a visual representation of the widget in the design from which to initiate edits to the widget's properties. Furthermore, having the deletion of a widget propagate through a design automatically can be problematic because a designer might not notice that something is amiss when switching to a different dimension version because there will not be a visual cue to indicate that the edit was erroneously removed such as when a color change to a widget or text size property is readily apparent when the user switches to a different dimension version. In addition, the presence of multiple widgets in a large dimension version can leave a design unacceptably cluttered when a user first switches to a much smaller dimension version unless some kind of cross-version management system is applied to the existence property. For example, a desktop dimension version may include 30 equally spaced widgets that would flood the screen of a mobile phone dimension version and make selecting individual widgets difficult when switching to the smaller dimension version.

The existence property can be utilized to facilitate the specification of designs having multiple dimension versions. The existence property can be treated by the inheritance structure of the design in the same way as other properties discussed above. However, certain benefits accrue to approaches in which the existence property is treated differently than other properties for purposes of inheritance. For example, placing a widget in a dimension version can result in all of the children of the dimension version receiving the placed characterization for that widget while all of the parents of the dimension version receive an unplaced characterization for the widget. In such embodiments, the existence property is treated slightly differently for purposes of the inheritance characterization because making a modification to a widget property in a child dimension version has an effect on the widget property in the parent dimension version. As another example, when a widget is added to a parent dimension version—and the existence property for the widget for that dimension version is set to a placed value—the existence property for the widget in a child dimension version can remain unplaced. In other words, the existence property will be characterized as one that is not affected by inheritance in the inheritance characterization. A designer will instead have to affirmatively alter the property in all dimension versions to which the widget needs to be added. The benefit of this approach would be that placing a large number of widgets in a large dimension version would not automatically over clutter a smaller dimension version. The same approach could be applied to a change in the widget's existence property from a placed state to an unplaced state in that the change would not propagate in accordance with the inheritance structure and the widget would need to be removed in all dimension versions manually.

Deleting a widget in one dimension version could be treated as an alteration of the widget's existence property rather than a removal of the widget from the entire design. In these situations, the alteration of the widget's existence property could be treated in accordance with the standard rules in the design for how changes propagate according to the inheritance structure for the design. In other words, the widget would transfer from a placed state to an unplaced state in the dimension version that was being edited, and all of its children, but the deletion would not alter the existence state of the widget in its parents.

Figure 19:
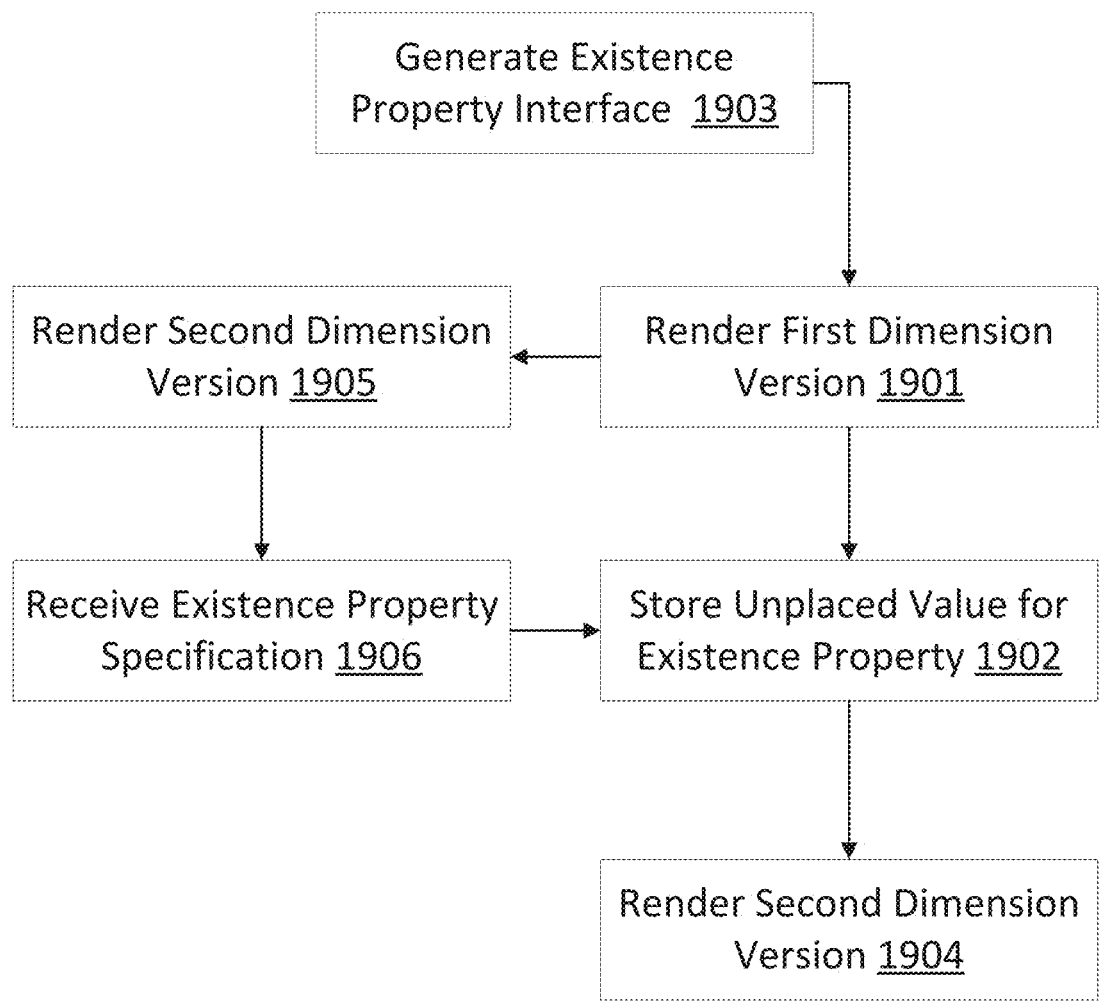
FIG. 19 illustrates a flow chart of a method for specifying an interactive graphical design with widgets having an existence property, in accordance with some embodiments.

A method 1900 for allowing a user to specify an interactive graphical design and manage an existence property across multiple dimension versions can be described with reference to FIG. 19. Method 1900 begins with step 1901 in which a first dimension version of a graphical design is rendered. The widget has an existence property and the property has a placed value. The method also includes step 1902 in which an unplaced value for the existence property of the same widget in a second dimension version is stored in memory. Step 1902 and 1901 are displayed in sequence, but step 1902 can be conducted prior to step 1901 and persist through the occurrence of step 1901. Method 1900 also includes step 1903 in which an existence property interface is generated and step 1904 in which a rendering of a second dimension version of the design is generated. The widget does not appear in the second dimension version in step 1904 because the existence property of the widget has an unplaced value in the second dimension version.

In situations where the existence property propagates automatically with the inheritance structure, method 1900 could include step 1905 in which a second dimension version of the design is rendered. In this situation, the widget that was placed and rendered in the first dimension version in step 1901 would also be in a placed state and be rendered in the second dimension version in step 1905. Method 1900 could then continue with step 1906 in which an existence property specification was received from the user to change the existence property of the widget to an unplaced state. Step 1906 could involve receiving a specification from the user deleting the widget while the user was editing the first dimension version. The method would then continue with step 1902 in which the unplaced state for the widget in the second dimension version was saved in memory. In this situation, the saving would be conducted in response to the receipt of the existence property specification in step 1906. In keeping with how other properties are affected by the inheritance structure, if the same widget was deleted, or the existence property of the widget were otherwise changed to an unplaced state, in the second dimension version; then the value for the existence property of the widget in the first dimension version would remain unaltered.

Figure 20:
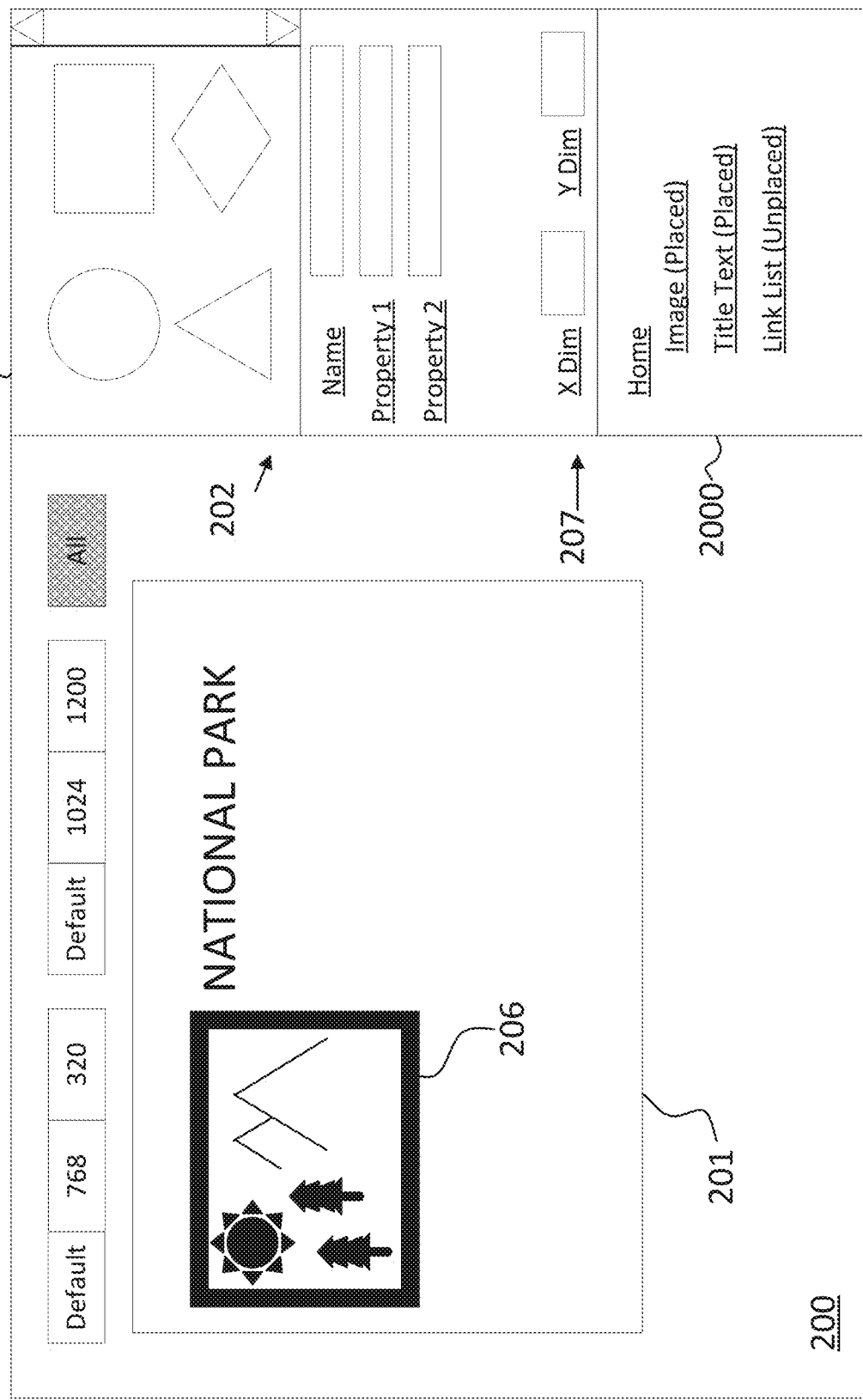
FIG. 20 illustrates a graphical user interface for a graphic design tool with an existence property interface, in accordance with some embodiments.

An example of the existence property interface is illustrated as existence property interface 2000 in FIG. 20. As mentioned previously, the existence property may generally require a separate interface due to its particular characteristics. As illustrated, existence property interface 2000 provides a list of all of the widgets in the design and an indicator for their existence property value in the currently displayed dimension version. In embodiments in which window 201 was replaced with a gallery view, a single existence property interface 2000 could still be employed as long as it reflected the state of the dimension version in the gallery that was currently being edited. As shown, the title and hero image 206 have a placed value for their existence property while the link list 104 has an unplaced value. Existence property interface 2000 may allow users to toggle the placed or unplaced value for the existence property on a per widget basis by allowing users to click on the name of the widget in the existence property interface 2000. In the illustrated example, the user could click on the text "Link List" and link list 104 would be placed, and appear in window 201. At the same time, the status of the existence property for the link list widget would change from Unplaced to Placed in existence property interface 2000. The existence property interface could also reflect the real time status of widgets in the design, and be populated with additional widgets whenever an add command was utilized by a user to add a widget to the design. Likewise, the interface could reflect an unplaced value for widgets in real time as they are the subject of a delete command from the user. In general, the existence property interface 2000 will indicate that a widget is placed in a dimension version if the widget is displayed simultaneously with the dimension version and will indicate that a widget is unplaced in a dimension version if the widget is not displayed simultaneously with the dimension version. The hidden property could also be used to provide this functionality and be managed through a similar interface. However, it is often desired to have hidden widgets rendered in ghost or outline form in the design environment so the benefits of reducing clutter would not be provided as cleanly by that approach.

The existence property interface can take on various configurations as long as it provides a way to manage widgets that are not placed in a dimension version of the design. Existence property interface 2000 could also display the existence property for widgets in dimension versions that are not currently being rendered in the design environment. For example, the existence property interface could provide a matrix of widgets and the existence property for each of those widgets across all of the dimension versions in the design. The Existence property interface 2000 could also be limited to displaying widgets that were not currently placed in whatever dimension version was being rendered. This could be beneficial because the list of widgets in the interface would be limited, and because placed widgets can be edited directly and unplaced by selecting the widget and issuing a delete command.

Design Environment: Resize Events

As described above, a user is able to specify a design that responds to adjustments to a rendering space afforded the design by altering the state in which a widget is rendered. In similar fashion and using the same design environment, a user may also be able to specify a design that responds to adjustments to the rendering space afforded the design by executing actions when the rendering space is adjusted. The resulting functionality could be displayed in window 201 or it could be imparted to the design only once it has been exported from the design environment. These actions could be added for specific transitions such as a transition to a particular dimension version or a transition between a particular set of dimension versions.

The design could be specified such that actions were executed when a rendering space afforded the design was resized. An event handler could be added to the design and made conditional on the width of the rendering space being equal to, less than, or more than, a dimension specification. The event handler does not need to be associated with a widget as it could instead be associated with the design in other ways. The event handler could utilize an OnResize event to execute the desired action when a rendering space was adjusted. The event handler in this case can be described as "listening" for the OnResize event. Upon the occurrence of the OnResize event, the event handler would compare the current size of the rendering space to one or more preset dimension specifications and then selectively execute its associated action. For example, a page could have a "show display panel" event handler, and the panel could be displayed when a width of a player used to render the design was set to a certain size.

The design could also be specified such that actions were executed when a specific dimension version was selected for rendering, regardless of the rendering space afforded for that version. For example, a viewer of the design may be able to display a Smart Phone dimension version of a design without changing the size of a player that was previously being used to render a Desktop dimension version of the design. This functionality could be afforded in various ways. For example, a "fake" event could be added to the design that fires whenever the dimension version being rendered changes. The event is "fake" because a browser used to render the design will not have an equivalent event. This fake event could be "heard" by the associated event handler and be used by the event handler to execute its action just as if the rendering space had been resized and the OnResize event had dutifully fired. As another example, the input used to select the new dimension version could be set to trigger the action directly. This approach would not require the firing of an event to be detected by the design code.

Exported Design: Responsive Encoding and Presentation

Designs specified in a design environment using the tools and methods described above can be used to generate an instantiation of the design for rendering in an external player. An instantiation of a design is an encoding, translation, programming, reproduction, or transformation that allows a design to be displayed or rendered in the design environment and/or an external player. A design that has been encoded, exported, translated, or transformed such that the design can be rendered in the design environment and/or external player has been instantiated. An instance of a design is an instantiated design. In some embodiments, the design will be exported from the tool in the form of an instantiation that can be stored and rendered externally to the tool at any time. The exported design could be a prototype of a web page or web site and the external player could be a web browser. In such cases, the instantiation of the exported design could be encoded entirely in style sheet and markup language even though the in-tool renderings of the design might not utilize any markup language. The degree to which the responsive nature of the design is expressed in the generated instantiation of the design may be configurable by a user. Likewise, the nature of the instantiation in terms of how it enables its responsive nature may be configurable by a user. The responsiveness of the designs is determined by the processes uses to specify the design. The states to which the widgets are modified in each dimension version are predefined states that depend solely on the display dimensions of the rendering space of the external player. Tools and methods for defining the nature of exporting and the nature of the exported instantiation of a design can be described with reference to FIGS. 11-13.

In some embodiments, the generated instantiation of the design can have varying degrees of the design's responsive nature expressed. For example, a user may choose to export an instantiation of the design that is not responsive. The user could select a particular dimension version and generate an instantiation based strictly on that dimension version. As another example, the design environment could provide an interface to receive an input from a user to generate an instantiation of the design that is not responsive to any dimension of the rendering space afforded by the external player, but that still contained all of the dimension versions associated with the design. This instantiation could be exported with an encoding of a selector box that would allow a viewer of the rendered instantiation to select between the different dimension versions. The selector box could be displayed on each page of the design across all dimension versions and could include a set of buttons that could be pressed to switch the rendered design between one dimension version and another. Finally, the design environment could provide an interface to receive an input from a user to generate an instantiation of the design that was fully responsive to a dimension of the rendering space afforded by the external player as was specified in the design environment.

Figure 15:
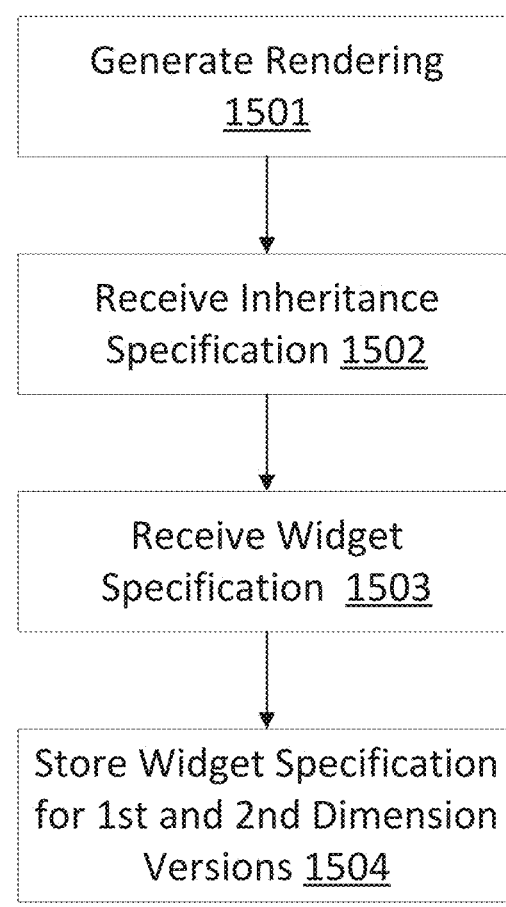
FIG. 15 illustrates a flow chart of a method for specifying and applying an inheritance structure to an interactive graphical design, in accordance with some embodiments.
Figure 21:
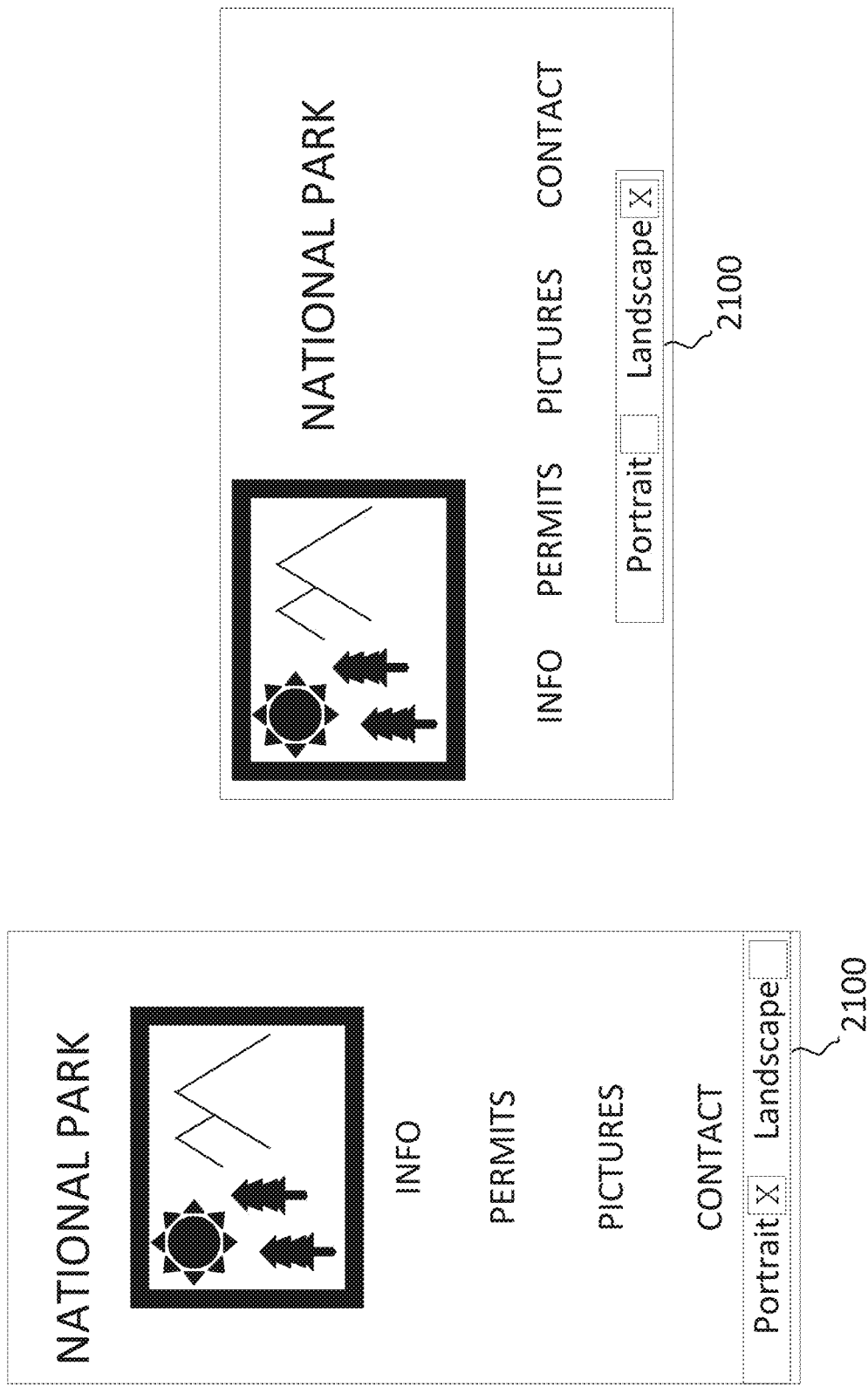
FIG. 21 illustrate different portions of an exported instantiation of a responsive graphical design having a dimension version selector, in accordance with some embodiments

A selector box such as the one described in the previous paragraph can be better understood with reference to FIG. 15. FIG. 21, displays the dimension versions of a single page in a design that were illustrated in FIG. 2 with the addition of selector box 2100. A viewer of the exported design could click on a check box to indicate which of the dimension versions of the design the viewer wanted to view. After switching to the dimension version, the viewer would be able to navigate through the design and view the various pages at the same dimension version and could switch to a different dimension version at any time by making a different selection in selector box 2100.

In some embodiments, the generated instantiation can enable its responsiveness in various ways. For example, the generated instantiation could comprise media queries in an encoding of the instantiation, the generated instantiation could include an object model event used to trigger a script, or it could include entire instantiations of each dimension version of the design linked together using a selector such as selector 2100. Each of these options is described in more detail below.

Media queries are markup language definitions that a browser understands and uses to automatically apply style sheets to a design. As such, they provide a way to enable responsiveness in a design. The variables of a media query could be set to a dimension specification of the design, and the style sheet associated with the media query could be defined to set a characteristic for a particular widget as required by a dimension version associated with that dimension specification. For example, a widget may be a text box that was specified to use 12 point font in a default state and 10 point font when a rendering space width for the design was less than 10 inches. The media query feature utilized in this example would be the "width" feature and the condition would be "less than 10 inches." The associated style sheet for the particular media query would set the font used in the text box to 10 point font. Media queries are intrinsic to browsers so they are very efficient. However, they are limited to providing responsiveness only to characteristics of a widget that can be modified by a style sheet. A different approach should be used for deeper responsive design.

Object model event handlers listen to various programming objects to monitor their characteristics and execute an event when those characteristics meet certain conditions. In specific embodiments, these object model event handlers can be used to provide a responsiveness characteristic to exported instantiations of a responsive design. For example, the object monitored by the object model could be a page used to render the design. The event could be an onResize event such that every time the page was resized, the event would execute and determine a current dimension of the rendering space used for the design. Based on a comparison of this dimension to the dimension specifications, which would also be encoded in the design, the encoded instantiation could run a script to modify the design. The script would alter the design being provided to the external player such that a different dimension version would be rendered by the player. The script could be a javascript. Since the modifications to the design provided by object models are only limited by what can be encoded in a javascript, the designs can exhibit deep degrees of responsiveness including the ability to have interactive properties of the widgets in the design change based on the current rendering space afforded to the design.

The responsiveness of exported designs that include a selector could be enabled in various ways. For example, the responsiveness could be enabled by exporting each dimension version of the design as a separate instantiation with the addition of links between each set of corresponding pages in the dimension versions. In these embodiments, this added functionality would only require the different dimension versions to be modified to include markup language defining the selector on each page. When selected, the selector could serve to link a user from one page of a dimension version to another corresponding page of a different dimension version. The viewer would then be able to navigate through one dimension version for as long as desired before transferring back to the prior dimension version using the link provided in the selector. As another example, the responsiveness of the design could be enabled through the use of frames. The instantiation could be exported such that, when rendered, a frame was provided in the rendering space that contained the selector. That frame would not change throughout the rendering of the design, but would instead remain static while different pages of the design were rendered by the browser in another frame in the rendering space.

Instantiations of responsive designs that are in accordance with the previous paragraph would allow someone to demonstrate the responsiveness of the design without having to actually resize the player. In specific situations, this approach would provide an advantage for people that are attempting to review a prototype of a web page because it can be helpful to analyze each dimension version with the same degree of scrutiny while still being assured that each dimension version of the design has been completely specified.

A user can choose to export an instantiation of a design from the design environment using an export interface. The export interface will provide a connection between the user and an export module that is used to generate the exported instantiation of the design. The export interface can be accessible from the graphical design interface discussed above with reference to FIG. 2. The export interface could be a permanent button displayed on the graphical design interface, a selectable option in a pull down menu, or it could be a more complex window displaying various selectable options to specify the nature of the export. The complex export interface could allow the user to specify what degree of responsiveness the instantiation will exhibit as described above. Likewise, the export interface could allow the user to specify how the responsiveness of the design will be enabled. For this option, certain options may be prohibited based on what characteristics of the design's widgets have been made responsive. For example, in a design in which the interactive properties of a widget have been made responsive, the option to export an instantiation where media queries provide the responsiveness of the design may be prohibited in the export interface.

Figure 22:
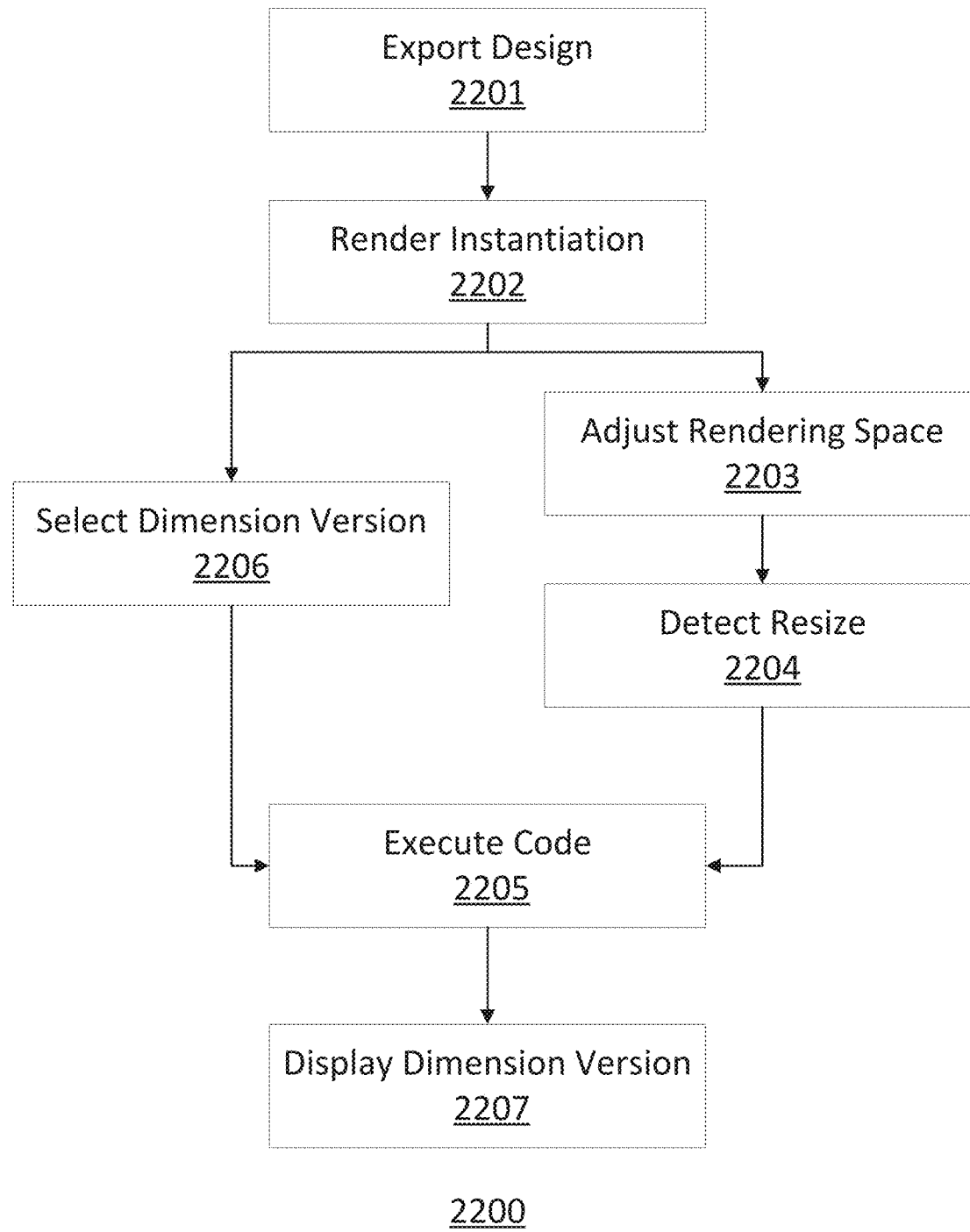
FIG. 22 illustrates a flow chart of a method for exporting and displaying an instantiation of a responsive graphical design, in accordance with some embodiments.

A method 2200 for exporting and displaying an instantiation of a responsive graphical design that has been specified through the use of any of the tools and methods described above is illustrated in FIG. 22. In step 2201, the design is exported from the design environment. Prior to this step, the design could have been specified in accordance with any of the methods described above, and the nature of the export could have been selected by a user using any of the methods described above as well.

In step 2202, an instantiation of the design is rendered in an external player. The player can display a predetermined dimension version of the design. The design can execute a script to sense the rendering space afforded by the player, or any other characteristic of the player, and enable the player to render the design in a particular dimension version based on the sensed characteristic. Finally, the player may determine the proper dimension specification to apply itself based on markup language media queries and render the appropriate dimension version without using a script. Note that the player may render the design differently than the encoding specifically requires, in particular, an offset may be applied to any absolute positioning specification for the rendered widgets.

In step 2203, a rendering space dimension of the external player is adjusted by a viewer of the design. This step may be conducted to view the responsive nature of the design. The method will then continue to step 2204 in which the resizing of the design is detected and it is determined if a change in the rendered dimension version is required. This can be done by sensing the new size of the rendering space of the external player and comparing it to the dimension specifications. If a change is required, the method will continue to step 2205 as described below.

In step 2206, another dimension version is selected for rendering without adjusting the rendering space dimension of the external player. This could be done by hitting a short cut key or selecting a different dimension in a selector as described above. The purpose of these approaches is to allow a viewer to analyze the design as it would appear at different dimension versions, but using the same sized viewer for each of the versions.

In step 2205, code is executed to render a different dimension version of the design in the player as initiated by steps 2206, or steps 2203 and 2204 in combination. The code could be javascript that modifies a state of particular widgets in the design so that they appear in a state that matches the newly rendered dimension version. The code could also be HTML associated with a different web page that can be used to render that different web page and display the required dimension version. The different code executed in this step will depend on the manner in which the exported instantiation was generated. In step 2207, the newly rendered dimension version will be displayed in the external player with the widgets in the design rendered according to how they were specified in the particular dimension version being displayed.

Figure 23:
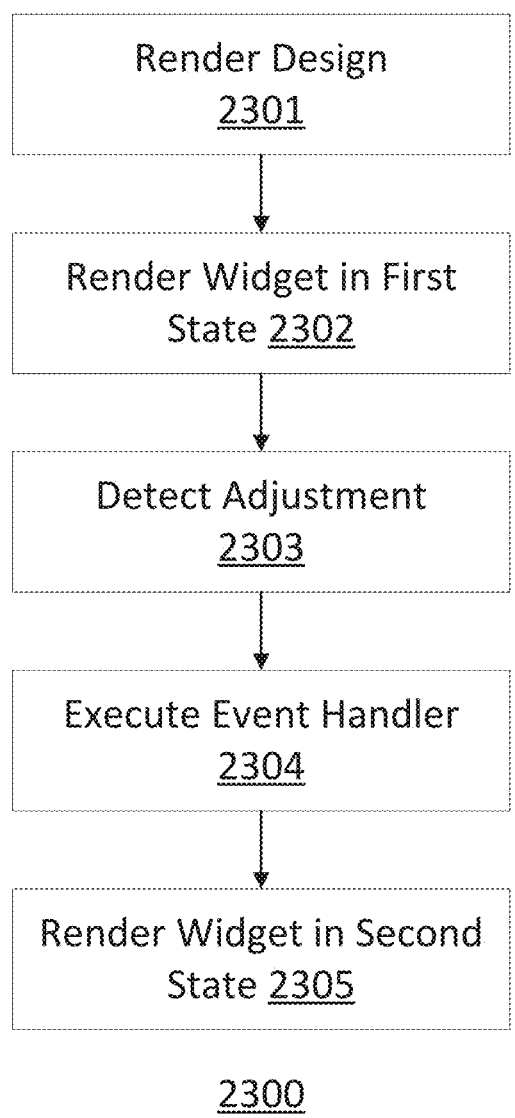
FIG. 23 illustrates a flow chart of a method for rendering a responsive graphical design, in accordance with some embodiments.

FIG. 23 displays another method 2300 for rendering a responsive graphical design in accordance with some example embodiments. In step 2301, a graphical design with at least one widget is rendered to allow for a display of the graphical design in a window with an adjustable dimension. The graphical design can be a web page and the at least one widget can be an interactive widget. The graphical design can be an instantiation of a design that was specified using any of the tools and methods described above, and can be encoded in an encoding generated during any export or generation process described above. In step 2302, the widget is rendered in the design in a first state. In step 2303, an adjustment to the adjustable dimension is detected using an object model event detecting javascript function that is encoded in the same encoding as the design itself. Step 2303 can utilize an on-resize event. In step 2304, an event handler portion of the object model event detecting javascript function is executed in response to the detected adjusted dimension. In step 2305, the execution of the event handler causes the rendering of the widget in a second state that is selected by a processor based on a comparison of the detected adjustable dimension and a set of preset dimension definitions. The first state and the second state can differ as to the interactivity of the widget. The preset dimension definitions can be encoded in the same design encoding. The preset dimension definitions can include a width value, a height value, a combination of the two, or any other physical dimension.

Although some embodiments have been discussed primarily with respect to specific embodiments thereof, other variations are possible. Various configurations of the described system may be used in place of, or in addition to, the configurations presented herein. Those skilled in the art will appreciate that the foregoing description is by way of example only, and is not intended to limit the matter disclosed herein. For example, more than one user could specify the design in the design environment in collaborative fashion working with other users, the design could be for the design of an electronically circulated periodical, the dimension specifications could be determined ahead of time and labeled in accordance with a set of popular aspect ratios or devices, the designs could be specified in three dimensions such that the dimension specifications could specify a volume used to render the design, the masters could have container widgets in predefined locations for masters that are to be used as headers or footers, and the predefined containers in the master could be configured to respond in predefined ways to the predefined dimension specifications. Furthermore, nothing in the disclosure should indicate that the matter disclosed herein is limited to systems and methods that involve web browsers. In general, any diagrams presented are only intended to indicate one possible configuration, and many variations are possible. Those skilled in the art will also appreciate that methods and systems consistent with the matter disclosed herein are suitable for use in a wide range of applications encompassing any related to responsive graphical designs.

Any of the methods described herein can be conducted through the use of a computer system 2400 as shown in FIG. 24. For example, the design environment could be provided by a processing system 2401 acting in tandem with a memory 2402. A user 2403 would be able to access the design environment through the use of a routing system 2404 and a user interface system 2405. Any method steps involving providing or accepting things to and from a user can be conducted using interface system 2405. Any method steps involving executing an action can be conducted using processing system 2401 alone or in combination with memory 2402. FIG. 24 is only an illustrative computer system that is amenable to operation in accordance with some example embodiments and variant computer system topologies may be used in its stead. Nothing in this description should limit the processor of processing system 2401 to a single processor, as the function of this block can be accomplished by multiple physical processors located either on a single work station or server, or distributed through a network. It is not essential for memory 2402 to be physically distinguishable from processing system 2401, as they are merely illustrated as separate blocks for purposes of invoking common conceptions of how computing systems operate. Routing system 2404 could be the internal routing system of a single work station, a LAN, a WAN, a wired or wireless network, the Internet, or any other system capable of routing signals. User interface system 2405 could be a work station, a computer, a mobile phone or other mobile device, or any computing device or group of computing devices capable of receiving inputs from a single user or group of users. FIG. 24 should also not be taken to indicate that the matter disclosed herein can only involve design environments or design programs that may only be accessed by one user as there could be multiple users 2403 and that group of multiple users 2403 could access the design environment using any number of routing systems 2404. Those users could also access the design environment simultaneously.

While the specification has been described in detail with respect to some specific embodiments, it will be appreciated that those skilled in the art, upon attaining an understanding of the foregoing, may readily conceive of alterations to, variations of, and equivalents to these embodiments. These and other modifications and variations to the matter disclosed herein may be practiced by those skilled in the art, without departing from the spirit and scope of the matter disclosed herein, which is more particularly set forth in the appended claims.

What is claimed is:

1. A method comprising:
   receiving, in a design environment, a first master selection, the first master selection selecting a first master;

adding, in the design environment, a first instance of a widget to the first master;

receiving, in the design environment, a first view selection for the first master, the first view selection selecting a first view from a plurality of views of the first master;

receiving, in the design environment, a first widget characterization of the first instance of the widget, the first widget characterization being associated with the first view of the first master;

receiving, in the design environment, a second view selection for the first master, the second view selection selecting a second view from the plurality of views;

receiving, in the design environment, a second widget characterization of the first instance of the widget, the second widget characterization being associated with the second view of the first master;

placing, in the design environment, a first instance of the first master in a containing context, the first instance of the first master comprising a second instance of the widget, the second instance of the widget being an instance of the first instance of the widget;

receiving, in the design environment, a first instance view selection, the first instance view selection selecting the first view of the first master for the first instance of the first master; and displaying, in the design environment, the first instance of the first master within the containing context, the second instance of the widget being displayed in accordance with the first widget characterization associated with the first view of the first master.

2. The method of claim 1, further comprising:
receiving, in the design environment, a second instance view selection, the second instance view selection selecting the second view of the first master for the first instance of the first master; and
displaying, in the design environment, the first instance of the first master within the containing context, the second instance of the widget being displayed in accordance with the second widget characterization associated with the second view of the first master.

3. The method of claim 1, wherein receiving the first instance view selection comprises:
receiving an input from an input interface of the design environment, the input selecting the first view of the first master.

4. The method of claim 1, wherein receiving the first instance view selection comprises:
determining, in the design environment, a property of the containing context; and
determining, in the design environment, that the first view of the first master corresponds to the property of the containing context.

5. The method of claim 4, wherein:
the property of the containing context is a style or a dimension of the containing context.

6. The method of claim 1, wherein receiving the first instance view selection comprises:
determining, in the design environment, a widget characterization of the first instance of the first master; and
determining, in the design environment, that the first view of the first master corresponds to the widget characterization of the first instance of the first master.

7. The method of claim 6, wherein:
the widget characterization of the first instance of the first master is a style or a dimension of the first instance of the first master.

8. The method of claim 1, further comprising:
placing, in the design environment, a second instance of the first master in the containing context, the second instance of the first master comprising a third instance of the widget, the third instance of the widget being another instance of the first instance of the widget;
receiving, in the design environment, a second instance view selection, the second instance view selection selecting the second view of the first master for the second instance of the first master;
displaying, in the design environment, the first instance of the first master within the containing context, the second instance of the widget being displayed in accordance with the first widget characterization associated with the first view of the first master; and
displaying, in the design environment, the second instance of the first master within the containing context, the third instance of the widget being displayed in accordance with the second widget characterization associated with the second view of the first master.

9. The method of claim 8, further comprising:
receiving, in the design environment, a third widget characterization of the first instance of the widget;
displaying, in the design environment, the first instance of the first master within the containing context, the second instance of the widget being displayed in accordance with the first widget characterization associated with the first view of the first master and the third widget characterization; and
displaying, in the design environment, the second instance of the first master within the containing context, the third instance of the widget being displayed in accordance with the second widget characterization associated with the second view of the first master and the third widget characterization.

10. The method of claim 9, wherein:
the first view of the first master is a first descendent view of a parent view of the first master;
the second view of the first master is a second descendent view of the parent view of the first master; and
the third widget characterization of the widget is associated with the parent view of the first master.

11. The method of claim 1, further comprising:
placing in a second master, in the design environment, a first instance of a third master;
placing in the first master, in the design environment, a first instance of the second master;
receiving, in the design environment, a second instance view selection, the second instance view selection selecting, from a second plurality of views, a second view of the second master for the first instance of the second master; and
receiving, in the design environment, a third instance view selection, the third instance view selection selecting, from a third plurality of views, a third view of the third master for the first instance of the third master.

12. The method of claim 1, wherein:
the containing context is a second master.

13. The method of claim 1, wherein:
the first widget characterization comprises one or more of a first color of the widget, a first dimension of the widget, or a first relative position of the widget; and
the second widget characterization comprises one or more of a second color of the widget, a second dimension of the widget, or a second relative position of the widget.

14. The method of claim 1, wherein:
the first widget characterization comprises one or more of a first absolute position of the widget, or a first anchoring rule of the widget; and
the second widget characterization comprises one or more of a second absolute position of the widget, or a second anchoring rule of the widget.

15. The method of claim 1, wherein receiving the first instance view selection comprises:
generating a view selection interface in the design environment, the view selection interface comprising a first selectable option and a second selectable option, the first selectable option identifying the first view selection, and the second selectable option identifying the second view selection; and
receiving an input, the input selecting the first selectable option.

16. The method of claim 1, further comprising:
rendering, in a prototype environment, a prototype, the rendered prototype displaying the first instance of the first master within an instance of the containing context, the second instance of the widget being displayed in accordance with the first widget characterization associated with the first view of the first master;
receiving, in the prototype environment, a second instance view selection, the second instance view selection selecting the second view of the first master for the first instance of the first master; and
rendering, in the prototype environment, the rendered prototype displaying the first instance of the first master within the instance of the containing context, the second instance of the widget being displayed in accordance with the second widget characterization associated with the second view of the first master.

17. The method of claim 16, wherein:
the prototype is a webpage; and
the prototype environment is an external player.

18. The method of claim 16, wherein:
the prototype is a mobile application; and
the prototype environment is an external player.

19. The method of claim 16, wherein receiving the second instance view selection comprises:
receiving an input from an input interface of the prototype environment, the input selecting the second view of the first master.

20. The method of claim 16, wherein receiving the second instance view selection comprises:
determining, in the prototype environment, a property of the instance of the containing context; and
determining, in the prototype environment, that the second view of the first master corresponds to the property of the instance of the containing context.

21. The method of claim 20, wherein:
the property of the containing context is a style or a dimension of the instance of the containing context.

22. The method of claim 16, wherein receiving the second instance view selection comprises:
determining, in the prototype environment, a widget characterization of the first instance of the first master; and
determining, in the prototype environment, that the second view of the first master corresponds to the widget characterization of the first instance of the first master.

23. The method of claim 6, wherein:
the widget characterization of the first instance of the first master is a style or a dimension of the first instance of the first master.

* * * * *